(12) United States Patent
Miyajima et al.

(10) Patent No.: US 7,103,336 B1
(45) Date of Patent: Sep. 5, 2006

(54) RADIO RECEIVER, RADIO RECEIVING METHOD, AND RECORDING MEDIUM

(75) Inventors: Yoshinori Miyajima, Kanagawa (JP); Atsuhiko Hashigaya, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 308 days.

(21) Appl. No.: 09/654,274

(22) Filed: Sep. 1, 2000

(30) Foreign Application Priority Data

Sep. 3, 1999  (JP) ................................ 11-250625

(51) Int. Cl.
*H04B 1/06*  (2006.01)
*H04L 27/08*  (2006.01)

(52) U.S. Cl. ............................... 455/250.1; 455/232.1; 455/240.1; 455/245.1; 375/345

(58) Field of Classification Search ............. 455/232.1, 455/522, 136, 234.1, 234.2, 240.1, 247.1, 455/245.1, 250.1, 251.1, 334, 226.2, 126, 455/127, 127.1, 161.3, 184.1, 126.1, 239.1, 455/277.1, 277.2; 330/284, 41, 129, 279, 330/128, 254, 278; 375/345, 347, 222, 260; 331/128

See application file for complete search history.

(56) References Cited

U.S. PATENT DOCUMENTS

| | | | | |
|---|---|---|---|---|
| 4,777,653 A | * | 10/1988 | Bonnerot et al. .............. 455/69 |
| 4,785,418 A | * | 11/1988 | Pearce et al. ................. 708/200 |
| 4,939,766 A | * | 7/1990 | Umemoto et al. ........... 455/462 |
| 5,040,194 A | * | 8/1991 | Tjahjadi et al. .............. 375/345 |
| 5,050,192 A | * | 9/1991 | Nawata ........................ 375/345 |
| 5,168,505 A | * | 12/1992 | Akazawa et al. ............ 375/130 |
| 5,469,115 A | * | 11/1995 | Peterzell et al. ............. 330/129 |
| 5,613,230 A | * | 3/1997 | Gottfried et al. .......... 455/161.3 |
| 5,710,981 A | * | 1/1998 | Kim et al. ..................... 455/69 |
| 5,758,271 A | * | 5/1998 | Rich et al. ................. 455/234.1 |
| 5,946,346 A | * | 8/1999 | Ahmed et al. ............... 375/219 |
| 6,032,031 A | * | 2/2000 | Takaki ....................... 455/245.2 |
| 6,038,435 A | * | 3/2000 | Zhang ...................... 455/234.1 |
| 6,044,253 A | * | 3/2000 | Tsumura ................... 455/234.1 |
| 6,070,062 A | | 5/2000 | Yoshida et al. |
| 6,075,974 A | * | 6/2000 | Saints et al. ................... 455/69 |
| 6,081,565 A | * | 6/2000 | Marandi et al. ............. 375/345 |
| 6,167,281 A | * | 12/2000 | Sugi ........................... 455/502 |
| 6,173,188 B1 | * | 1/2001 | Kim ........................... 455/522 |
| 6,324,387 B1 | * | 11/2001 | Kamgar et al. .......... 455/234.1 |
| 6,341,224 B1 | * | 1/2002 | Dohi et al. .................. 455/522 |

(Continued)

FOREIGN PATENT DOCUMENTS

CH        1197339 A        10/1998

*Primary Examiner*—Charles N. Appiah
(74) *Attorney, Agent, or Firm*—Pearne & Gordon LLP

(57) ABSTRACT

The AGC threshold of electric intensity level is set by the signal processor portion 107 in response to the measured result of the error rate measuring circuit 109 that measures the error rate of the received signal, and the gain control operation of the gain control circuit 106 is caused to start when the electric field intensity detected by the field intensity detector 105 reaches the threshold of electric intensity level. Accordingly, the optimum AGC threshold of electric intensity level can be set to meet the radio wave situation in which the radio receiver, i.e., the receiving situation of the received signal and also the gain control of the gain controlling means can be achieved to optimize the signal quality of the received signal in the situation of either the IM characteristic or the electric field variation characteristic, e.g., under the environment of the strong electric field IM or the environment in which the electric field is changed strongly.

27 Claims, 23 Drawing Sheets

U.S. PATENT DOCUMENTS

| | | |
|---|---|---|
| 6,363,127 B1 * | 3/2002 | Heinonen et al. ........... 375/345 |
| 6,374,097 B1 * | 4/2002 | Kudou .................... 455/232.1 |
| 6,507,740 B1 * | 1/2003 | Shi ........................... 455/437 |
| 6,597,898 B1 * | 7/2003 | Iwata et al. .............. 455/240.1 |
| 6,603,825 B1 * | 8/2003 | Pecen ......................... 375/345 |
| 6,643,498 B1 * | 11/2003 | Miyajima ................... 455/230 |
| 6,668,027 B1 * | 12/2003 | Scarpa ....................... 375/345 |
| 6,775,337 B1 * | 8/2004 | Janky et al. ................ 375/345 |

* cited by examiner

US 7,103,336 B1

RADIO RECEIVER, RADIO RECEIVING METHOD, AND RECORDING MEDIUM

BACKGROUND OF THE INVENTION

1. Field of the Invention

The present invention relates to a radio receiver, a radio receiving method, and a recording medium for recording a program to execute the radio receiving method and, more particularly, a radio receiver which has an automatic gain control circuit of a step-wise gain control type in which a gain is changed by a predetermined level when a signal level of a received signal exceeds a predetermined level, a continuous gain control type in which a gain is changed in response to a signal level of a received signal, etc., a radio receiving method, and a recording medium.

2. Description of the Related Art

A radio receiver such as a pager of the day is equipped with an automatic gain control (abbreviated to "AGC" hereinafter) circuit, and then improves the intermodulation desensitization (abbreviated to "IM" hereinafter) characteristic and the characteristic due to an excessive input by controlling a gain of the radio receiver.

Here the IM will be simply explained. The "IM (intermodulation desensitization)" means such a phenomenon that, when a plurality of waves having particular frequency relationship are input into the radio receiver, noises are generated in the receiving band of the radio receiver because of distortion of semiconductor devices such as transistors, diodes, etc.

Also, as the feature of the noise generated by this IM, it is known that the noise level generated in the receiving band of the receiver becomes 1:n when the level of the interference wave having n-th order IM relationship is increased. For example, in the case that two interference waves having frequencies corresponding to the third order IM are input into the receiver, the noise level generated in the receiving band of the receiver is increased by 3 [dB] when the interference wave input is increased by 1 [dB]. In contrast, if the gain of the receiver is attenuated by 1 [dB], the desired wave is attenuated by 1 [dB] but the noise generated by the third order IM is attenuated by 3 [dB]. Therefore, a level ratio of the desired wave to the noise generated by the third order IM can be improved by 2 [dB] rather than the level before the gain is lowered by 1 [dB].

In this manner, in the IM area, desired wave to the interference wave which ensures received signal quality can be improved by controlling (attenuating) the gain of the receiver.

In the prior art, there are two type AGC circuits, i.e., a "continuous gain control type" in which a gain control amount is varied in response to the signal level input into the radio receiver, and a "step-wise gain control type" in which the gain is controlled by a previously determined constant level when the signal level exceeds a predetermined level.

First, the radio receiver having the continuous gain control type AGC circuit in the prior art will be explained with reference to FIG. 19 hereunder. FIG. 19 shows a configuration of the radio receiver having the continuous gain control type AGC circuit (first comparative example) in the prior art.

In FIG. 19, the radio receiver in the first comparative example is constructed to include an antenna 501, a low-noise signal amplifier (LNA) 502, a local oscillator circuit 503, a frequency converter circuit 504, a field intensity detector 505, and a gain control circuit 506.

The antenna 501 receives the signal transmitted from a base station (not shown). The low-noise signal amplifier (LNA) 502 amplifies the signal received via the antenna 501. The frequency converter circuit 504 executes the frequency conversion by multiplying the signal amplified by the low-noise signal amplifier 502 by a signal supplied from the local oscillator circuit 503. The field intensity detector 505 changes a voltage of an output signal GC5 in response to a signal level of the intermediate frequency signal IF after the frequency conversion. The gain control circuit 506 changes a control level of the gain in answer to the output signal GC5 from the field intensity detector 505.

If the level of the signal input into the antenna 501 is changed, the signal level of the intermediate frequency signal IF which is subjected to the frequency conversion by the frequency converter circuit 504 is also changed correspondingly. The voltage of the output signal GC5 of the field intensity detector 505 is changed according to the change in level of the intermediate frequency signal IF, and then a gain control amount of the gain control circuit 506 is changed according to such change.

Next, the radio receiver having the step-wise gain control type AGC circuit in the prior art will be explained with reference to FIG. 21 hereunder. FIG. 21 shows a configuration of the radio receiver having the step-wise gain control type automatic gain control circuit (second comparative example) in the prior art.

In FIG. 21, the radio receiver in the second comparative example is constructed to include an antenna 601, a low-noise signal amplifier (LNA) 602, a local oscillator circuit 603, a frequency converter circuit 604, a field intensity detector 605, and a gain control circuit 606.

Here the antenna 601, the low-noise signal amplifier 602, the local oscillator circuit 603, and the frequency converter circuit 604 have similar functions to those in the first comparative example (FIG. 19). The field intensity detector 605 changes the signal GC6 and outputs it when the signal level of the intermediate frequency signal IF which is subjected to the frequency conversion by the frequency converter circuit 504 exceeds a predetermined value. An operation state (ON state/OFF state) of the gain control circuit 606 is switched by the signal GC6 from the field intensity detector 605. In this case, a gain control amount controlled by the gain control circuit 606 is constant irrespective to the level of the signal input from the antenna 601.

However, in the above radio receiver in the prior art, setting of the radio receiver is decided by searching a point of compromise between the IM characteristic and the electric field variation characteristic.

First, relationships among threshold of electric field intensity level which starts AGC operation, IM characteristics, and margins of sensitivity in the AGC operation in the radio receiver having the continuous gain control type AGC circuit (first comparative example) in the prior art will be explained hereunder. FIG. 20 is a chart showing relationships among threshold of electric field intensity level which starts AGC operation, IM characteristics, and margins of sensitivity in the AGC operation in the continuous gain control type AGC circuit.

As described above, as the feature of the continuous gain control type AGC circuit, it can be listed that the gain control amount is changed pursuant to the change in signal level. However, in the case that the signal level is varied at a pitch that exceeds the follow-up speed of the AGC circuit operation against the change in the signal level, if an electric field intensity variation width of the radio signal exceeds a difference between the sensitivity level and the threshold level of starting the AGC circuit (margin of sensitivity in the AGC operation), the electric field intensity drops down below the sensible level. Therefore, the sufficient margin of sensitivity in the AGC operation must be assured.

Therefore, if the threshold of electric field intensity level which starts the AGC operation is set high, the AGC operation becomes strong against the electric field variation of the desired wave since the large margin of sensitivity in the AGC operation can be assured, but the IM area that can be improved by the AGC circuit can be reduced. Also, in order to improve the IM characteristic, if the threshold of the electric field intensity for starting the AGC operation is set at a low level, the call acceptable area is increased in the IM characteristic, nevertheless the AGC operation becomes weak against the electric field variation of the desired wave since the margin of sensitivity in the AGC operation is small. In this manner, in the continuous gain control type AGC circuit whose gain follows up the electric field variation, the threshold of the electric field intensity level which starts the AGC operation must be set with regard to both the IM characteristic and the electric field variation characteristic.

Then, relationships among the threshold of the electric field intensity level which starts AGC operation, IM characteristics, and margins of sensitivity in the AGC operation in the radio receiver having the step-wise gain control type AGC circuit (second comparative example) in the prior art will be explained hereunder.

In the step-wise gain control type AGC circuit, if the large gain is controlled at a moment, a large noise is generated in the gain control (at the time of switching). Therefore, normally the electric field detection and the gain switching are completed in the signal synchronizing portion, etc., but the gain control amount is not switched in the data interval and thus the receiving operation is carried out while fixing the gain at a constant gain control amount. Therefore, the step-wise gain control type AGC circuit cannot follow up the electric field variation in the data interval. Then, if the electric field intensity variation width of the radio signal exceeds the difference between the threshold of the electric field intensity level which startins AGC operation and the sensitivity in the AGC operation (margin of sensitivity in the AGC operation), the AGC circuit is operated under such a judgment at the time of the electric field detection that the signal level is high strong electric field. In this case, since the electric field intensity drops down below the sensible level with the AGC operation in the data interval, it is impossible to receive the transmitted data. Therefore, the sufficient margin of sensitivity in the AGC operation must also be assured in the step-wise gain control type AGC circuit.

FIG. 22 is a chart showing relationships among threshold of electric field intensity level which starts AGC operation, gain control amounts, and calling rates in the step-wise gain control type AGC circuit. In FIG. 22, the calling rate of 80 [%] is set as the sensible level.

The sensible level in the AGC operation is degraded as reduction in the gain is enhanced by increasing the gain control amount. For example, as shown in FIG. 22, such cases are considered that, if the static sensitivity is 20 [dBuV/m] when the AGC circuit is OFF (at the time of non-operation), the gain control amount is set to 10 [dB] and 15 [dB] respectively. The static sensitivity in the AGC operation is degraded by 10 [dB] and becomes 30 [dBuV/m] if the gain control amount is set small such as 10 [dB] whereas the static sensitivity in the AGC operation is degraded by 15 [dB] and becomes 35 [dBuV/m] if the gain control amount is set large such as 15 [dB]. Also, in the case that the threshold of electric field intensity level which starts AGC operation in the electrostatic field is set to 40 [dBuV/m], the margin of sensitivity in the AGC operation is 10 [dB] if the gain control amount is set to 10 [dB] whereas the margin of sensitivity in the AGC operation is 5 [dB] if the gain control amount is set to 15 [dB]. In this way, in the situation that the threshold of electric field intensity level which starts AGC operation are equal, the margin of sensitivity in the AGC operation is reduced smaller as the AGC gain control amount is set larger.

Then, FIG. 23 is a chart showing relationships among threshold of electric field intensity level which starts AGC operation, gain control amounts, and call acceptable areas in the IM characteristics in the step-wise gain control type AGC circuit.

If it is assumed that the threshold of electric field intensity level which starts AGC operation are equal, the service area existing IM interference is expanded (from AS2 to AS3) if the gain control amount is increased whereas the service area existing IM interference is contracted if the gain control amount is decreased. In this fashion, in the step-wise gain control type AGC circuit, the setting of the AGC circuit must also be set with regard to both the margin of sensitivity in the AGC operation and the IM characteristic.

As described above, regardless of the configuration of the AGC circuit, it is necessary to carry out the setting of the AGC circuit by looking for a point of compromise with regard to both the margin of sensitivity in the AGC operation and the IM characteristic.

Then, it is known that normally the sensitivity of the radio receiver is degraded much more as the transmission data speed of the transmission signal is increased more quickly. Therefore, if transmission conditions such as the transmission data speed of the signal, etc. are different, optimum values of the AGC setting values are different. However, for example, in the radio receiver for receiving the signal having the signal format whose transmission conditions such as the transmission data speed of the transmission signal, etc. are changed into two types or more during the transmission, like the FLEX system pager or FLEX-TD system pager, the same setting of the AGC circuit is applied irrespective to the transmission conditions of the signal. In other words, the optimum setting of the AGC circuit becomes different according to the radio wave situation in which the radio receiver is located. But, a means for executing the setting of the AGC circuit in response to the transmission conditions is not provided to the radio receiver in the prior art and thus it is impossible to set always the AGC circuit optimally.

SUMMARY OF THE INVENTION

The present invention has been made in view of the above circumstances in the prior art, and it is an object of the present invention to provide a radio receiver which is capable of achieving optimum setting of the AGC circuit in response to the radio wave situation in which the radio receiver is located, and also capable of improving communication quality by performing the gain control such that signal quality of the received signal can be optimized in either the IM characteristic or the electric field variation characteristic, a radio receiving method, and a recording medium.

In order to overcome the above subjects, a radio receiver according to the first aspect of the present invention comprises a gain controlling means for controlling a gain of the radio receiver; an electric field intensity detecting means for detecting an electric field intensity of a received signal; an error rate measuring means for measuring an error rate of the received signal; a threshold setting means for setting a threshold of electric field intensity level to start a gain control operation of the gain controlling means in response to a measured result of the error rate measuring means; and a first controlling means for causing the gain controlling means to start the gain control operation when the electric field intensity detected by the electric field intensity detecting means reaches the threshold of electric field intensity level which starts AGC operation.

Also, a radio receiver according to the second aspect of the present invention comprises a gain controlling means for controlling a gain of the radio receiver; an error rate measuring means for measuring an error rate of the received signal; a gain control amount setting means for setting a gain control amount of the gain controlling means in response to a measured result of the error rate measuring means; and a second controlling means for causing the gain controlling means to change a gain in response to the gain control amount.

Also, a radio receiver according to the third aspect of the present invention for receiving a signal having a signal format that is transmitted while changing transmission conditions into two types or more, comprises a gain controlling means for controlling a gain of the radio receiver; an electric field intensity detecting means for detecting an electric field intensity of a received signal; a threshold setting means for setting a threshold of electric field intensity level to start a gain control operation of the gain controlling means in response to a transmission condition of the signal; and a first controlling means for causing the gain controlling means to start the gain control operation when the electric field intensity detected by the electric field intensity detecting means reaches the threshold of electric field intensity level which starts AGC operation.

Also, a radio receiver according to the fourth aspect of the present invention for receiving a signal having a signal format that is transmitted while changing transmission conditions into two types or more, comprises a gain controlling means for controlling a gain of the radio receiver; a gain control amount setting means for setting a gain control amount of the gain controlling means in response to a transmission condition of the signal; and a second controlling means for causing the gain controlling means to change a gain in response to the gain control amount.

In the radio receiver according to the fifth aspect, the gain controlling means is a step-wise gain control type which changes the gain by a predetermined amount when a signal level of the received signal exceeds a predetermined level.

In the radio receiver according to the sixth aspect, the gain controlling means is a continuous gain control type which changes the gain in response to a signal level of the received signal.

In the radio receiver according to the seventh aspect, the threshold setting means decides a change direction and/or a change amount of the threshold of electric field intensity level which starts AGC operation in a succeeding reception based on a measured result by the error rate measuring means in a present reception and a measured result by the error rate measuring means in a preceding reception.

In the radio receiver according to the eighth aspect, the threshold setting means decides a change direction and/or a change amount of the threshold of electric field intensity level which start AGC operation in a succeeding reception based on a measured result by the error rate measuring means in a present reception, a measured result by the error rate measuring means in a preceding reception, the threshold of electric field intensity level which start AGC operation set in a present reception, and a set value of the threshold of electric field intensity level which start AGC operation in the preceding reception.

The radio receiver according to the ninth aspect, further comprises a threshold range setting means for setting an available set range of the threshold of electric field intensity level which start AGC operation, which is defined by a maximum value and a minimum value.

In the radio receiver according to the tenth aspect, the threshold setting means does not change a setting of the threshold of electric field intensity level which start AGC operation when the threshold of electric field intensity level which start AGC operation is more than the maximum value or is less than the minimum value of the available set range and a measured result by the error rate measuring means is less than a predetermined value.

The radio receiver according to the 11th aspect, further comprises a storing means for updating/holding the measured result by the error rate measuring means in the present reception as a measured result by the error rate measuring means in the preceding reception, updating/holding the threshold of electric field intensity level which start AGC operation set in the present reception as the set value of the threshold of electric field intensity level which start AGC operation in the preceding reception, and updating/holding the threshold of electric field intensity level which start AGC operation set by the setting means in the present reception as the threshold of electric field intensity level which start AGC operation set in a succeeding reception.

In the radio receiver according to the 12th aspect, the gain control amount setting means decides a change direction and/or a change amount of the gain control amount in a succeeding reception based on a measured result by the error rate measuring means in a present reception and a measured result by the error rate measuring means in a preceding reception.

In the radio receiver according to the 13th aspect, the gain control amount setting means decides a change direction and/or a change amount of the gain control amount in a succeeding reception based on a measured result by the error rate measuring means in a present reception, a measured result by the error rate measuring means in a preceding reception, the gain control amount set in a present reception, and a set value of the gain control amount in the preceding reception.

The radio receiver according to the 14th aspect, further comprises a gain control amount range setting means for setting an available set range of the gain control amount, which is defined by a maximum value and a minimum value.

In the radio receiver according to the 15th aspect, the gain control amount setting means does not change a setting of the gain control amount when the gain control amount is more than the maximum value or is less than the minimum value of the available set range and a measured result by the error rate measuring means is less than a predetermined value.

The radio receiver according to the 16th aspect, further comprises a storing means for updating/holding the measured result by the error rate measuring means in the present reception as a measured result by the error rate measuring means in the preceding reception, updating/holding the gain control amount set in the present reception as the set value of the gain control amount in the preceding reception, and updating/holding the gain control amount set by the gain control amount setting means in the present reception as the gain control amount set in a succeeding reception.

Also, a radio receiving method according to the 17th aspect of the present invention used for a radio receiver including a gain controlling means for controlling a gain of the radio receiver, an electric field intensity detecting means for detecting an electric field intensity of a received signal, and an error rate measuring means for measuring an error rate of the received signal, comprising a threshold setting step of setting a threshold of electric field intensity level which start AGC operation to start a gain control operation of the gain controlling means in response to a measured result of the error rate measuring means; and a first controlling step of causing the gain controlling means to start the gain control operation when the electric field intensity detected by the electric field intensity detecting means reaches the threshold of electric field intensity level which start AGC operation.

The radio receiving method according to the 18th aspect, further comprises a receiving step of performing a reception at the set threshold of electric field intensity level which start AGC operation; an error rate measuring step of measuring the error rate in the receiving step by the error rate measuring means; and wherein the threshold setting step decides a change direction and/or a change amount of the threshold of electric field intensity level which start AGC operation in a succeeding reception based on a measured result by the error rate measuring means in a present reception and a measured result by the error rate measuring means in a preceding reception.

The radio receiving method according to the 19th aspect, further comprises a receiving step of performing a reception at the set threshold of electric field intensity level which start AGC operation; an error rate measuring step of measuring the error rate in the receiving step by the error rate measuring means; and wherein the threshold setting step decides a change direction and/or a change amount of the threshold of electric field intensity level which start AGC operation in a succeeding reception based on a measured result by the error rate measuring means in a present reception, a measured result by the error rate measuring means in a preceding reception, the threshold of electric field intensity level which start AGC operation set in a present reception, and a set value of the threshold of electric field intensity level which start AGC operation in the preceding reception.

The radio receiving method according to the 20th aspect, further comprises an threshold range setting step of setting an available set range of the threshold of electric field intensity level which start AGC operation, which is defined by a maximum value and a minimum value.

In the radio receiving method according to the 21th aspect, the threshold setting step does not change a setting of the threshold of electric field intensity level which start AGC operation when the threshold of electric field intensity level which start AGC operation is more than the maximum value or is less than the minimum value of the available set range and a measured result by the error rate measuring means is less than a predetermined value.

The radio receiving method according to the 22th aspect, further comprises a storing step of updating/holding the measured result by the error rate measuring means in the present reception as a measured result by the error rate measuring means in the preceding reception, updating/holding the threshold of electric field intensity level which start AGC operation set in the present reception as the set value of the threshold of electric field intensity level which start AGC operation in the preceding reception, and updating/holding the threshold of electric field intensity level which start AGC operation set by the threshold setting means in the present reception as the threshold of electric field intensity level which start AGC operation set in a succeeding reception.

Also, a radio receiving method according to the 23th aspect of the present invention used for a radio receiver including a gain controlling means for controlling a gain of the radio receiver, and an error rate measuring means for measuring an error rate of the received signal, comprises a gain control amount setting step of setting a gain control amount of the gain controlling means in response to a measured result of the error rate measuring means; and a second controlling step of causing the gain controlling means to change a gain in response to the gain control amount.

The radio receiving method according to the 24th aspect, further comprises a receiving step of performing a reception at the set gain control amount; and an error rate measuring step of measuring the error rate in the receiving step by the error rate measuring means; and wherein the gain control amount setting step decides a change direction and/or a change amount of the gain control amount in a succeeding reception based on a measured result by the error rate measuring means in a present reception and a measured result by the error rate measuring means in a preceding reception.

The radio receiving method according to the 25th aspect, further comprises a receiving step of performing a reception at the set gain control amount; and an error rate measuring step of measuring the error rate in the receiving step by the error rate measuring means; and wherein the gain control amount setting step decides a change direction and/or a change amount of the gain control amount in a succeeding reception based on a measured result by the error rate measuring means in a present reception, a measured result by the error rate measuring means in a preceding reception, the gain control amount set in a present reception, and a set value of the gain control amount in the preceding reception.

The radio receiving method according to the 26th aspect, further comprises a gain control amount range setting step of setting an available set range of the gain control amount, which is defined by a maximum value and a minimum value.

In the radio receiving method according to the 27th aspect, the gain control amount setting step does not change a setting of the gain control amount when the gain control amount is more than the maximum value or is less than the minimum value of the available set range and a measured result by the error rate measuring means is less than a predetermined value.

The radio receiving method according to the 28th aspect, further comprises a storing step of updating/holding the measured result by the error rate measuring means in the present reception as a measured result by the error rate measuring means in the preceding reception, updating/holding the gain control amount set in the present reception as the set value of the gain control amount in the preceding reception, and updating/holding the gain control amount set by the gain control amount setting means in the present reception as the gain control amount set in a succeeding reception.

Also, a radio receiving method according to the 29th aspect of the present invention used for a radio receiver which includes a gain controlling means for controlling a gain of the radio receiver and an electric field intensity detecting means for detecting an electric field intensity of a received signal and also receives a signal having a signal format that is transmitted while changing transmission conditions into two types or more, comprises an threshold setting step of setting an threshold of electric field intensity level to start a gain control operation of the gain controlling means in response to a transmission condition of the signal; and a first controlling step of causing the gain controlling means to start the gain control operation when the electric field intensity detected by the electric field intensity detecting means reaches the threshold of electric field intensity level which start AGC operation.

Also, a radio receiving method according to the 30th aspect of the present invention used for a radio receiver which includes a gain controlling means for controlling a gain of the radio receiver and also receives a signal having a signal format that is transmitted while changing transmission conditions into two types or more, comprises a gain control amount setting step of setting a gain control amount of the gain controlling means in response to a transmission condition of the signal; and a second controlling step of causing the gain controlling means to change a gain in response to the gain control amount.

Also, a computer-readable recording medium according to the 31st aspect of the present invention for storing a program which causes a computer to execute a radio receiving method.

According to the radio receiver set forth in said aspects 1, 5, 6, 7, 8, 9, 10, 11, the radio receiving method set forth in said aspects 17, 18, 19, 20, 21, 22 and the recording medium set forth in said aspect 31 of the present invention, the threshold of electric field intensity level that starts the gain control operation of the gain controlling means in response to the measured result of the error rate measuring means is set by the threshold setting means (threshold setting step). In the first controlling means (first controlling step), when the electric field intensity detected by the electric field intensity detecting means reaches the threshold of electric field intensity level which start AGC operation, the gain controlling means is caused to start the gain control operation.

In particular, according to the radio receiver set forth in said aspect 5, the gain controlling means is a step-wise gain control type, and changes the gain by a predetermined amount when the signal level of the received signal exceeds a predetermined level. In particular, according to the radio receiver set forth in said aspect 6, the gain controlling means is a continuous gain control type, and changes the gain in response to the signal level of the received signal.

In this manner, according to the present invention, since the threshold of electric field intensity level which start AGC operation is set based on the measured result of the error rate of the received signal, the optimum threshold of electric field intensity level which start AGC operation can be set to meet the radio wave situation in which the radio receiver is located, i.e., the receiving situation of the received signal, and also the gain control of the gain controlling means can be attained to optimize the signal quality of the received signal in the situation of either the IM characteristic or the electric field variation characteristic, e.g., under the environment of existing strong IM interference signal or the environment in which the electric field intensity is changed strongly. As a result, the communication quality in the mobile radio communication can be improved considerably.

Here, for example, as the particular example of the configuration of the first controlling means, followings may be considered. As a first particular configuration, a comparing means for comparing the electric field intensity detected by the electric field intensity detecting means with the predetermined reference intensity level is provided, and then the predetermined reference intensity level of the comparing means is switched and set in response to the error rate measured result. As a second particular configuration, a variable gain amplifier for amplifying the received signal at a predetermined gain and supplying it to the electric field intensity detecting means is provided, and then the predetermined gain of the variable gain amplifier is changed and set in response to the error rate measured result. Also, as a third particular configuration, a converting means for converting the output of the electric field intensity detecting means into the voltage level at a predetermined rate, and then the predetermined rate of the converting means is switched and set in response to the error rate measured result.

In particular, according to the radio receiver set forth in said aspect 7 and the radio receiving method set forth in said aspect 18, in the threshold setting means (threshold setting step), the change direction and/or the change amount of the threshold of electric field intensity level which start AGC operation in the succeeding reception is decided based on a measured result by the error rate measuring means (error rate measuring step) in the present reception and the measured result by the error rate measuring means in the preceding reception.

For example, if the error rate in the present reception is smaller than that in the preceding reception, the changing direction of the threshold of electric field intensity level which start AGC operation in the succeeding reception can be kept in the same direction as that in the preceding reception since the error rate could be improved whereas, if the error rate in the present reception is larger than that in the preceding reception, the changing direction of the threshold of electric field intensity level which start AGC operation in the succeeding reception can be switched in the direction opposite to that in the preceding reception since the error rate has been degraded. Therefore, since the threshold of electric field intensity level which start AGC operation can be set by deciding appropriately the change direction of the threshold of electric field intensity level which start AGC operation to be set subsequently, the setting of the optimum threshold of electric field intensity level which start AGC operation can be achieved under the environment of existing strong IM interference signal or the environment in which the electric field intensity is changed strongly.

Also, for example, in the event that the error rate is high, if the error rate change amount defined by the difference between the error rate in the present reception and the error rate in the preceding reception, or the like is below the predetermined value, the change amount of the threshold of electric field intensity level which start AGC operation is relatively increased whereas, if the error rate change amount exceeds the predetermined value, the change amount of the threshold of electric field intensity level which start AGC operation is relatively decreased. Therefore, it is possible to accelerate the convergence of the threshold of electric field intensity level which start AGC operation into the optimum threshold of electric field intensity level which starts AGC operation.

In addition, for example, if the threshold of electric field intensity level which start AGC operation is returned to the predetermined initial value when the error rate exceeds the predetermined value, the appropriate countermeasure can be taken when the setting of the threshold of electric field intensity level which start AGC operation is largely out of the range.

In particular, according to the radio receiver set forth in said aspect 8 and the radio receiving method set forth in said aspect 19, in the threshold setting means (threshold setting step), the change direction and/or the change amount of the threshold of electric field intensity level which start AGC operation in the succeeding reception is decided based on the measured result by the error rate measuring means (error rate measuring step) in the present reception, the measured result by the error rate measuring means in the preceding reception, the threshold of electric field intensity level which start AGC operation set in a present reception, and the set value of the threshold of electric field intensity level which start AGC operation in the preceding reception.

For example, in the case that the error rate in the present reception is smaller than that in the preceding reception (the error rate can be improved), when the threshold of electric field intensity level which start AGC operation in the present reception is larger than that in the preceding reception, the threshold of electric field intensity level which start AGC operation in the succeeding reception is increased whereas, when the threshold of electric field intensity level which start AGC operation in the present reception is smaller than that in the preceding reception, the threshold of electric field intensity level which start AGC operation in the succeeding reception is reduced small. In contrast, in the case that the error rate in the present reception is larger than that in the preceding reception (the error rate can be degraded), when the threshold of electric field intensity level which start AGC operation in the present reception is larger than that in the preceding reception, the threshold of electric field intensity level which start AGC operation in the succeeding reception is set smaller whereas, when the threshold of electric field intensity level which start AGC operation in the present reception is smaller than that in the preceding reception, the threshold of electric field intensity level which start AGC operation in the succeeding reception is increased. Therefore, since the threshold of electric field intensity level which start AGC operation can be set by deciding more appropriately the change direction of the threshold of electric field intensity level which start AGC operation to be set subsequently, the optimum threshold of electric field intensity level which start AGC operation can be set under the environment of the strong electric field IM or the environment in which the electric field intensity is changed strongly.

In particular, according to the radio receiver set forth in said aspect 9 and the radio receiving method set forth in said aspect 20, preferably the available set range of the threshold of electric field intensity level which start AGC operation, which is defined by the maximum value and the minimum value, should be set by the threshold range setting means (threshold range setting step). Also, according to the radio receiver set forth in said aspect 10 and the radio receiving method set forth in said aspect 21, in the threshold setting means (threshold setting step), preferably the setting of the threshold of electric field intensity level which starts AGC operation should not be changed when the threshold of electric field intensity level which start AGC operation is more than the maximum value or less than the minimum value of the available set range and the measured result by the error rate measuring means is less than the predetermined value. Therefore, in the case that the set value of the threshold of electric field intensity level which start AGC operation is set to the maximum value or the minimum value, it is possible to prevent the situation that the set value of the threshold of electric field intensity level which start AGC operation is changed unnecessarily even when the error rate is sufficiently small.

In particular, according to the radio receiver set forth in said aspect 11 and the radio receiving method set forth in said aspect 22, preferably the storing means (storing step) should update/hold the measured result by the error rate measuring means in the present reception as the measured result by the error rate measuring means in the preceding reception, update/hold the threshold of electric field intensity level which start AGC operation set in the present reception as the set value of the threshold of electric field intensity level which start AGC operation in the preceding reception, and update/hold the threshold of electric field intensity level which start AGC operation set by the threshold setting means in the present reception as the threshold of electric field intensity level which start AGC operation set in the succeeding reception every reception or per the predetermined number of times of reception. Therefore, the more effective process can be accomplished in the threshold range setting means (threshold range setting step).

According to the radio receiver set forth in said aspects 2, 5, 12, 13, 14, 15, 16, the radio receiving method set forth in said aspects 23, 24, 25, 26, 27, 28 and the recording medium set forth in said aspect 31 of the present invention, the gain control amount of the gain controlling means is set by the gain control amount setting means (gain control amount setting step) in response to the measured result of the error rate measuring means. In the second controlling means (second controlling step), the gain, controlling means is caused to change the gain in response to the gain control amount.

In particular, according to the radio receiver set forth in said aspect 5, the gain controlling means is the step-wise gain control type, and changes the gain by the predetermined amount when the signal level of the received signal exceeds the predetermined level.

In this manner, according to the present invention, since the gain control amount can be set in response to the measured result of the error rate of the received signal, the optimum gain control amount can be set to meet the radio wave situation in which the radio receiver is located, i.e., the receiving situation of the received signal, and also the gain control of the gain controlling means can be attained to optimize the signal quality of the received signal in the situation of either the IM characteristic or the electric field variation characteristic, e.g., under the environment of the strong electric field IM or the environment in which the electric field intensity is changed strongly. As a result, the communication quality in the mobile radio communication can be considerably improved.

Here, for example, as the particular example of the configuration of the gain controlling means and the second controlling means, followings may be considered. As a first particular configuration, a signal amplifying means for amplifying the received signal and a distributing means for distributing the received signal received via the antenna to the signal amplifying means and other signal paths are provided to the gain controlling means, and then a distribution rate in the distributing means to the signal amplifying means is changed by the second controlling means in response to the measured result of the error rate. Where "other signal paths" are a route from the antenna to the ground, for example.

Also, as a second particular configuration, the signal amplifying means the gain of which is controlled by an output voltage switching circuit whose output voltage can be switched is provided to the gain controlling means, and then the output voltage of the output voltage switching circuit is changed by the second controlling means in response to the measured result of the error rate. In addition, as a third particular configuration, a signal amplifying means which includes a current source with a current switching function is provided to the gain controlling means, and then a current value from the current source with the current switching function provided in the signal amplifying means is changed and set by the second controlling means in response to the measured result of the error rate.

In particular, according to the radio receiver set forth in said aspect 12 and the radio receiving method set forth in said aspect 24, in the gain control amount setting means (gain control amount setting step), the change direction and/or the change amount of the gain control amount in the succeeding reception is decided based on the measured result by the error rate measuring means (error rate measuring step) in the present reception and the measured result by the error rate measuring means in the preceding reception.

For example, if the error rate in the present reception is smaller than that in the preceding reception, the changing direction of the gain control amount in the succeeding reception can be kept in the same direction as that in the preceding reception since the error rate could be improved whereas, if the error rate in the present reception is larger than that in the preceding reception, the changing direction of the gain control amount in the succeeding reception can be switched in the direction opposite to that in the preceding reception since the error rate has been degraded. Therefore, since the gain control amount can be set by deciding appropriately the change direction of the gain control amount to be set subsequently, the setting of the optimum gain control amount can be achieved under the environment of the strong electric field IM or the environment in which the electric field intensity is changed strongly.

Also, for example, in the event that the error rate is high, when the error rate change amount defined by the difference between the error rate in the present reception and the error rate in the preceding reception, or the like is below the predetermined value, the change amount of the gain control is relatively increased whereas, when the error rate change amount exceeds the predetermined value, the change amount of the gain control is relatively decreased. Therefore, it is possible to accelerate the convergence of the gain control amount into the optimum threshold of electric field intensity level which strats AGC operation.

In addition, for example, if the gain control amount is returned to the predetermined initial value when the error rate exceeds the predetermined value, the appropriate countermeasure can be taken when the setting of the gain control amount is largely out of the range.

In particular, according to the radio receiver set forth in aspect 13 and the radio receiving method set forth in aspect 25, in the gain control amount setting means (gain control amount setting step), the change direction and/or the change amount of the gain control amount in the succeeding reception is decided based on the measured result by the error rate measuring means (error rate measuring step) in the present reception, the measured result by the error rate measuring means in the preceding reception, the gain control amount set in the present reception, and the set value of the gain control amount in the preceding reception.

For example, in the case that the error rate in the present reception is smaller than that in the preceding reception (the error rate can be improved), when the gain control amount in the present reception is larger than that in the preceding reception, the gain control amount in the succeeding reception is increased whereas, when the gain control amount in the present reception is smaller than that in the preceding reception, the change direction of the gain control amount in the succeeding reception is reduced small. In contrast, in the case that the error rate in the present reception is larger than that in the preceding reception (the error rate can be degraded), when the gain control amount in the present reception is larger than that in the preceding reception, the gain control amount in the succeeding reception is set smaller whereas, when the gain control amount in the present reception is smaller than that in the preceding reception, the gain control amount in the succeeding reception is increased. Therefore, since the gain control amount can be set by deciding more appropriately the change direction of the gain control amount to be set subsequently, the optimum gain control amount can be set under the environment of the strong electric field IM or the environment in which the electric field intensity is changed strongly.

In particular, according to the radio receiver set forth in aspect 14 and the radio receiving method set forth in aspect 26, preferably the available set range of the gain control amount, which is defined by the maximum value and the minimum value, should be set by the gain control amount range setting means (gain control amount range setting step). Also, according to the radio receiver set forth in aspect 15 and the radio receiving method set forth in aspect 27, in the gain control amount setting means (gain control amount setting step), the setting of the gain control amount is not changed when the gain control amount is more than the maximum value or is less than the minimum value of the available set range and also the measured result by the error rate measuring means is less than the predetermined value. Therefore, in the case that the set value of the gain control amount is set to the maximum value or the minimum value, when the error rate is sufficiently low, it is possible to prevent the situation that the set value of the gain control amount is changed unnecessarily.

In particular, according to the radio receiver set forth in aspect 16 and the radio receiving method set forth in aspect 28, preferably the storing means should update/hold the measured result by the error rate measuring means in the present reception as a measured result by the error rate measuring means in the preceding reception, update/hold the gain control amount set in the present reception as the set value of the gain control amount in the preceding reception, and update/hold the gain control amount set by the gain control amount setting means in the present reception as the gain control amount set in the succeeding reception every reception or per the predetermined number of times of reception. Therefore, the more effective process can be accomplished in the gain control amount setting means (gain control amount setting step).

Also, according to the radio receiver set forth in aspects 3, 5, 6, the radio receiving method set forth in aspect 29, and the recording medium set forth in aspect 31 of the present invention, when the signal having the signal format that is transmitted while changing the transmitting conditions such as the transmission data speed into two types or more is received, the threshold of electric field intensity level which start AGC operation is set by the threshold setting means (threshold setting step) to start the gain control operation of the gain controlling means in response to the transmission condition of the signal. In the first controlling means (first controlling step), when the electric field intensity detected by the electric field intensity detecting means reaches the threshold of electric field intensity level which starts AGC operation, the gain controlling means is caused to start the gain control operation.

As the radio receiver which receives the signal having the signal format that is transmitted while changing the transmitting conditions such as the transmission data speed into two types or more, for example, there are the FLEX system pager, the FLEX-TD system pager, etc. In such radio receiver, since the threshold of electric field intensity level which start AGC operation can be set to meet the transmission conditions of the signal, the optimum gain control of the gain controlling means can be achieved to satisfy the transmission conditions of the signal, and as a result the communication quality in the mobile radio communication can be considerably improved.

Also, according to the radio receiver set forth in aspects 4, 5, the radio receiving method set forth in aspect 30, and the recording medium set forth in aspect 31 of the present invention, when the signal having the signal format that is transmitted while changing the transmitting conditions such as the transmission data speed into two types or more is received, the gain control amount of the gain controlling means is set by the gain control setting means (gain control amount setting step) in response to the transmission condition of the signal. In the second controlling means (second controlling step), the gain controlling means is caused to change the gain in response to the gain control amount.

For example, in the radio receiver such as the FLEX system pager, the FLEX-TD system pager, or the like which receives the signal having the signal format that is transmitted while changing the transmitting conditions such as the transmission data speed into two types or more, the gain control amount can be set to meet the transmission conditions of the signal. Thus, the optimum gain control of the gain controlling means can be achieved to satisfy the transmission conditions of the signal. As a result, the communication quality in the mobile radio communication can be considerably improved.

DESCRIPTION OF THE PREFERRED EMBODIMENTS

Embodiments of the radio receiver, the radio receiving method, and a recording medium of the present invention will be explained in detail with reference to the accompanying drawings in the order of [First Embodiment], [Second Embodiment], [Third Embodiment], and [Fourth Embodiment] hereinafter. In the description of respective embodiments, the radio receiver and the radio receiving method according to the present invention will be explained in detail, but description of the recording medium according to the present invention may be contained in the following explanation of the radio receiving method since such recording medium records the program to cause the radio receiver to execute the radio receiving method.

First Embodiment

Figure 1:
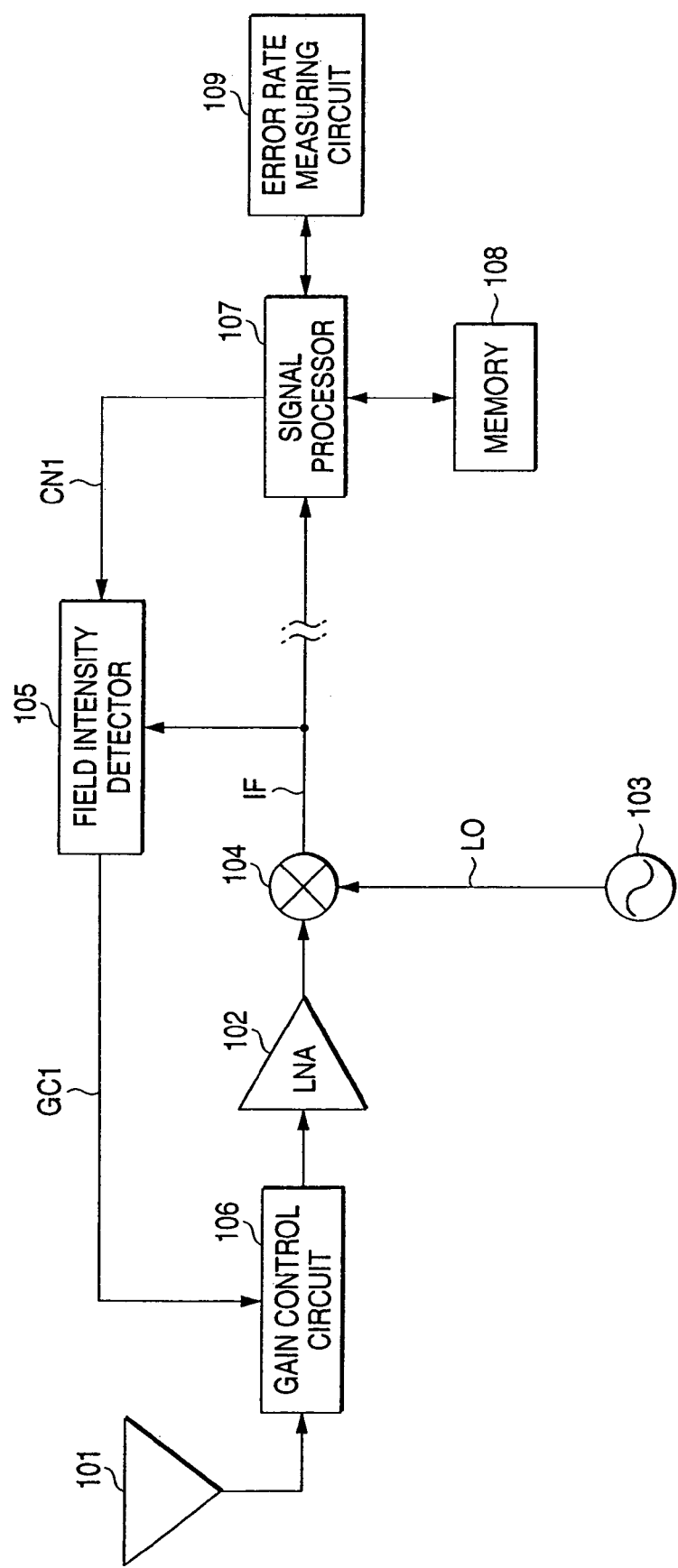
FIG. 1 is a view showing a configuration of a radio receiver according to a first embodiment of the present invention.

FIG. 1 shows a configuration of a radio receiver according to a first embodiment of the present invention.

In FIG. 1, the radio receiver according to the first embodiment is constructed to include an antenna 101, a low-noise signal amplifier (LNA) 102, a local oscillator circuit (Local) 103, a frequency converter circuit (Mix) 104, a field intensity detector 105, a gain control circuit 106, a signal processor portion 107, a memory 108, and an error rate measuring circuit 109.

The antenna 101 receives a signal transmitted from a base station (not shown). The low-noise signal amplifier 102 amplifies the signal received via the antenna 101. The frequency converter circuit 104 executes the frequency conversion by multiplying the signal amplified by the low-noise signal amplifier 102 by the signal from the local oscillator circuit 103.

When the electric field intensity of the signal reaches the threshold of electric field intensity level which start AGC operation on the basis of a control parameter (signal CN1), the field intensity detector 105 changes a voltage of an output signal GC1 in response to an intensity of the received signal whose frequency is converted into the intermediate frequency (IF) by the frequency converter circuit 104. The gain control circuit 106 changes the gain control amount in answer to the output signal GC1 from the field intensity detector 105.

In the memory 108, an error rate measured result in the preceding reception, a set value of the threshold of electric field intensity level which start AGC operation in the preceding reception, other parameters used in the process to set the threshold of electric field intensity level which start AGC operation in the succeeding reception, and the threshold of electric field intensity level which start AGC operation set by the process in the succeeding reception, etc. are stored.

The signal processor portion 107 demodulates the received signal, sets the threshold of electric field intensity level which starts AGC operation in the succeeding reception based on data of the error rate of the received signal and the set values in the automatic gain control (abbreviated to "AGC" hereinafter) by comparing the data in the present reception with the data stored in the memory 108 in the preceding reception, and controls the field intensity detector 105 by supplying the control parameter (signal CN1). Also, the signal processor portion 107 updates the error rate measured result stored in the memory 108 in the preceding reception by the error rate measured result in the present reception, updates the set value of the threshold of electric field intensity level which start AGC operation in the preceding reception by the threshold of electric field intensity level which start AGC operation set in the present reception, and updates the threshold of electric field intensity level which start AGC operation set in the succeeding reception by the threshold of electric field intensity level which start AGC operation set by the signal processor portion 107 in the present reception.

As described above, the threshold of electric field intensity level which start AGC operation to be set in the present reception is decided by the process in the signal processor portion 107 in the preceding reception and is stored in the memory 108. The signal processor portion 107 controls the setting of the field intensity detector 105 by outputting the control signal CN1 in response to the stored threshold of electric field intensity level which start AGC operation by looking up the memory 108.

Figure 2:
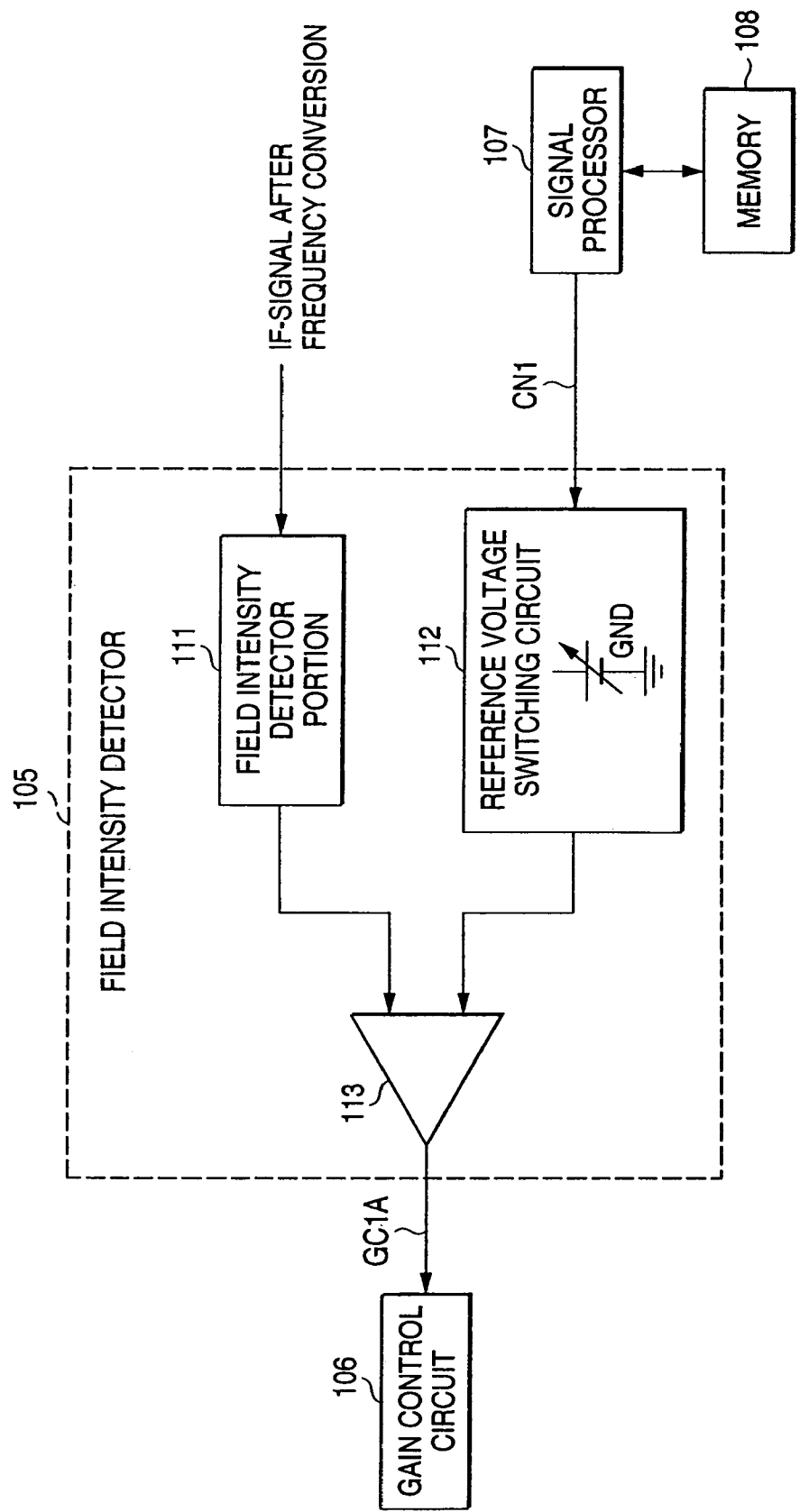
FIG. 2 is a view showing a particular configuration of a field intensity detector in the radio receiver according to the first embodiment.

Then, a particular configuration for changing the setting of the field intensity detector 105 based on the control signal CN1 from the signal processor portion 107 will be explained with reference to FIG. 2 hereunder. FIG. 2 shows the particular configuration of a field intensity detector in the radio receiver according to the first embodiment. In FIG. 2, the field intensity detector 105 is constructed to include a field intensity detector portion 111, a reference voltage switching circuit 112, and an operation start field value switching circuit 113.

The field intensity detector portion 111 detects the electric field intensity of the intermediate frequency signal IF after the frequency conversion. The field intensity detector portion 111 has such a characteristic that an output voltage is increased with the increase in the signal intensity when the voltage output according to the intensity of the signal input into the radio receiver is changed.

The reference voltage switching circuit 112 switches the output voltage (reference intensity level of the threshold of electric field intensity level which start AGC operation) based on the control signal CN1 from the signal processor portion 107.

The operation start field value switching circuit 113 compares the output voltage of the field intensity detector portion 111 with the output voltage of the reference voltage switching circuit 112, and then outputs the signal GC1 to the gain control circuit 106 in response to the output signal of the field intensity detector portion 111 when the output of the field intensity detector portion 111 exceeds the output voltage of the reference voltage switching circuit 112.

In the particular configuration in FIG. 2, the reference voltage of the reference voltage switching circuit 112, which corresponds to the threshold of electric field intensity level which start AGC operation, is stored in the memory 108 as a control parameter. In other words, the signal processor portion 107 reads the control parameter (reference voltage), which corresponds to the threshold of electric field intensity level which start AGC operation set in the preceding reception, from the memory 108, and then outputs the control parameter as the control signal CN1 to the reference voltage switching circuit 112 provided in the field intensity detector 105 to switch the output voltage of the reference voltage switching circuit 112 (i.e., the reference voltage of the operation start field value switching circuit 113).

The output of the field intensity detector portion 111 whose output voltage is changed according to the intensity of the signal input into the radio receiver and the output of the reference voltage switching circuit 112 are compared with each other by the operation start field value switching circuit 113, and then the signal GC1 is output from the field intensity detector 105 to the gain control circuit 106 when the output of the field intensity detector portion 111 is larger than the output of the reference voltage switching circuit 112. In this manner, in the particular configuration in FIG. 2, it is possible to change the threshold of electric field intensity level which start AGC operation by switching the reference voltage of the reference voltage switching circuit 112.

As the particular example of the configuration to change the setting of the field intensity detector 105 (first controlling means), followings may be considered other than the above first particular configuration in FIG. 2.

For example, as a second particular configuration, such a configuration may be considered that the output IF of the frequency converter circuit 104 (intermediate frequency signal after the frequency conversion) is amplified by a variable gain amplifier, and then the amplified signal is supplied to the field intensity detector. At this time, a gain of the variable gain amplifier is changed based on the control signal CN1 from the signal processor portion 107.

Also, as a third particular configuration, such a configuration may be considered that a field intensity detector to have a current output and a current/voltage converter circuit are provided, and an output of the field intensity detector is used as the current output (i.e., the current output is changed in response to a signal level of the signal IF after the frequency conversion). At this time, a conversion gain of the current/voltage converter circuit is changed based on the control signal CN1 from the signal processor portion 107.

For example, the error rate measuring circuit 109 is composed of a BCH code correction circuit, and calculates an error rate of the signal based on the error correction number and the error uncorrection number of the demodulated signal.

In the mobile radio receiver system of this day, normally the radio signal is transmitted as BCH codes in many cases to improve the communication quality. Therefore, the radio receiver to receive the BCH-coded radio signal is equipped with a BCH code correction circuit. Thus, the radio receiver of this embodiment utilizes the BCH code correction circuit as the error rate measuring circuit 109. That is, in the case that the error can be corrected in the BCH code correction circuit, the error rate of the signal in the signal interval can be measured by weighting that the error is caused at a certain value, or by counting the error correction number and the error uncorrection number in the signal interval.

For example, the case will be considered where one word is composed of 32 bit signal and the error rate of the signal on one block constituting eight words (256 bits) is measured. According to the BCH code correction circuit that can correct up to two bits of one word, it is possible to recognize the error of the signal of less than two bits in one word. Also, if there is the error of more than three bits in one word, it is impossible to correct the error and thus it is impossible to recognize the bit number of the error. In this case, if the error number of the word in which the error of more than three bits is generated is decided uniformly into a particular value, the error rate of the signal in the block can be calculated. Here, the calculation will be made under the assumption that the error rate of the word in which the error of more than three bits is generated is set uniformly to "3".

The case where the number of error correction in one block is "5" and the number of error uncorrection words is "1" is considered as one example. The error number of the overall block (256 bits) is calculated as a sum of the error correction number and a value obtained by multiplying the error uncorrection word number by the error number 3, i.e., 5+3×1=8. Therefore, the error rate of the signal in this block is given by dividing the error number of the overall block by all bit number, i.e., 8/256=0.03125.

In this manner, the error rate of the received signal can be calculated by counting the error correction number and the error uncorrection number in the BCH code correction circuit. In the first embodiment, the receiving quality can be improved since the BCH code correction circuit is utilized as the error rate measuring circuit 109 and then the setting of AGC is controlled by utilizing positively the result of the received signal by the error rate measuring circuit 109.

Then, examples of the radio receiving method in the radio receiver according to the first embodiment having the above configuration (AGC threshold setting method utilizing the measured result of the received signal obtained by the error rate measuring circuit 109) will be explained in detail with reference to the drawings in the order of (First Example), (Second Example), (Third Example), (Fourth Example), and (Fifth Example) hereunder. In the following explanation, as for the relationship between the set value of the threshold of electric field intensity level which start AGC operation and the electric field intensity level in the AGC operation, assume that, if the set value is small, the AGC operation is started even when the electric field level is small whereas, if the set value is large, the AGC operation is not started until the electric field level becomes large.

FIRST EXAMPLE

Figure 3:
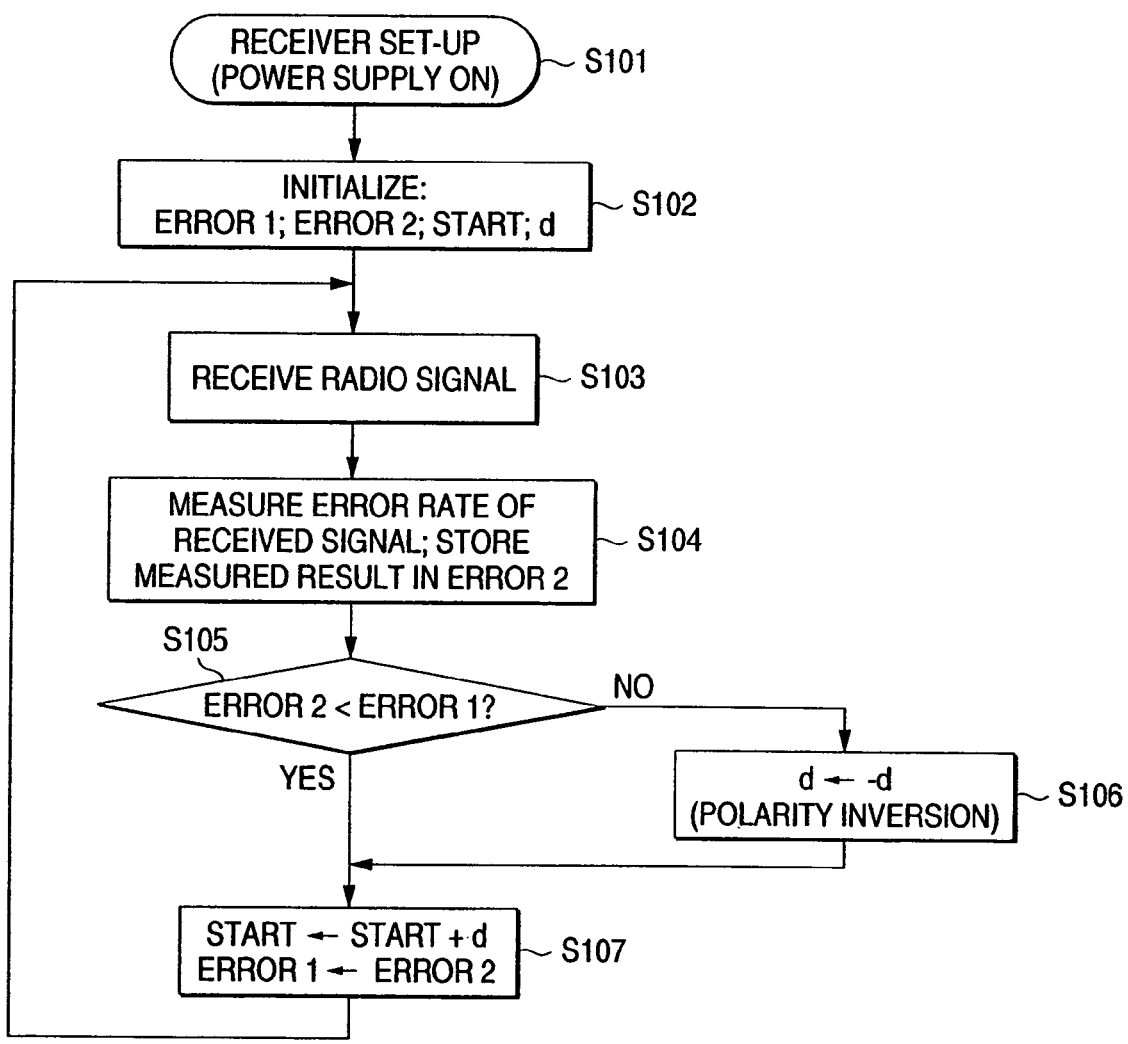
FIG. 3 is a flowchart showing an AGC threshold setting method (first example) in the radio receiver according to the first embodiment.

FIG. 3 shows a flowchart of an AGC threshold setting method (first example) in the radio receiver according to the first embodiment. In the threshold setting method of the first example, if the error rate in the present reception is smaller than that in the preceding reception, the changing direction of the threshold of electric field intensity level which start AGC operation in the succeeding reception is kept in the same direction as that in the preceding reception since the error rate could be improved while, if the error rate in the present reception is larger than that in the preceding reception, the changing direction of the threshold of electric field intensity level which start AGC operation in the succeeding reception is switched in the direction opposite to that in the preceding reception since the error rate has been degraded. In this case, a change amount of the threshold of electric field intensity level which start AGC operation is set constant.

Then, the variables used in FIG. 3 (parameters stored in the memory 108) will be explained. ERROR1 is the error rate measured result of the received signal in the preceding reception, and an initial value described later is set at the time of initial set-up of the radio receiver. ERROR2 is the error rate measured result of the received signal in the present reception. START is the set value of the AGCthreshold, and d is a change control amount of the AGCthreshold.

First, when the initial set-up is carried out by turning ON the power supply of the radio receiver in step S101, parameters ERROR1, ERROR2, START, and d are set to predetermined initial values in step S102. These step S101, S102 are the initial setting process in the set-up operation. Steps S103 to S107 described later are processes that set the threshold of electric field intensity level which start AGC operation by deciding appropriately the change direction of the threshold of electric field intensity level which start AGC operation to be set subsequently, and are carried out per a single reception or per several receptions after the reception has been conducted by the predetermined number of times.

In step S103, the radio signal is received by setting the threshold of electric field intensity level which start AGC operation to START. In step S104, the error rate of the received signal is measured by the error rate measuring circuit 109, and then the measured result is stored in ERROR2 as the error rate in the present reception.

Then, in step S105, the error rate ERROR1 in the preceding reception is compared with the error rate ERROR2 in the present reception. If the error rate of the received signal can be improved because the error rate ERROR2 in the present reception is smaller than the error rate ERROR1 in the preceding reception, it is decided that the error rate of the received signal could be improved by controlling the AGCthreshold. Thus, in order to keep the change in the AGC threshold in the succeeding reception in the same direction as that in the preceding reception, the polarity of the change control amount d is not changed. In contrast, if the error rate of the received signal is degraded because the error rate ERROR2 in the present reception is larger than the error rate ERROR1 in the preceding reception, it is decided that the error rate of the received signal has degraded by controlling the AGCthreshold. Thus, in step S106, in order to change the AGC threshold in the succeeding reception in the opposite direction to that in the preceding reception, the polarity of the change control amount d is inverted.

Finally, in step S107, the error rate ERROR2 in the present reception is stored in ERROR1 to prepare for the succeeding reception, and a value obtained by adding the change control amount d to the set value START in the present reception is stored as the AGC threshold in the succeeding reception. In addition, when the power supply of the radio receiver is turned ON, the receiving operation is still carried out by repeating above steps S103 to S107.

As described above, in the threshold of electric field intensity level which start AGC operation setting method according to the first example, since the threshold of electric field intensity level which start AGC operation can be set by deciding appropriately the change direction of the threshold of electric field intensity level which start AGC operation to be set subsequently, the setting of the optimum threshold of electric field intensity level which start AGC operation can be achieved under the environment of the strong electric field IM or the environment in which the electric field is changed strongly.

SECOND EXAMPLE

Figure 4:
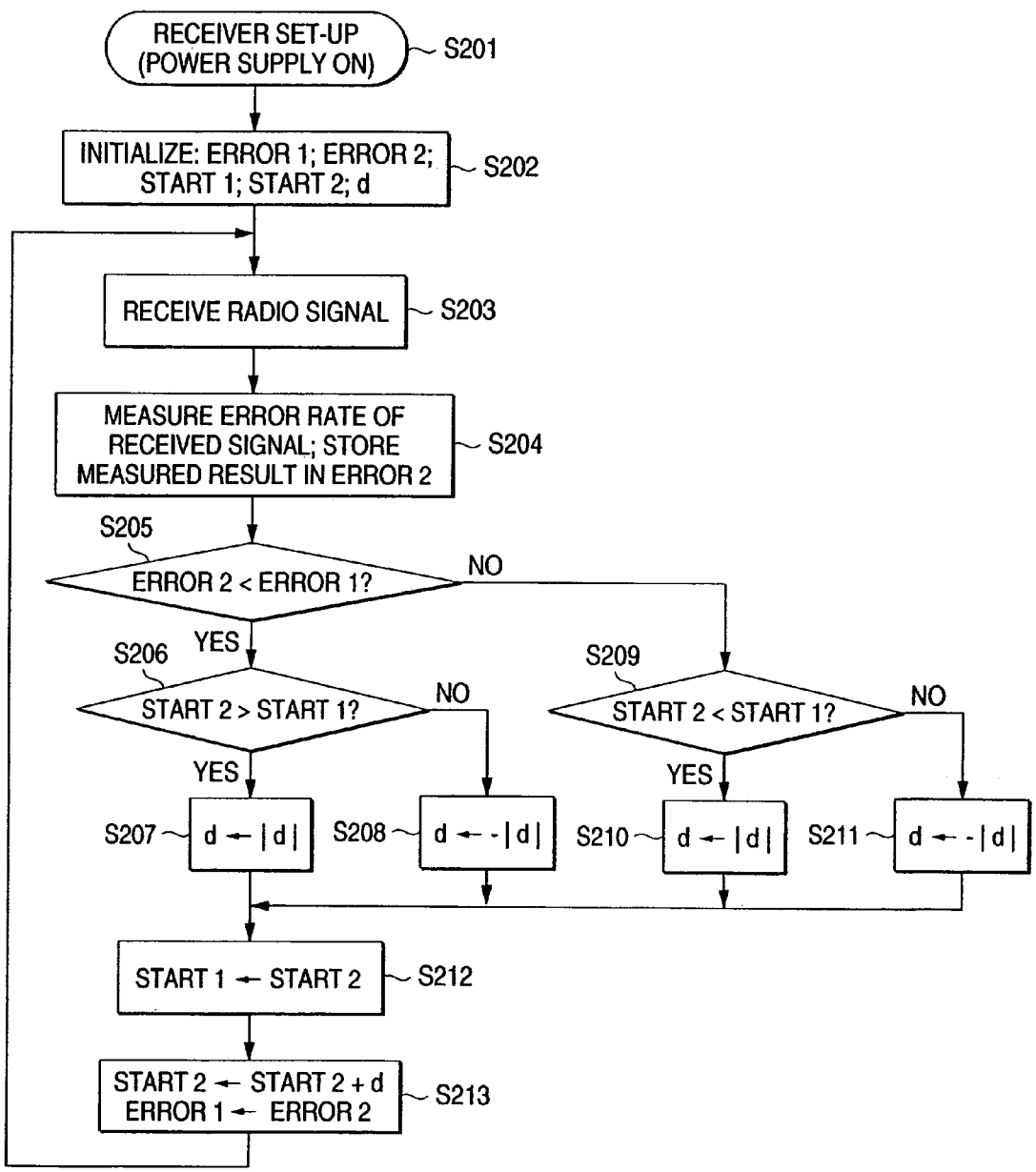
FIG. 4 is a flowchart showing an AGC threshold setting method (second example) in the radio receiver according to the first embodiment.

Then, FIG. 4 shows a flowchart of an AGC threshold setting method (second example) in the radio receiver according to the first embodiment. In the threshold setting method according to the second example, the AGC threshold in the succeeding reception is set based on the error rate measured results of the received signal in the preceding reception and the present reception, like the first example. In addition, the controlled direction of the AGC threshold can be decided more appropriately by storing the AGC threshold and then comparing the AGC threshold in the preceding reception with the AGC threshold in the present reception, and thus such decision can be actively used in setting the AGC threshold in the succeeding reception. In this case, a change amount of the threshold of electric field intensity level which start AGC operation is set constant.

Then, the variables used in FIG. 4 (parameters stored in the memory 108) will be explained. Like the first example, ERROR1, ERROR2, and d are the error rate in the preceding reception, the error rate in the present reception, and the change control amount respectively. START1 is the set value of the AGC threshold in the preceding reception, and START2 is the set value of the AGC threshold in the present reception.

First, when the initial set-up is carried out by turning ON the power supply of the radio receiver in step S201, parameters ERROR1, ERROR2, START1, START2, and d are set to predetermined initial values in step S202. These steps S201, S202 are the initial setting process in the set-up operation. Steps S203 to S213 described later are processes that set the threshold of electric field intensity level which start AGC operation by deciding appropriately the change direction of the threshold of electric field intensity level which start AGC operation to be set subsequently, and are carried out per a single reception or per several receptions after the reception has been conducted by the predetermined number of times.

In step S203, the radio signal is received by setting the threshold of electric field intensity level which start AGC operation to START2. In step S204, the error rate of the received signal is measured by the error rate measuring circuit 109, and then the measured result is stored in ERROR2 as the error rate in the present reception.

In step S205, the error rate ERROR2 in the present reception is compared with the error rate ERROR1 in the preceding reception to decide whether or not the error rate ERROR2 in the present reception is smaller than the error rate ERROR1 in the preceding reception to thus improve the error rate of the received signal. In steps S206, S209, in order to detect to which direction the AGC treshold is changed to generate the change in the error rate, the AGC threshold START2 in the present reception is compared with the AGC threshold START1 in the preceding reception.

In step S205, if it is decided that the error rate of the received signal is improved, the process goes step S206. In step S206, if the threshold START2 in the present reception is larger than the threshold START1 in the preceding reception, the process goes step S207. Then, a sign of the change control amount d is set positively such that the AGC threshold in the succeeding reception can be increased larger than the threshold START2 in the present reception. In contrast, in step S206, if the threshold START2 in the present reception is smaller than the threshold START1 in the preceding reception, the process goes step S208. Then, a sign of the change control amount d is set negatively such that the AGC threshold in the succeeding reception can be reduced smaller than the threshold START2 in the present reception.

In contrast, in step S205, if it is decided that the error rate of the received signal is degraded, the process goes step S209. In step S209, if the threshold START2 in the present reception is smaller than the threshold START1 in the preceding reception, the process goes step S210. Then, a sign of the change control amount d is set positively such that the AGC threshold in the succeeding reception can be increased larger than the threshold START2 in the present reception. In contrast, in step S209, if the threshold START2 in the present reception is larger than the threshold START1 in the preceding reception, the process goes step S211. Then, a sign of the change control amount d is set negatively such that the AGC threshold in the succeeding reception can be reduced smaller than the threshold START2 in the present reception.

Finally, in order to prepare for the succeeding reception, in step S212, the threshold START2 in the present reception is stored in START1. Also, in step S213, the error rate ERROR2 in the present reception is stored in ERROR1 and also a value obtained by adding the change control amount d to the set value START2 in the present reception is stored in START2 as the AGC threshold in the succeeding reception. In addition, when the power supply of the radio receiver is turned ON, the receiving operation is still carried out by repeating above steps S203 to S213.

As described above, in the threshold setting method according to the second example, the threshold of electric field intensity level which starts AGC operation can be increased/decreased in the same direction as that in the preceding reception if the error rate of the received signal is improved, and conversely the threshold of electric field intensity level which starts AGC operation can be increased/decreased in the opposite direction to that in the preceding reception if the error rate of the received signal is degraded. Therefore, since the threshold of electric field intensity level which starts AGC operation can be set by deciding more properly the change direction of the threshold of electric field intensity level which starts AGC operation to be set subsequently, the more appropriate threshold of electric field intensity level which starts AGC operation can be set under the environment of the strong electric field IM or the environment in which the electric field is changed strongly.

THIRD EXAMPLE

Figure 5:
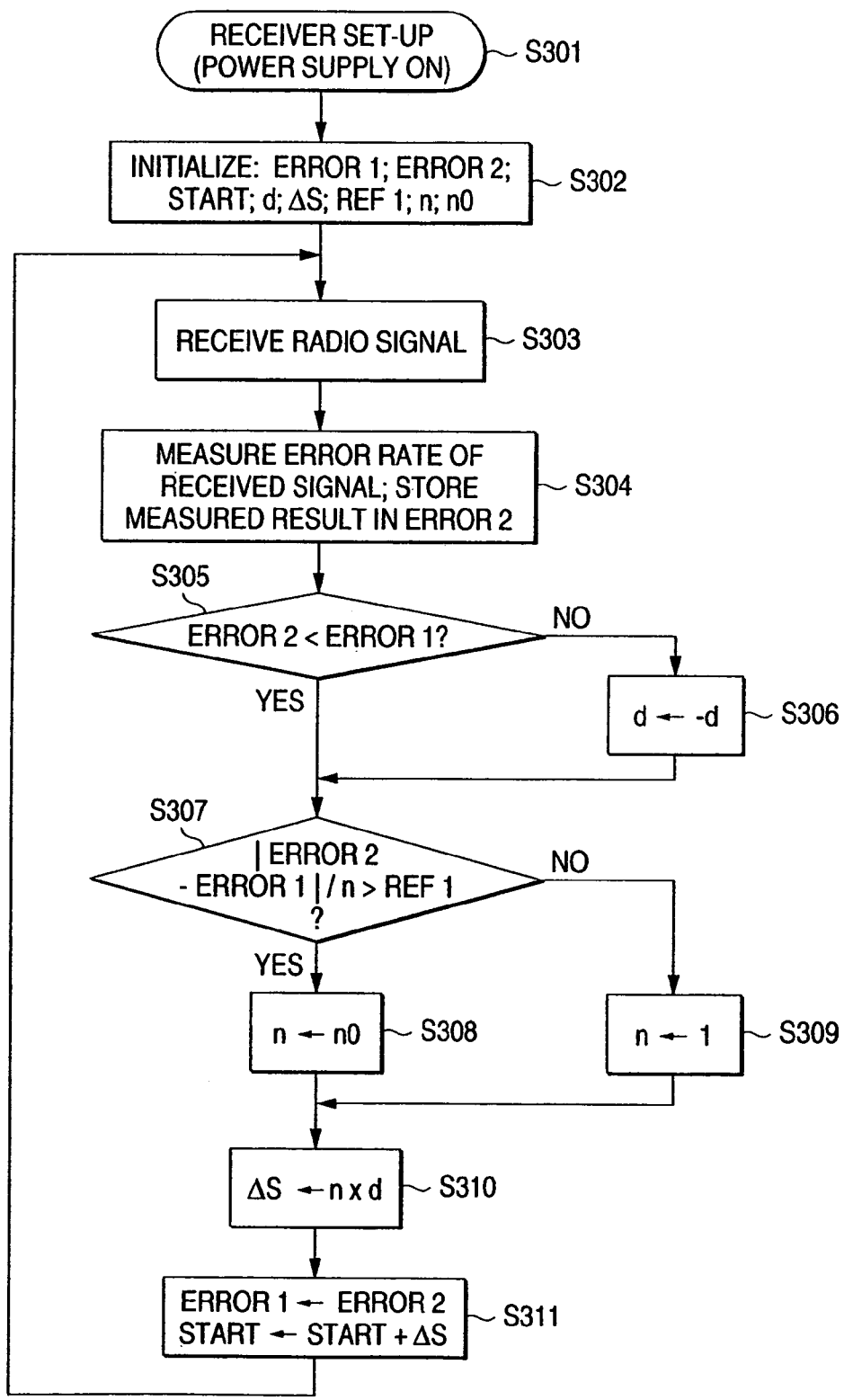
FIG. 5 is a flowchart showing an AGC threshold setting method (third example) in the radio receiver according to the first embodiment.

FIG. 5 shows a flowchart of an AGC threshold setting method (third example) in the radio receiver according to the first embodiment. In the threshold setting method according to the third example, in addition to the above decision of the change direction of the threshold of electric field intensity level which starts AGC operation like the first example, a change amount of the threshold of electric field intensity level which starts AGC operation can be changed according to an error rate change amount such that, if the error rate change amount is smaller than a predetermined value, the change amount of the threshold of electric field intensity level which starts AGC operation is kept at a constant value as it is whereas, if the error rate change amount is larger than the predetermined value, the change amount of the threshold of electric field intensity level which starts AGC operation is changed into a predetermined value.

Then, the variables used in FIG. 5 (parameters stored in the memory 108) will be explained. Like the first example, ERROR1, ERROR2, START and d are the error rate in the preceding reception, the error rate in the present reception, the set value of the threshold of electric field intensity level which starts AGC operation, and the change control amount respectively. Also, REF1 is a reference value of the error rate change amount of the received signal per one control step (change control amount d) of the AGC threshold. If a value obtained by dividing an absolute value of difference between ERROR1 and ERROR2 by a change amount control parameter n described later exceeds REF1, such change amount control parameter n, i.e., a change amount of the AGC threshold in the succeeding reception is changed. Also, n0 is a value that is set as the change amount control parameter n when the error rate change amount of the received signal per one control step (change control amount d) of the AGC threshold exceeds REF1. Also, ΔS is a change amount of the AGC threshold, and a value that is n times the change control amount d is set as ΔS.

First, when the initial set-up is carried out by turning ON the power supply of the radio receiver in step S301, parameters ERROR1, ERROR2, START, d, ΔS, REF1, n and nO are set to predetermined initial values in step S302. These steps S301, S302 are the initial setting process in the set-up operation. Steps S303 to S311 described later are processes that set the threshold of electric field intensity level which starts AGC operation by deciding appropriately the change direction of the threshold of electric field intensity level which starts AGC operation to be set subsequently and deciding the change amount, and are carried out per a single reception or per several receptions after the reception has been conducted by the predetermined number of times.

In step S303, the radio signal is received by setting the threshold of electric field intensity level which starts AGC operation to START. In step S304, the error rate of the received signal is measured by the error rate measuring circuit 109, and then the measured result is stored in ERROR2 as the error rate in the present reception.

Then, in step S305, the error rate ERROR2 in the present reception is compared with the error rate ERROR1 in the preceding reception. If the error rate ERROR2 in the present reception is smaller than the error rate ERROR1 in the preceding reception and thus the error rate of the received signal is improved, it is decided that the error rate of the received signal can be improved by the AGC threshold control. Thus, in order to change the AGC threshold in the succeeding reception in the same direction as that in the preceding reception, the polarity of the change control amount d is not changed. In contrast, if the error rate ERROR2 in the present reception is larger than the error rate ERROR1 in the preceding reception and thus the error rate of the received signal is degraded, it is decided that the error rate of the received signal is deteriorated by the AGC threshold control. Then, the process goes step S306 wherein the polarity of the change control amount d is inverted such that the AGC threshold in the succeeding reception can be changed in the opposite direction to that in the preceding reception.

Then, in step S307, a value obtained by dividing an absolute value of difference between the error rate ERROR1 in the preceding reception and the error rate ERROR2 in the present reception by the change amount control parameter n is compared with the reference value REF1. If such value obtained by dividing the absolute value of difference between ERROR1 and ERROR2 by the change amount control parameter n exceeds REF1, the process goes to step S308 wherein nO is set as the change amount control parameter n. In contrast, if the value obtained by dividing the absolute value of difference between ERROR1 and ERROR2 by the change amount control parameter n is less than REF1, the process goes to step S309 wherein "1" is set as the change amount control parameter n.

Then, in step S310, a value that is n times the change control amount d is set as the change amount ΔS of the AGC threshold. Finally, in order to prepare for the succeeding reception, in step S311, the error rate ERROR2 in the present reception is stored in ERROR1, and also a value obtained by adding the change amount ΔS to the set value START in the present reception is stored in START as the AGC threshold in the succeeding reception. In addition, when the power supply of the radio receiver is turned ON, the receiving operation is still carried out by repeating above steps S303 to S311.

As described above, in the threshold setting method according to the third example, the threshold of electric field intensity level which starts AGC operation can be set by deciding appropriately the change direction of the threshold of electric field intensity level which starts AGC operation to be set subsequently, and a change amount of the threshold of electric field intensity level which starts AGC operation can be changed according to the error rate change amount. Therefore, the more appropriate threshold of electric field intensity level which starts AGC operation can be set under the environment of the strong electric field IM or the environment in which the electric field is changed strongly.

FOURTH EXAMPLE

Figure 6:
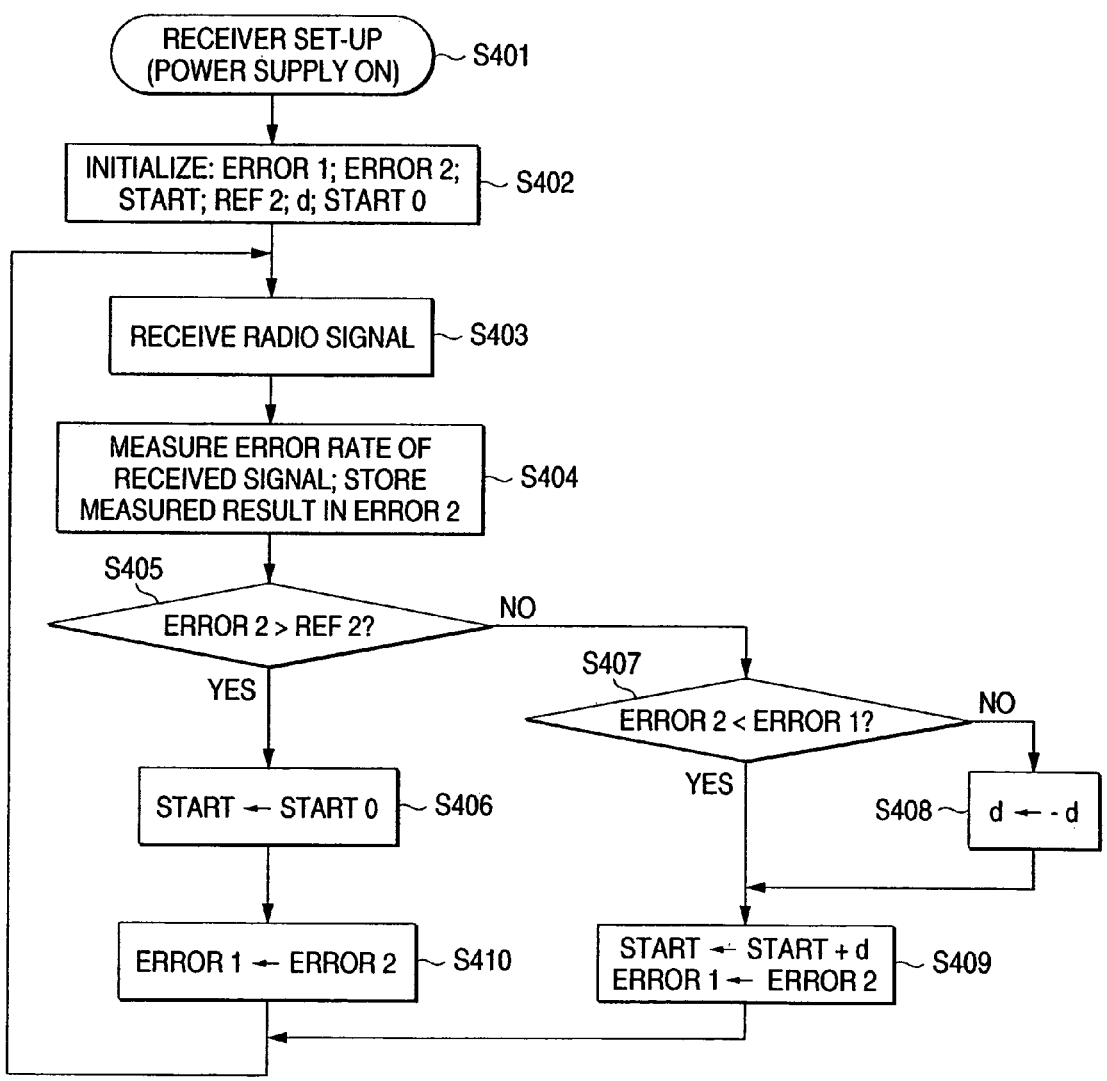
FIG. 6 is a flowchart showing an AGC threshold setting method (fourth example) in the radio receiver according to the first embodiment.

FIG. 6 shows a flowchart of an AGC threshold setting method (fourth example) in the radio receiver according to the first embodiment. In the threshold setting method according to the fourth example, before the above decision of the change direction of the threshold of electric field intensity level which starts AGC operation like the first example, the AGC threshold is returned to a predetermined initial value when the error rate exceeds a predetermined value. In this case, the change amount of the threshold of electric field intensity level which starts AGC operation is set constant.

Then, the variables used in FIG. 6 (parameters stored in the memory 108) will be explained. Like the first example, ERROR1, ERROR2, START and d are the error rate in the preceding reception, the error rate in the present reception, the set value of the threshold of electric field intensity level which starts AGC operation, and the change control amount respectively. Also, REF2 is a reference value that is compared with the error rate ERROR2 in the present reception. In addition, START0 is a predetermined set value of the AGC threshold. When the error rate ERROR2 in the present reception exceeds the reference value REF2, the AGC threshold (START) is set to the predetermined set value START0.

First, when the initial set-up is carried out by turning ON the power supply of the radio receiver in step S401, parameters ERROR1, ERROR2, START, d, REF2 and START0 are set to predetermined initial values in step S402. These steps S401, S402 are the initial setting process in the set-up operation. Steps S403 to S409 described later are processes that set the threshold of electric field intensity level which starts AGC operation by deciding appropriately the change direction of the threshold of electric field intensity level which starts AGC operation to be set subsequently, and are carried out per a single reception or per several receptions after the reception has been conducted by the predetermined number of times.

In step S403, the radio signal is received by setting the threshold of electric field intensity level which starts AGC operation to START. In step S404, the error rate of the received signal is measured by the error rate measuring circuit 109, and then the measured result is stored in ERROR2 as the error rate in the present reception.

Then, in step S405, the error rate ERROR2 in the present reception is compared with the reference value REF2. If the error rate ERROR2 in the present reception exceeds the reference value REF2, the process goes to step S406 wherein START0 is set as the AGC threshold (START) in the succeeding reception. Then, the process goes to step S410 wherein a value of the error rate ERROR2 in the present reception is stored in ERROR1 to prepare for the succeeding reception. In contrast, if the error rate ERROR2 in the present reception does not exceed the reference value REF2, the process goes to step S407.

In step S407, the error rate ERROR2 in the present reception is compared with the error rate ERROR1 in the preceding reception. If the error rate ERROR2 in the present reception is smaller than the error rate ERROR1 in the preceding reception and thus the error rate of the received signal is improved, it is decided that the error rate of the received signal can be improved by the AGC threshold control. Thus, in order to change the AGC threshold in the succeeding reception in the same direction as that in the preceding reception, the polarity of the change control amount d is not changed. In contrast, if the error rate ERROR2 in the present reception is larger than the error rate ERROR1 in the preceding reception and thus the error rate of the received signal is degraded, it is decided that the error rate of the received signal is deteriorated by the AGC threshold control. Then, the process goes step S408 wherein the polarity of the change control amount d is inverted such that the AGC threshold in the succeeding reception can be changed in the opposite direction to that in the preceding reception.

Finally, in step S409, in order to prepare for the succeeding reception, the error rate ERROR2 in the present reception is stored in ERROR1, and also a value obtained by adding the change control amount d to the set value START in the present reception is stored in START as the AGC threshold in the succeeding reception. In addition, when the power supply of the radio receiver is turned ON, the receiving operation is still carried out by repeating above steps S403 to S409.

As described above, in the threshold setting method according to the fourth example, before the threshold of electric field intensity level which starts AGC operation is set by deciding appropriately the change direction of the threshold of electric field intensity level which starts AGC operation to be set subsequently, the AGC threshold is returned to the predetermined initial value when the error rate exceeds the predetermined value. Therefore, the more appropriate threshold can be set under the environment of the strong electric field IM or the environment in which the electric field is changed strongly, and also the appropriate countermeasure can be taken when the setting of the threshold is largely out of the range.

FIFTH EXAMPLE

Figure 7:
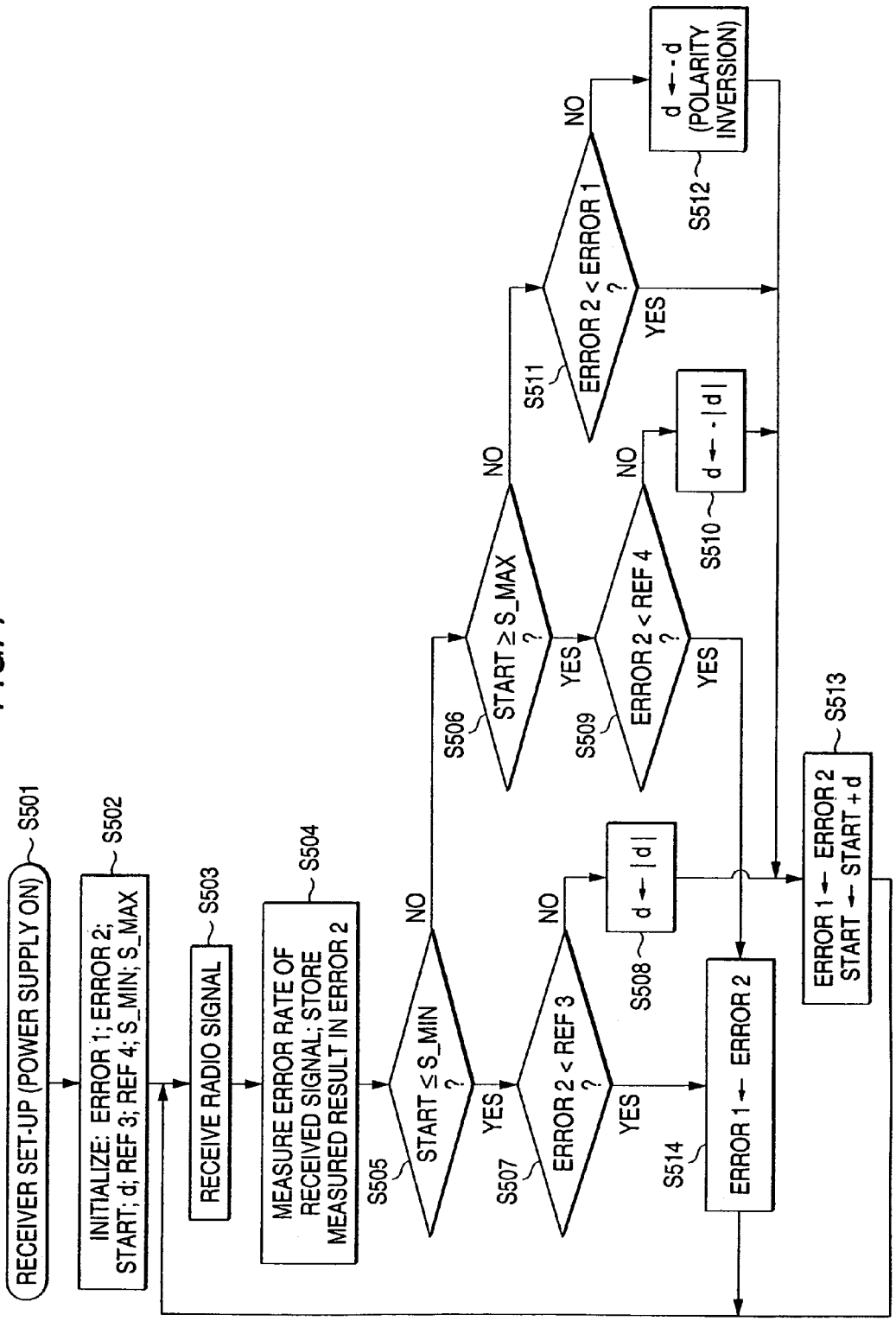
FIG. 7 is a flowchart showing an AGC threshold setting method (fifth example) in the radio receiver according to the first embodiment.

FIG. 7 shows a flowchart of an AGC threshold setting method (fifth example) in the radio receiver according to the first embodiment. In the threshold setting method according to the fifth example, an available set range of the threshold of electric field intensity level which starts AGC operation, that is defined by a maximum value and a minimum value, is set. Then, if the threshold of electric field intensity level which starts AGC operation is less than the minimum value of the available set range or more than the maximum value thereof, the setting of the threshold of electric field intensity level which starts AGC operation is not changed when the error rate in the present reception is below the predetermined value. In contrast, if the threshold of electric field intensity level which starts AGC operation is in the available set range, the decision of the change direction of the threshold of electric field intensity level which starts AGC operation is made, like the first example. In this case, the change amount of the threshold of electric field intensity level which starts AGC operation is set constant.

Then, the variables used in FIG. 7 (parameters stored in the memory 108) will be explained. Like the first example, ERROR1, ERROR2, START and d are the error rate in the preceding reception, the error rate in the present reception, the set value of the threshold of electric field intensity level which starts AGC operation, and the change control amount respectively. Also, S#MIN, S#MAX are the minimum set value and the maximum set value of the threshold of electric field intensity level which starts AGC operation respectively, and setting of the maximum value and the minimum value of the AGC threshold is controlled to move within the range from S#MIN to S#MAX. Also, REF3 is a reference value that is compared with the error rate ERROR2 in the present reception when the AGC threshold is set below the minimum set value S#MIN. When the AGC threshold is set below the minimum set value S#MIN and also the error rate ERROR2 in the present reception is less than the reference value REF3, the setting of the threshold of electric field intensity level which starts AGC operation is not changed. In addition, REF4 is a reference value that is compared with the error rate ERROR2 in the present reception when the AGC threshold is set over the maximum set value S#MAX. When the AGC threshold is set over the maximum set value S#MAX and also the error rate ERROR2 in the present reception is less than the reference value REF4, the setting of the AGC threshold is not changed.

First, when the initial set-up is carried out by turning ON the power supply of the radio receiver in step S501, parameters ERROR1, ERROR2, START, d, REF3, REF4, S#MIN and S#MAX are set to predetermined initial values in step S502. These steps S501, S502 are the initial setting process in the set-up operation. Steps S503 to S514 described later are processes that set the threshold of electric field intensity level which starts AGC operation by deciding appropriately the change direction of the AGC threshold to be set subsequently, and are carried out per a single reception or per several receptions after the reception has been conducted by the predetermined number of times.

In step S503, the radio signal is received by setting the threshold of electric field intensity level which starts AGC operation to START. In step S504, the error rate of the received signal is measured by the error rate measuring circuit 109, and then the measured result is stored in ERROR2 as the error rate in the present reception.

Then, in step S505, it is decided whether or not the setting of the AGC threshold (START) in the present reception is less than the minimum set value S#MIN. If the setting of the AGC threshold (START) exceeds the minimum set value S#MIN, the process goes to step S506. In contrast, if the setting of the AGC threshold (START) is less than the minimum set value S#MIN, the process goes to step S507. In step S507, the error rate ERROR2 in the present reception is compared with the reference value REF3. If the error rate ERROR2 in the present reception exceeds the reference value REF3, the process goes to step S508. Then, a sign of the change control amount d is set positively such that the AGC threshold in the succeeding reception is increased by one step, and then the process goes to step S513. In contrast, if the error rate ERROR2 in the present reception is less than the reference value REF3, the setting of the AGC threshold is not changed. Then, the process goes to step S514 wherein a value of the error rate ERROR2 in the present reception is stored in ERROR1 to prepare for the succeeding reception.

In contrast, if the setting of the AGC threshold (START) exceeds the minimum set value S#MIN, the process goes to step S506. In this case, in step S506, it is decided whether or not the setting of the AGC threshold (START) in the present reception is in excess of the maximum set value S#MAX. If the setting of the AGC threshold (START) is less than the maximum set value S#MAX, the process goes to step S511. In contrast, if the setting of the AGC threshold (START) exceeds the maximum set value S#MAX, the process goes to step S509. In step S509, the error rate ERROR2 in the present reception is compared with the reference value REF4. If the error rate ERROR2 in the present reception exceeds the reference value REF4, the process goes to step S510. Then, a sign of the change control amount d is set negatively such that the AGC threshold in the succeeding reception is decreased by one step, and then the process goes to step S513. Also, if the error rate ERROR2 in the present reception is less than the reference value REF4, the setting of the AGC threshold is not changed and then the process goes to step S514. Then, a value of the error rate ERROR2 in the present reception is stored in ERROR1 to prepare for the succeeding reception.

In contrast, if the setting of the AGC threshold (START) is less than the maximum set value S#MAX, the process goes to step S511. In step S511, the error rate ERROR2 in the present reception is compared with the error rate ERROR1 in the preceding reception. If the error rate ERROR2 in the present reception is smaller than the error rate ERROR1 in the preceding reception and thus the error rate of the received signal is improved, it is decided that the error rate of the received signal can be improved by the AGC threshold control. Thus, in order to change the AGC threshold in the succeeding reception in the same direction as that in the preceding reception, the polarity of the change control amount d is not changed. In contrast, if the error rate ERROR2 in the present reception is larger than the error rate ERROR1 in the preceding reception and thus the error rate of the received signal is degraded, it is decided that the error rate of the received signal is deteriorated by the AGC threshold control. Then, the process goes step S512 wherein the polarity of the change control amount d is inverted such that the AGC threshold in the succeeding reception can be changed in the opposite direction to that in the preceding reception.

Finally, in step S513, in order to prepare for the succeeding reception, the error rate ERROR2 in the present reception is stored in ERROR1, and also a value obtained by adding the change control amount d to the set value START in the present reception is stored in START as the AGC threshold in the succeeding reception. In addition, when the power supply of the radio receiver is turned ON, the receiving operation is still carried out by repeating above steps S503 to S514.

As described above, in the threshold setting method according to the fifth example, the available set range that is defined by the maximum value and the minimum value of the threshold of electric field intensity level which starts AGC operation is set. Then, if the AGC threshold is less than the minimum value of the available set range or more than the maximum value thereof, the setting of the AGC threshold is not changed when the error rate in the present reception is below the predetermined value. In contrast, if the AGC threshold is positioned in the available set range, the AGC threshold is set by deciding appropriately the change direction of the AGC threshold to be set subsequently. Therefore, the optimum AGC threshold can be set under the environment of the strong electric field IM or the environment in which the electric field is changed strongly, and also it is possible to prevent the situation that, in the case that the set value of the AGC threshold is set to the maximum value or the minimum value, the set value of the AGC threshold is unnecessarily changed when the error rate is sufficiently small.

As described above, according to the radio receiver and the radio receiving method according to the first embodiment, since the AGC threshold is set according to the measured result of the error rate of the received signal by the error rate measuring circuit 109, the optimum AGC threshold can be set to meet the radio wave situation in which the radio receiver, i.e., the receiving situation of the received signal and also the gain control of the gain controlling means can be achieved to optimize the signal quality of the received signal in the situation of either the IM characteristic or the electric field variation characteristic, e.g., under the environment of the strong electric field IM or the environment in which the electric field is changed strongly. As a result, the communication quality in the mobile radio communication can be considerably improved.

Second Embodiment

Figure 8:
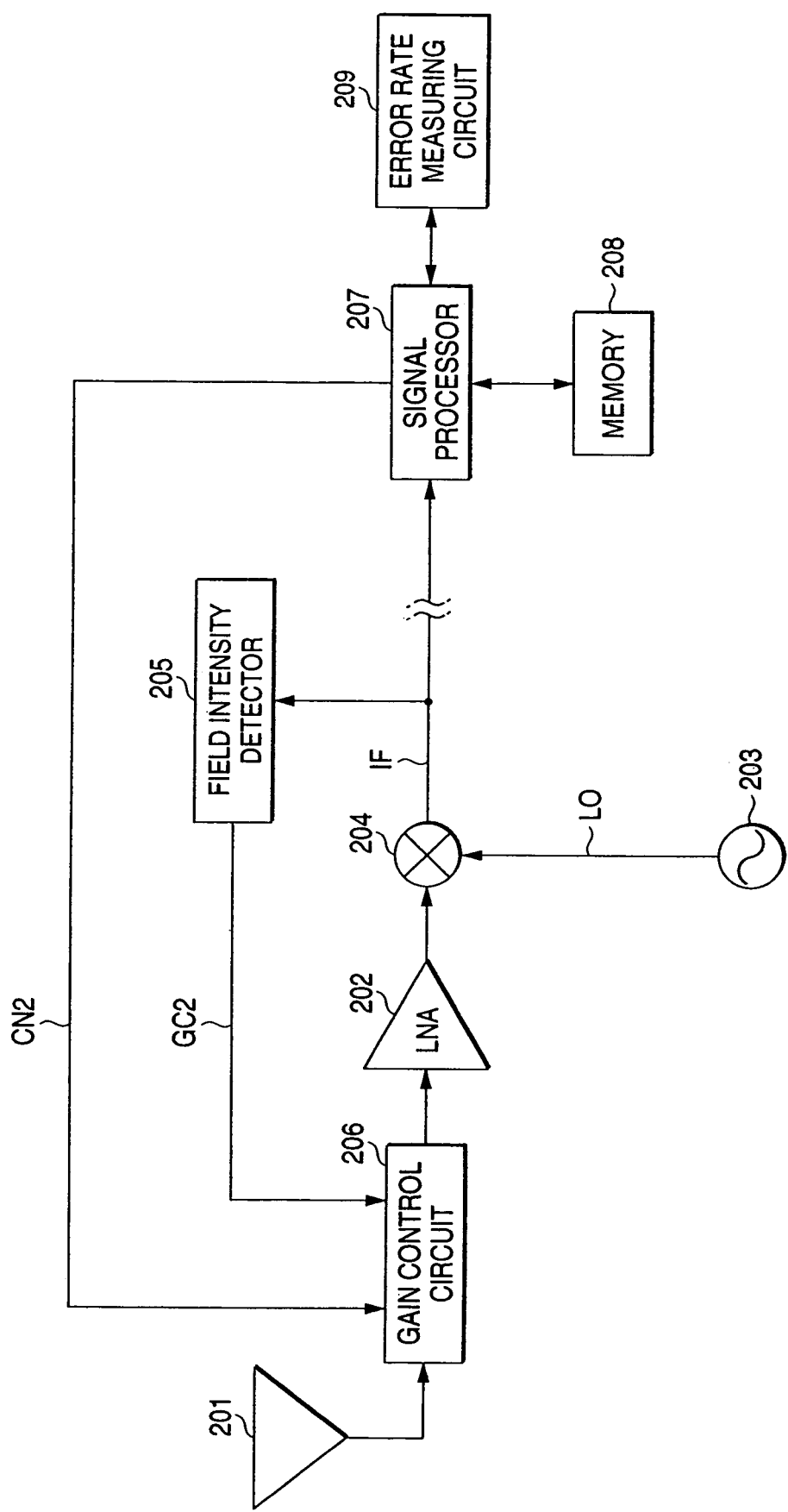
FIG. 8 is a view showing a configuration of a radio receiver according to a second embodiment of the present invention.

Next, FIG. 8 is a view showing a configuration of a radio receiver according to a second embodiment of the present invention.

In FIG. 8, the radio receiver according to the second embodiment is constructed to include an antenna 201, a low-noise signal amplifier (LNA) 202, a local oscillator circuit (Local) 203, a frequency converter circuit (Mix) 204, a field intensity detector 205, a gain control circuit 206, a signal processor portion 207, a memory 208, and an error rate measuring circuit 209.

The antenna 201 receives the signal transmitted from the base station (not shown). The low-noise signal amplifier 202 amplifies the signal received via the antenna 201. The frequency converter circuit 204 executes the frequency conversion by multiplying the signal amplified by the low-noise signal amplifier 202 by the signal from the local oscillator circuit 203.

The field intensity detector 205 changes a voltage of an output signal GC2 in response to an intensity of the received signal whose frequency is converted into the intermediate frequency (IF) by the frequency converter circuit 204. The gain control circuit 206 changes the gain control amount in response to the output signal GC2 from the field intensity detector 205 and a control parameter (signal CN2) from the signal processor portion 207.

The memory 208 corresponds to a storing means. In this memory 208, the error rate measured result in the preceding reception, the set value of the gain control amount in the preceding reception, other parameters used in the process to set the gain control amount in the succeeding reception, and the gain control amount set by the process in the succeeding reception, etc. are stored.

The signal processor portion 207 corresponds to a gain control amount setting means and a second controlling means. This signal processor portion 207 demodulates the received signal, sets the AGC gain control amount in the succeeding reception based on data of the error rate of the received signal and the set values in the AGC by comparing the data in the present reception with the data stored in the memory 208 in the preceding reception, and controls the gain control circuit 206 by supplying the control parameter (signal CN2). Also, the signal processor portion 207 updates the error rate measured result stored in the memory 208 in the preceding reception by the error rate measured result in the present reception, updates the set value of the gain control amount in the preceding reception by the gain control amount set in the present reception, and updates the gain control amount set in the succeeding reception by the gain control amount set by the signal processor portion 207 in the present reception.

As described above, the AGC gain control amount to be set in the present reception is decided by the process in the signal processor portion 207 in the preceding reception and is stored in the memory 208. The signal processor portion 207 controls the setting of the gain control circuit 206 by outputting the control signal CN2 in response to the stored AGC threshold by looking up the memory 208.

Figure 9:
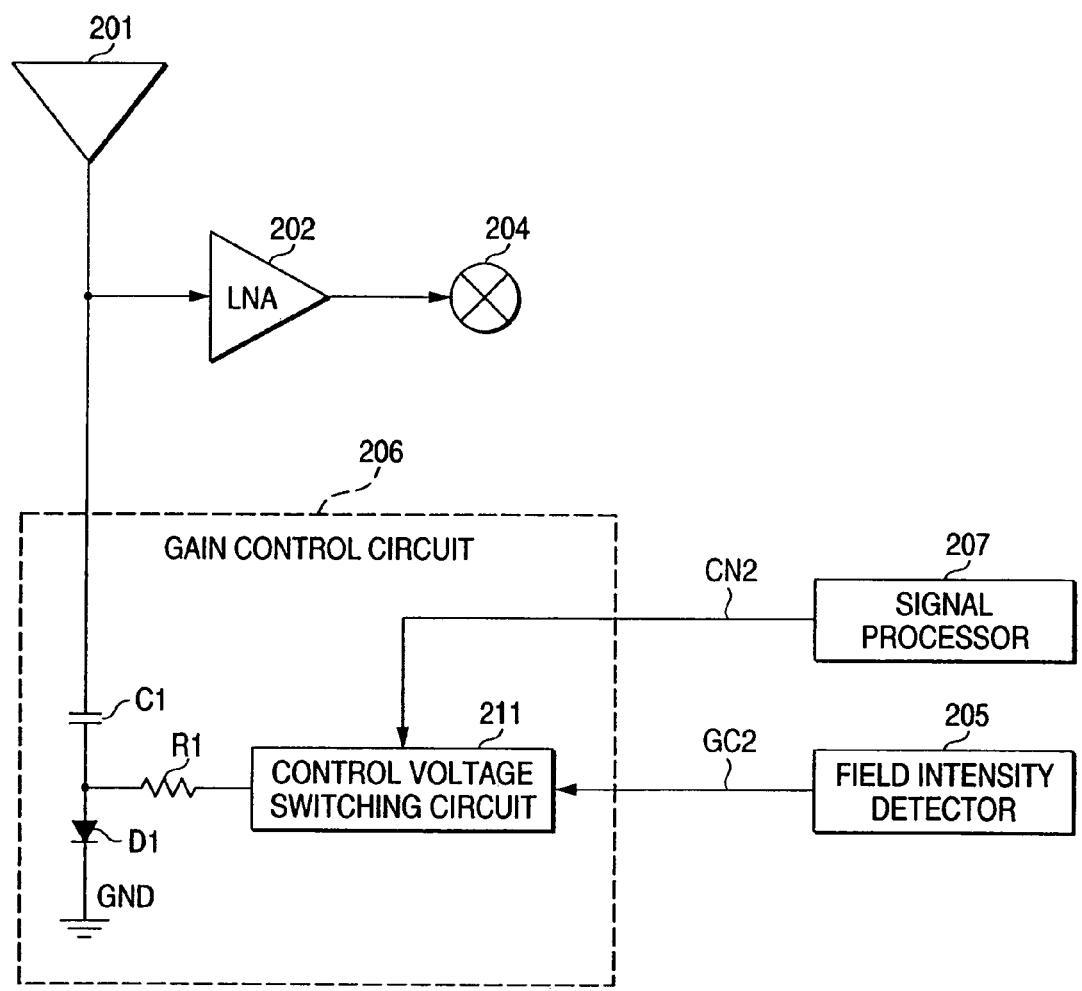
FIG. 9 is a view showing a particular configuration of a gain control circuit in the radio receiver according to the second embodiment.

Then, a particular configuration for changing the setting of the gain control amount in the gain control circuit 206 based on the output signal GC1 from the field intensity detector 205 and the control signal CN2 from the signal processor portion 207 will be explained with reference to FIG. 9 hereunder. FIG. 9 shows a particular configuration of the gain control circuit 206 in the radio receiver according to the second embodiment. In FIG. 9, the gain control circuit 206 is constructed to include a current limiting resistor R1, a capacitor C1, a diode D1, and a controlled voltage switching circuit 211.

The capacitor C1 acts as a coupling capacitor to cut off a DC component of the received signal and also acts to adjust the gain control amount. Normally a PIN diode or a band switching diode is used as the diode D1, and has such a characteristic that the impedance between the anode and the cathode of the diode D1 is reduced in accordance with the current flowing through the diode D1.

The current limiting resistor R1 is provided to prevent the excessive current from flowing through the diode D1. The controlled voltage switching circuit 211 outputs an output voltage that is set by the control signal CN2 from the signal processor portion 207 if a signal level of the output signal GC2 supplied from the field intensity detector 205 exceeds a certain constant value.

The field intensity detector 205 outputs the signal GC2 to the controlled voltage switching circuit 211 to turn ON the AGC operation when the intermediate frequency (IF) signal whose level exceeds a predetermined value is input. The output voltage of the gain control circuit 206 is switched by the control signal CN2 supplied from the signal processor portion 207. Since the current value flowing through the diode D1 is changed by switching the output voltage, the impedance between the anode and the cathode can be changed and thus the gain control amount can be changed. In this manner, in the gain control circuit 206 in FIG. 9, it is possible to control the AGC gain control amount by the control signal CN2 in response to the error rate measured result supplied from the signal processor portion 207.

As the particular example of the configuration to change the setting of the gain control amount, followings may be considered other than the above first particular configuration in FIG. 9.

For example, as a second particular configuration, such a configuration may be considered that an output voltage switching circuit whose output voltage can be switched is provided to the low-noise signal amplifier (LNA) 202 and then the gain control amount is changed by switching/setting the output voltage of the output voltage switching circuit in the low-noise signal amplifier 202 based on the control signal in response to the error rate measured result from the signal processor portion 207.

Also, as a third particular configuration, such a configuration may be considered that a current source with a current switching function is provided to the low-noise signal amplifier (LNA) 202 and then the gain control amount is changed by switching/setting the current value of the current source with the current switching function in the low-noise signal amplifier 202 based on the control signal in response to the error rate measured result from the signal processor portion 207.

The error rate measuring circuit 209 corresponds to an error rate measuring means. For example, this error rate measuring circuit 209 is composed of the BCH code correction circuit, and calculates the error rate of the signal based on the error correction number and the error uncorrection number of the demodulated signal. The measuring principle of the error rate measuring circuit 209 is similar to the contents explained in the first embodiment.

Then, examples of the radio receiving method in the radio receiver according to the second embodiment having the above configuration (AGC gain control amount setting method utilizing the measured result of the received signal obtained by the error rate measuring circuit 109) will be explained in detail with reference to the drawings in the order of (First Example), (Second Example), (Third Example), (Fourth Example), and (Fifth Example) hereunder. In the following explanation, assume that the gain control amount is also set small if the set value of the gain control amount is small whereas the gain control amount is also set large if the set value of the gain control amount is large.

FIRST EXAMPLE

Figure 10:
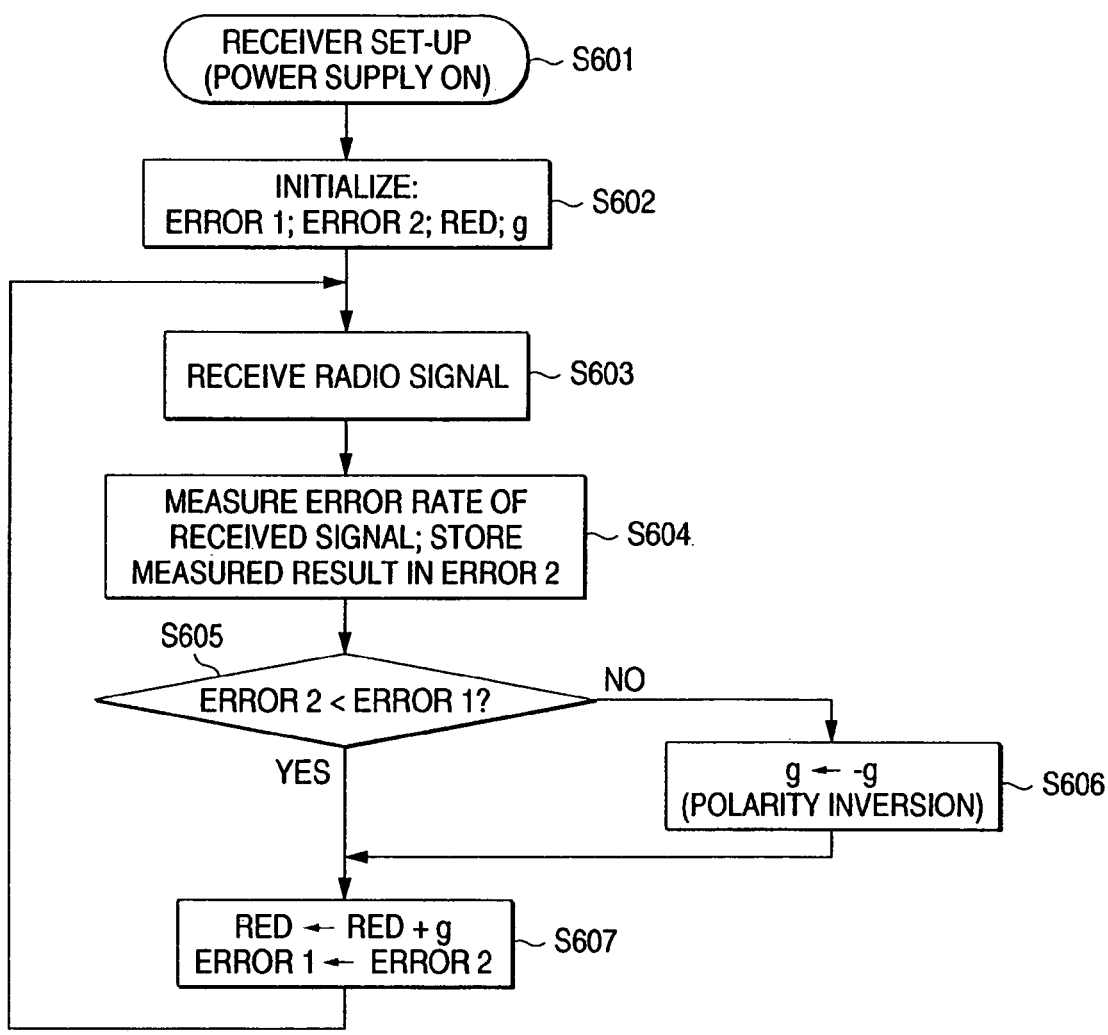
FIG. 10 is a flowchart showing an AGC gain control amount setting method (first example) in the radio receiver according to the second embodiment.

FIG. 10 shows a flowchart of an AGC gain control amount setting method (first example) in the radio receiver according to the second embodiment. In the gain control amount setting method of the first example, if the error rate in the present reception is smaller than that in the preceding reception, the changing direction of the gain control amount in the succeeding reception is kept in the same direction as that in the preceding reception since the error rate could be improved while, if the error rate in the present reception is larger than that in the preceding reception, the changing direction of the gain control amount in the succeeding reception is switched in the direction opposite to that in the preceding reception since the error rate has been degraded. In this case, a change amount of the gain control amount is set constant.

Then, the variables used in FIG. 10 (parameters stored in the memory 208) will be explained. ERROR1 is the error rate measured result of the received signal in the preceding reception, and an initial value described later is set at the time of initial set-up of the radio receiver. ERROR2 is the error rate measured result of the received signal in the present reception. RED is the set value of the AGC gain control amount, and d is a change control amount to change the AGC gain control amount.

First, when the initial set-up is carried out by turning ON the power supply of the radio receiver in step S601, parameters ERROR1, ERROR2, RED, and g are set to predetermined initial values in step S602. These step S601, S602 are the initial setting process in the set-up operation. Steps S603 to S607 described later are processes that set the gain control amount by deciding appropriately the change direction of the gain control amount to be set subsequently, and are carried out per a single reception or per several receptions after the reception has been conducted by the predetermined number of times.

In step S603, the radio signal is received by setting the gain control amount to RED. In step S604, the error rate of the received signal is measured by the error rate measuring circuit 209, and then the measured result is stored in ERROR2 as the error rate in the present reception.

Then, in step S605, the error rate ERROR1 in the preceding reception is compared with the error rate ERROR2 in the present reception. If the error rate of the received signal can be improved because the error rate ERROR2 in the present reception is smaller than the error rate ERROR1 in the preceding reception, it is decided that the error rate of the received signal could be improved by controlling the AGC gain control amount. Thus, in order to keep the change in the AGC gain control amount in the succeeding reception in the same direction as that in the preceding reception, the polarity of the change control amount g is not changed. In contrast, if the error rate of the received signal is degraded because the error rate ERROR2 in the present reception is larger than the error rate ERROR1 in the preceding reception, it is decided that the error rate of the received signal has degraded by controlling the AGC threshold. Thus, the process goes to step S606. In order to change the AGC gain control amount in the succeeding reception in the opposite direction to that in the preceding reception, the polarity of the change control amount g is inverted.

Finally, in step S607, the error rate ERROR2 in the present reception is stored in ERROR1 to prepare for the succeeding reception, and a value obtained by adding the change control amount g to the set value RED in the present reception is stored as the AGC gain control amount in the succeeding reception. In addition, when the power supply of the radio receiver is turned ON, the receiving operation is still carried out by repeating above steps S603 to S607.

As described above, in the gain control amount setting method according to the first example, since the gain control amount can be set by deciding appropriately the change direction of the gain control amount to be set subsequently, the setting of the optimum gain control amount can be achieved under the environment of the strong electric field IM or the environment in which the electric field is changed strongly.

SECOND EXAMPLE

Figure 11:
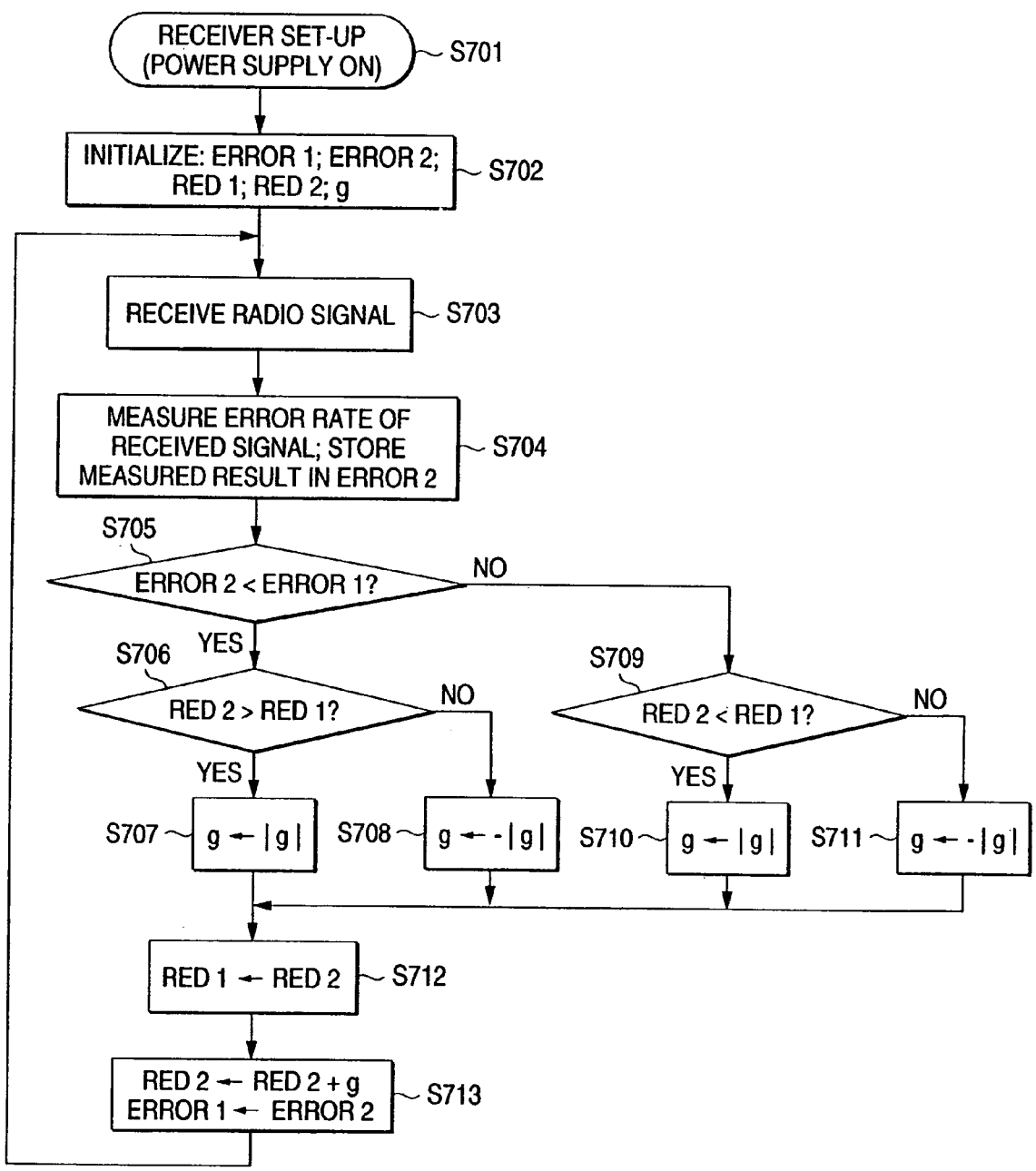
FIG. 11 is a flowchart showing an AGC gain control amount setting method (second example) in the radio receiver according to the second embodiment.

FIG. 11 shows a flowchart of an AGC gain control amount setting method (second example) in the radio receiver according to the second embodiment. In the gain control amount setting method according to the second example, the AGC gain control amount in the succeeding reception is set based on the error rate measured results of the received signal in the preceding reception and the present reception, like the first example. In addition, the controlled direction of the AGC gain control amount can be decided more appropriately by storing the AGC threshold and then comparing the AGC gain control amount in the preceding reception with the AGC gain control amount in the present reception, and thus such decision can be actively used in setting the AGC gain control amount in the succeeding reception. In this case, a change amount of the gain control amount is set constant.

Then, the variables used in FIG. 11 (parameters stored in the memory 208) will be explained. Like the first example, ERROR1, ERROR2, and g are the error rate in the preceding reception, the error rate in the present reception, and the change control amount respectively. RED1 is the set value of the AGC gain control amount in the preceding reception, and RED2 is the set value of the AGC gain control amount in the present reception.

First, when the initial set-up is carried out by turning ON the power supply of the radio receiver in step S701, parameters ERROR1, ERROR2, RED1, RED2, and g are set to predetermined initial values in step S702. These steps S701, S702 are the initial setting process in the set-up operation. Steps S703 to S713 described later are processes that set the gain control amount by deciding appropriately the change direction of the gain control amount to be set subsequently, and are carried out per a single reception or per several receptions after the reception has been conducted by the predetermined number of times.

In step S703, the radio signal is received by setting the gain control amount to RED2. In step S704, the error rate of the received signal is measured by the error rate measuring circuit 209, and then the measured result is stored in ERROR2 as the error rate in the present reception.

In step S705, the error rate ERROR2 in the present reception is compared with the error rate ERROR1 in the preceding reception to decide whether or not the error rate ERROR2 in the present reception is smaller than the error rate ERROR1 in the preceding reception to thus improve the error rate of the received signal. In steps S706, S709, in order to detect to which direction the AGC gain control amount is changed to generate the change in the error rate, the AGC gain control amount RED2 in the present reception is compared with the AGC gain control amount RED1 in the preceding reception.

In step S705, if it is decided that the error rate of the received signal is improved, the process goes step S706. In step S706, if the gain control amount RED2 in the present reception is larger than the gain control amount RED1 in the preceding reception, the process goes step S707. Then, a sign of the change control amount g is set positively such that the AGC gain control amount in the succeeding reception can be increased larger than the gain control amount RED2 in the present reception. In contrast, in step S706, if the gain control amount RED2 in the present reception is smaller than the gain control amount RED1 in the preceding reception, the process goes step S708. Then, a sign of the change control amount g is set negatively such that the AGC gain control amount in the succeeding reception can be reduced smaller than the gain control amount RED2 in the present reception.

In contrast, in step S705, if it is decided that the error rate of the received signal is degraded, the process goes step S709. In step S709, if the gain control amount RED2 in the present reception is smaller than the gain control amount RED1 in the preceding reception, the process goes step S710. Then, a sign of the change control amount g is set positively such that the AGC gain control amount in the succeeding reception can be increased larger than the gain control amount RED2 in the present reception. In contrast, in step S709, if the gain control amount RED2 in the present reception is larger than the gain control amount RED1 in the preceding reception, the process goes step S711. Then, a sign of the change control amount g is set negatively such that the AGC gain control amount in the succeeding reception can be reduced smaller than the gain control amount RED2 in the present reception.

Finally, in order to prepare for the succeeding reception, in step S712, the gain control amount RED2 in the present reception is stored in RED1. Also, in step S713, the error rate ERROR2 in the present reception is stored in ERROR1 and also a value obtained by adding the change control amount g to the set value RED2 in the present reception is stored in RED2 as the AGC gain control amount in the succeeding reception. In addition, when the power supply of the radio receiver is turned ON, the receiving operation is still carried out by repeating above steps S703 to S713.

As described above, in the gain control amount setting method according to the second example, the gain control amount can be increased/decreased in the same direction as that in the preceding reception if the error rate of the received signal is improved, and conversely the gain control amount can be increased/decreased in the opposite direction to that in the preceding reception if the error rate of the received signal is degraded. Therefore, since the gain control amount can be set by deciding more properly the change direction of the gain control amount to be set subsequently, the more appropriate gain control amount can be set under the environment of the strong electric field IM or the environment in which the electric field is changed strongly.

THIRD EXAMPLE

Figure 12:
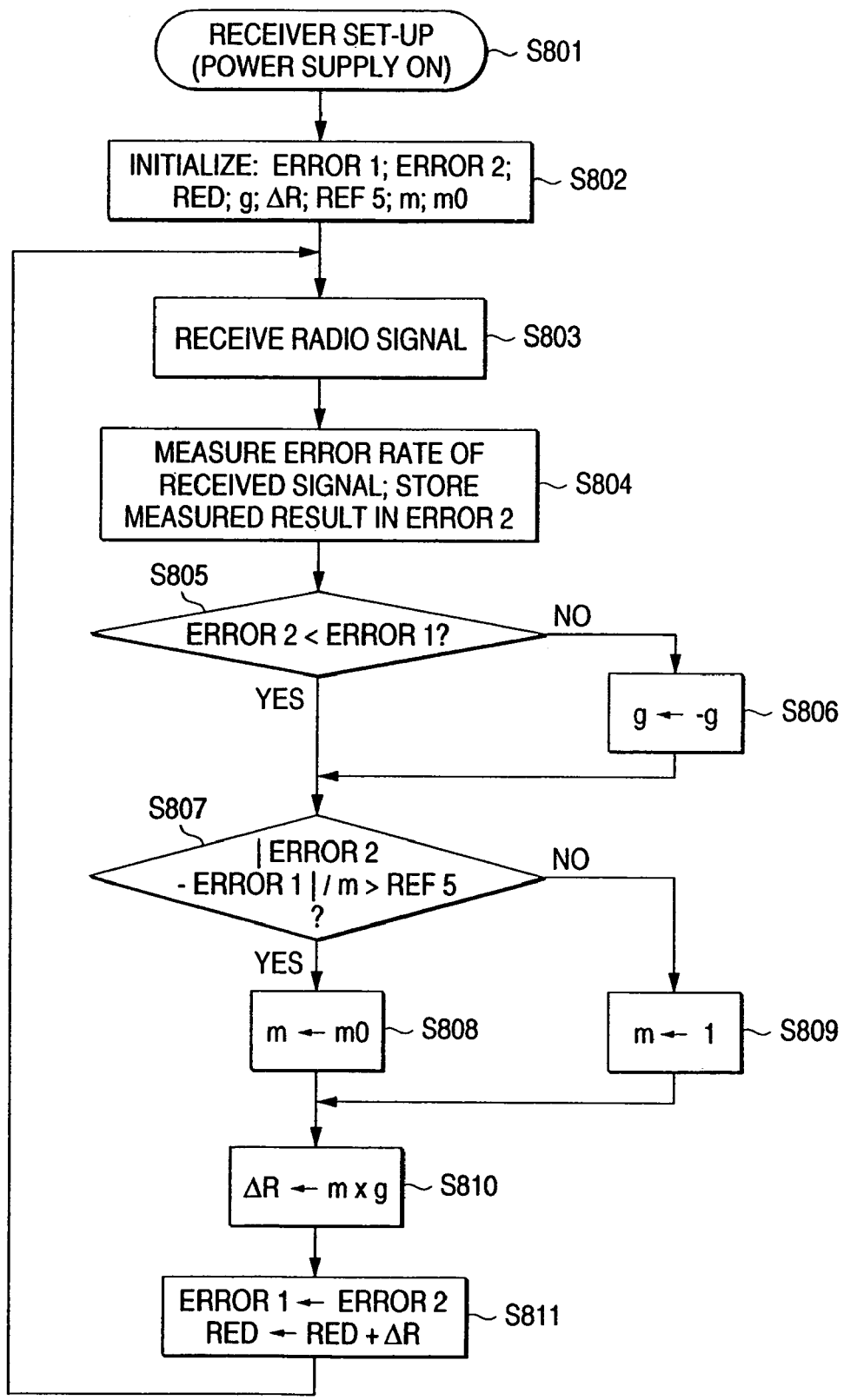
FIG. 12 is a flowchart showing an AGC gain control amount setting method (third example) in the radio receiver according to the second embodiment.

FIG. 12 shows a flowchart of an AGC gain control amount setting method (third example) in the radio receiver according to the second embodiment. In the gain control amount setting method according to the third example, in addition to the above decision of the change direction of the gain control amount like the first example, a change amount of the gain control amount can be changed according to an error rate change amount such that, if the error rate change amount is smaller than a predetermined value, the change amount of the gain control amount is kept at a constant value as it is while, if the error rate change amount is larger than the predetermined value, the change amount of the gain control amount is changed into a predetermined value.

Then, the variables used in FIG. 12 (parameters stored in the memory 208) will be explained. Like the first example, ERROR1, ERROR2, RED and g are the error rate in the preceding reception, the error rate in the present reception, the set value of the gain control amount, and the change control amount respectively. Also, REF5 is a reference value of the error rate change amount of the received signal per one control step (change control amount g) of the AGC gain control amount. If a value obtained by dividing an absolute value of difference between ERROR1 and ERROR2 by a change amount control parameter m described later exceeds REF5, such change amount control parameter m, i.e., a change amount of the AGC gain control amount in the succeeding reception is changed. Also, m0 is a value that is set as the change amount control parameter m when the error rate change amount of the received signal per one control step (change control amount d) of the AGC gain control amount exceeds REF5. Also, $\Delta R$ is a change amount of the AGC gain control amount, and a value that is m times the change control amount g is set as $\Delta R$.

First, when the initial set-up is carried out by turning ON the power supply of the radio receiver in step S801, parameters ERROR1, ERROR2, RED, g, $\Delta R$, REF5, m and m0 are set to predetermined initial values in step S802. These steps S801, S802 are the initial setting process in the set-up operation. Steps S803 to S811 described later are processes that set the gain control amount by deciding appropriately the change direction of the gain control amount to be set subsequently and deciding the change amount, and are carried out per a single reception or per several receptions after the reception has been conducted by the predetermined number of times.

In step S803, the radio signal is received by setting the gain control amount to RED. In step S804, the error rate of the received signal is measured by the error rate measuring circuit 209, and then the measured result is stored in ERROR2 as the error rate in the present reception.

Then, in step S805, the error rate ERROR2 in the present reception is compared with the error rate ERROR1 in the preceding reception. If the error rate ERROR2 in the present reception is smaller than the error rate ERROR1 in the preceding reception and thus the error rate of the received signal is improved, it is decided that the error rate of the received signal can be improved by the AGC gain control amount control. Thus, in order to change the AGC gain control amount in the succeeding reception in the same direction as that in the preceding reception, the polarity of the change control amount g is not changed. In contrast, if the error rate ERROR2 in the present reception is larger than the error rate ERROR1 in the preceding reception and thus the error rate of the received signal is degraded, it is decided that the error rate of the received signal is deteriorated by the AGC gain control amount control. Then, the process goes step S806 wherein the polarity of the change control amount g is inverted such that the AGC gain control amount in the succeeding reception can be changed in the opposite direction to that in the preceding reception.

Then, in step S807, a value obtained by dividing an absolute value of difference between the error rate ERROR1 in the preceding reception and the error rate ERROR2 in the present reception by the change amount control parameter m is compared with the reference value REF5. If such value obtained by dividing the absolute value of difference between ERROR1 and ERROR2 by the change amount control parameter m exceeds REF5, the process goes to step S808 wherein m0 is set as the change amount control parameter m. In contrast, if the value obtained by dividing the absolute value of difference between ERROR1 and ERROR2 by the change amount control parameter m is less than REF5, the process goes to step S809 wherein "1" is set as the change amount control parameter m.

Then, in step S810, a value that is m times the change control amount g is set as the change amount ΔR of the AGC gain control amount. Finally, in step S811, in order to prepare for the succeeding reception, the error rate ERROR2 in the present reception is stored in ERROR1, and also a value obtained by adding the change amount ΔR to the set value RED in the present reception is stored in RED as the AGC gain control amount in the succeeding reception. In addition, when the power supply of the radio receiver is turned ON, the receiving operation is still carried out by repeating above steps S803 to S811.

As described above, in the gain control amount setting method according to the third example, the gain control amount can be set by deciding appropriately the change direction of the gain control amount to be set subsequently, and a change amount of the gain control amount can be changed according to the error rate change amount. Therefore, the more appropriate gain control amount can be set under the environment of the strong electric field IM or the environment in which the electric field is changed strongly.

FOURTH EXAMPLE

Figure 13:
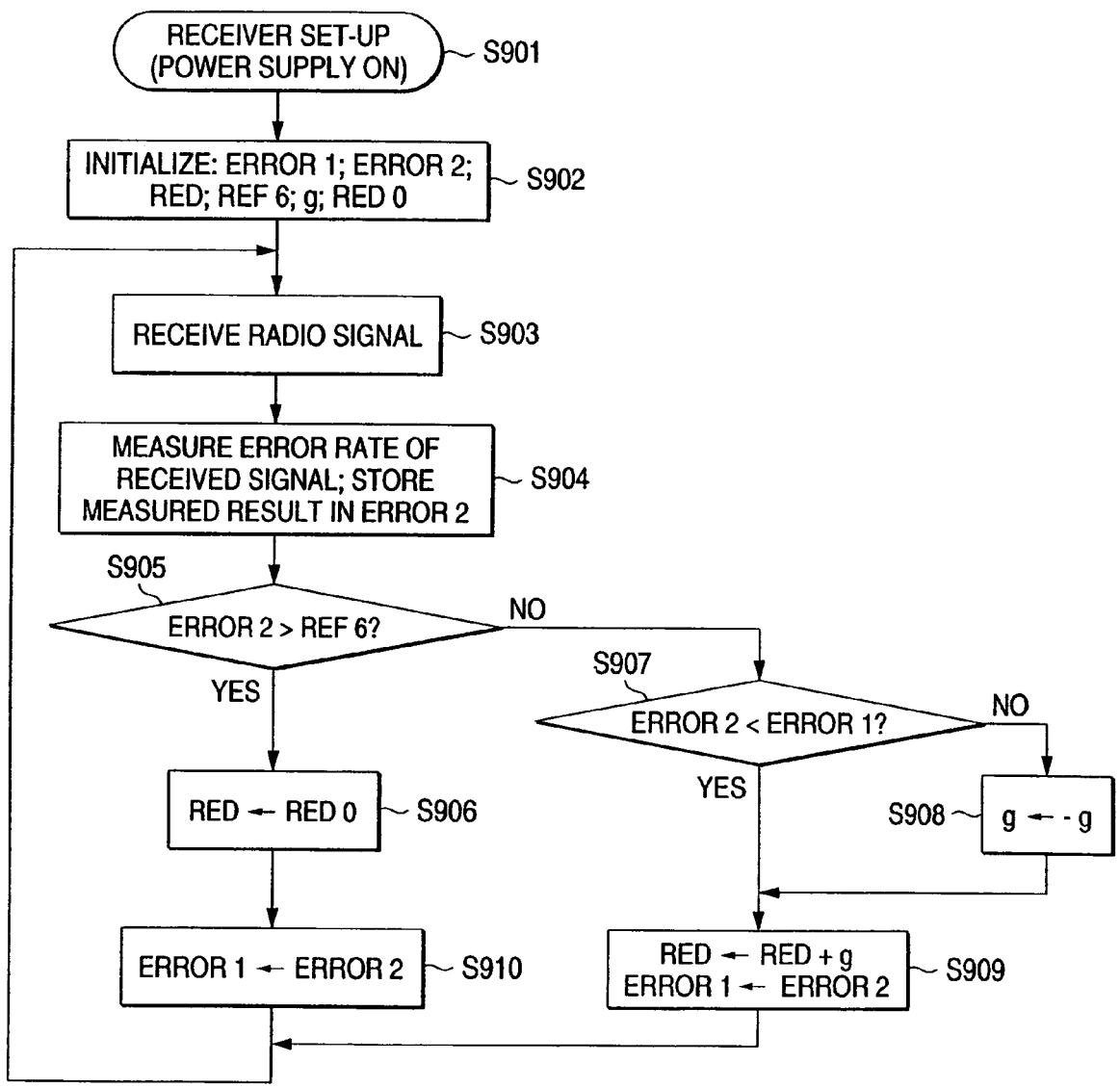
FIG. 13 is a flowchart showing an AGC gain control amount setting method (fourth example) in the radio receiver according to the second embodiment.

FIG. 13 shows a flowchart of an AGC gain control amount setting method (fourth example) in the radio receiver according to the second embodiment. In the gain control amount setting method according to the fourth example, before the above decision of the change direction of the gain control amount like the first example, the AGC gain control amount is returned to a predetermined initial value when the error rate exceeds a predetermined value. In this case, the change amount of the gain control amount is set constant.

Then, the variables used in FIG. 13 (parameters stored in the memory 208) will be explained. Like the first example, ERROR1, ERROR2, RED and g are the error rate in the preceding reception, the error rate in the present reception, the set value of the gain control amount, and the change control amount respectively. Also, REF6 is a reference value that is compared with the error rate ERROR2 in the present reception. In addition, RED0 is a predetermined set value of the AGC gain control amount. When the error rate ERROR2 in the present reception exceeds the reference value REF6, the AGC gain control amount (RED) is set to the predetermined set value RED0.

First, when the initial set-up is carried out by turning ON the power supply of the radio receiver in step S901, parameters ERROR1, ERROR2, RED, g, REF6 and REDO are set to predetermined initial values in step S902. These steps S901, S902 are the initial setting process in the set-up operation. Steps S903 to S909 described later are processes that set the gain control amount by deciding appropriately the change direction of the gain control amount to be set subsequently, and are carried out per a single reception or per several receptions after the reception has been conducted by the predetermined number of times.

In step S903, the radio signal is received by setting the gain control amount to RED. In step S904, the error rate of the received signal is measured by the error rate measuring circuit 209, and then the measured result is stored in ERROR2 as the error rate in the present reception.

Then, in step S905, the error rate ERROR2 in the present reception is compared with the reference value REF6. If the error rate ERROR2 in the present reception exceeds the reference value REF6, the process goes to step S906 wherein RED0 is set as the AGC gain control amount (RED) in the succeeding reception. Then, the process goes to step S910 wherein a value of the error rate ERROR2 in the present reception is stored in ERROR1 to prepare for the succeeding reception. In contrast, if the error rate ERROR2 in the present reception does not exceed the reference value REF6, the process goes to step S907.

In step S907, the error rate ERROR2 in the present reception is compared with the error rate ERROR1 in the preceding reception. If the error rate ERROR2 in the present reception is smaller than the error rate ERROR1 in the preceding reception and thus the error rate of the received signal is improved, it is decided that the error rate of the received signal can be improved by the AGC gain control amount control. Thus, in order to change the AGC gain control amount in the succeeding reception in the same direction as that in the preceding reception, the polarity of the change control amount g is not changed. In contrast, if the error rate ERROR2 in the present reception is larger than the error rate ERROR1 in the preceding reception and thus the error rate of the received signal is degraded, it is decided that the error rate of the received signal is deteriorated by the AGC gain control amount control. Then, the process goes step S908 wherein the polarity of the change control amount g is inverted such that the AGC gain control amount in the succeeding reception can be changed in the opposite direction to that in the preceding reception.

Finally, in step S909, in order to prepare for the succeeding reception, the error rate ERROR2 in the present reception is stored in ERROR1, and also a value obtained by adding the change control amount g to the set value RED in the present reception is stored in RED as the AGC gain control amount in the succeeding reception. In addition, when the power supply of the radio receiver is turned ON, the receiving operation is still carried out by repeating above steps S903 to S910.

As described above, in the gain control amount setting method according to the fourth example, before the gain control amount is set by deciding appropriately the change direction of the gain control amount to be set subsequently, the AGC gain control amount is returned to the predetermined initial value when the error rate exceeds the predetermined value. Therefore, the more appropriate gain control amount can be set under the environment of the strong electric field IM or the environment in which the electric field is changed strongly, and also the appropriate countermeasure can be taken when the setting of the gain control amount is largely out of the range.

FIFTH EXAMPLE

Figure 14:
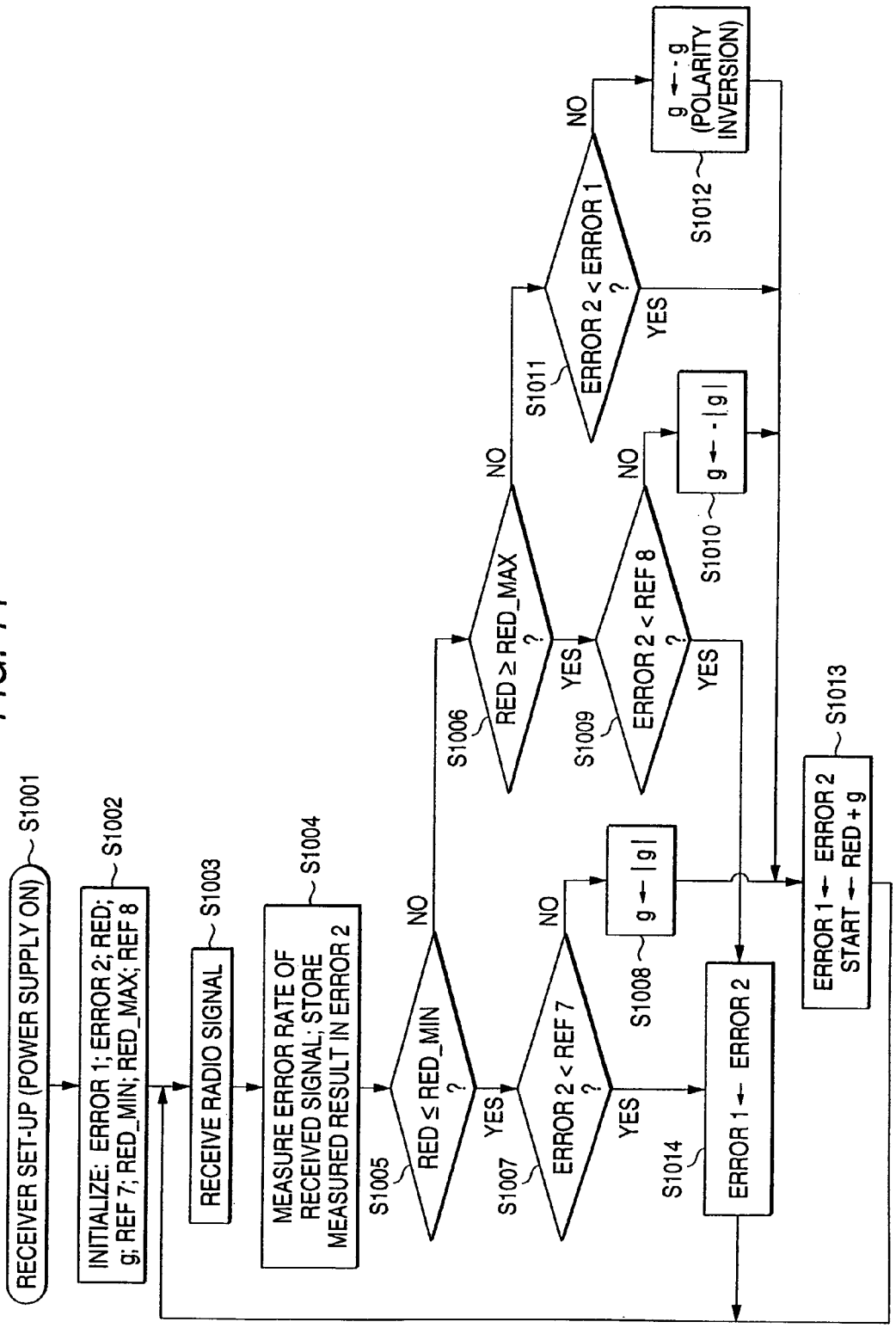
FIG. 14 is a flowchart showing an AGC gain control amount setting method fifth example) in the radio receiver according to the second embodiment.

FIG. 14 shows a flowchart of an AGC gain control amount setting method (fifth example) in the radio receiver according to the second embodiment. In the gain control amount setting method according to the fifth example, an available set range of the gain control amount, that is defined by a maximum value and a minimum value, is set. Then, if the of the gain control amount is less than the minimum value of the available set range or more than the maximum value thereof, the setting of the of the gain control amount is not changed when the error rate in the present reception is below the predetermined value. In contrast, if the gain control amount is in the available set range, the decision of the change direction of the gain control amount is made, like the first example. In this case, the change amount of the gain control amount is set constant.

Then, the variables used in FIG. 14 (parameters stored in the memory 208) will be explained. Like the first example, ERROR1, ERROR2, RED and g are the error rate in the preceding reception, the error rate in the present reception, the set value of the gain control amount, and the change control amount respectively. Also, RED#MIN, RED#MAX are the minimum set value and the maximum set value of the gain control amount respectively, and setting of the maximum value and the minimum value of the AGC gain control is controlled to move within the range from RED#MIN to RED#MAX. Also, REF7 is a reference value that is compared with the error rate ERROR2 in the present reception when the AGC gain control amount is set below the minimum set value RED#MIN. When the AGC gain control amount is set below the minimum set value RED#MIN and also the error rate ERROR2 in the present reception is less than the reference value REF7, the setting of the gain control amount is not changed. In addition, REF8 is a reference value that is compared with the error rate ERROR2 in the present reception when the AGC gain control amount is set over the maximum set value RED#MAX. When the AGC gain control amount is set over the maximum set value RED#MAX and also the error rate ERROR2 in the present reception is less than the reference value REF8, the setting of the gain control amount is not changed.

First, when the initial set-up is carried out by turning ON the power supply of the radio receiver in step S1001; parameters ERROR1, ERROR2, RED, g, REF7, REF8, RED#MIN and RED#MAX are set to predetermined initial values in step S1002. These steps S1001, S1002 are the initial setting process in the set-up operation. Steps S1003 to S1014 described later are processes that set the gain control amount by deciding appropriately the change direction of the gain control amount to be set subsequently, and are carried out per a single reception or per several receptions after the reception has been conducted by the predetermined number of times.

In step S1003, the radio signal is received by setting the gain control amount to RED. In step S1004, the error rate of the received signal is measured by the error rate measuring circuit 209, and then the measured result is stored in ERROR2 as the error rate in the present reception.

Then, in step S1005, it is decided whether or not the setting of the AGC gain control amount (RED) in the present reception is less than the minimum set value RED#MIN. If the setting of the gain control amount (RED) exceeds the minimum set value RED#MIN, the process goes to step S1006. In contrast, if the setting of the gain control amount (RED) is less than the minimum set value RED#MIN, the process goes to step S1007. In step S1007, the error rate ERROR2 in the present reception is compared with the reference value REF7. If the error rate ERROR2 in the present reception exceeds the reference value REF7, the process goes to step S1008. Then, a sign of the change control amount g is set positively such that the AGC gain control amount in the succeeding reception is increased by one step, and then the process goes to step S1013. In contrast, if the error rate ERROR2 in the present reception is less than the reference value REF7, the setting of the gain control amount is not changed. Then, the process goes to step S1014 wherein a value of the error rate ERROR2 in the present reception is stored in ERROR1 to prepare for the succeeding reception.

In contrast, if the setting of the gain control amount (RED) exceeds the minimum set value RED#MIN, the process goes to step S1006. In this case, in step S1006, it is decided whether or not the setting of the AGC gain control amount (RED) in the present reception is in excess of the maximum set value RED#MAX. If the setting of the AGC gain control amount (RED) is less than the maximum set value RED#MAX, the process goes to step S1011. In contrast, if the setting of the AGC gain control amount (RED) exceeds the maximum set value RED#MAX, the process goes to step S1009. In step S1009, the error rate ERROR2 in the present reception is compared with the reference value REF8. If the error rate ERROR2 in the present reception exceeds the reference value REF8, the process goes to step S1010. Then, a sign of the change control amount g is set negatively such that the AGC gain control amount in the succeeding reception is decreased by one step, and then the process goes to step S1013. Also, if the error rate ERROR2 in the present reception is less than the reference value REF8, the setting of the gain control amount is not changed and then the process goes to step S1014. Then, a value of the error rate ERROR2 in the present reception is stored in ERROR1 to prepare for the succeeding reception.

In contrast, if the setting of the AGC gain control amount (RED) is less than the maximum set value RED#MAX, the process goes to step S1011. In step S1011, the error rate ERROR2 in the present reception is compared with the error rate ERROR1 in the preceding reception. If the error rate ERROR2 in the present reception is smaller than the error rate ERROR1 in the preceding reception and thus the error rate of the received signal is improved, it is decided that the error rate of the received signal can be improved by the AGC gain control amount control. Thus, in order to change the AGC gain control amount in the succeeding reception in the same direction as that in the preceding reception, the polarity of the change control amount g is not changed. In contrast, if the error rate ERROR2 in the present reception is larger than the error rate ERROR1 in the preceding reception and thus the error rate of the received signal is degraded, it is decided that the error rate of the received signal is deteriorated by the AGC gain control amount control. Then, the process goes step S1012 wherein the polarity of the change control amount g is inverted such that the AGC gain control amount in the succeeding reception can be changed in the opposite direction to that in the preceding reception.

Finally, in step S1013, in order to prepare for the succeeding reception, the error rate ERROR2 in the present reception is stored in ERROR1, and also a value obtained by adding the change control amount g to the set value RED in the present reception is stored in RED as the AGC gain control amount in the succeeding reception. In addition, when the power supply of the radio receiver is turned ON, the receiving operation is still carried out by repeating above steps S1003 to S1014.

As described above, in the gain control amount setting method according to the fifth example, the available set range of the gain control amount that is defined by the maximum value and the minimum value is set. Then, if the gain control amount is less than the minimum value of the available set range or more than the maximum value thereof, the setting of the gain control amount is not changed when the error rate in the present reception is below the predetermined value. In contrast, if the gain control amount is positioned in the available set range, the gain control amount is set by deciding appropriately the change direction of the gain control amount to be set subsequently. Therefore, the optimum gain control amount can be set under the environment of the strong electric field IM or the environment in which the electric field is changed strongly, and also it is possible to prevent the situation that, in the case that the set value of the gain control amount is set to the maximum value or the minimum value, the set value of the gain control amount is unnecessarily changed when the error rate is sufficiently small.

As described above, according to the radio receiver and the radio receiving method according to the second embodiment, since the AGC gain control amount is set according to the measured result of the error rate of the received signal by the error rate measuring circuit 209, the optimum AGC gain control amount can be set to meet the radio wave situation in which the radio receiver, i.e., the receiving situation of the received signal and also the gain control of the gain controlling means can be achieved to optimize the signal quality of the received signal in the situation of either the IM characteristic or the electric field variation characteristic, e.g., under the environment of the strong electric field IM or the environment in which the electric field is changed strongly. As a result, the communication quality in the mobile radio communication can be considerably improved.

Third Embodiment

Figure 15:
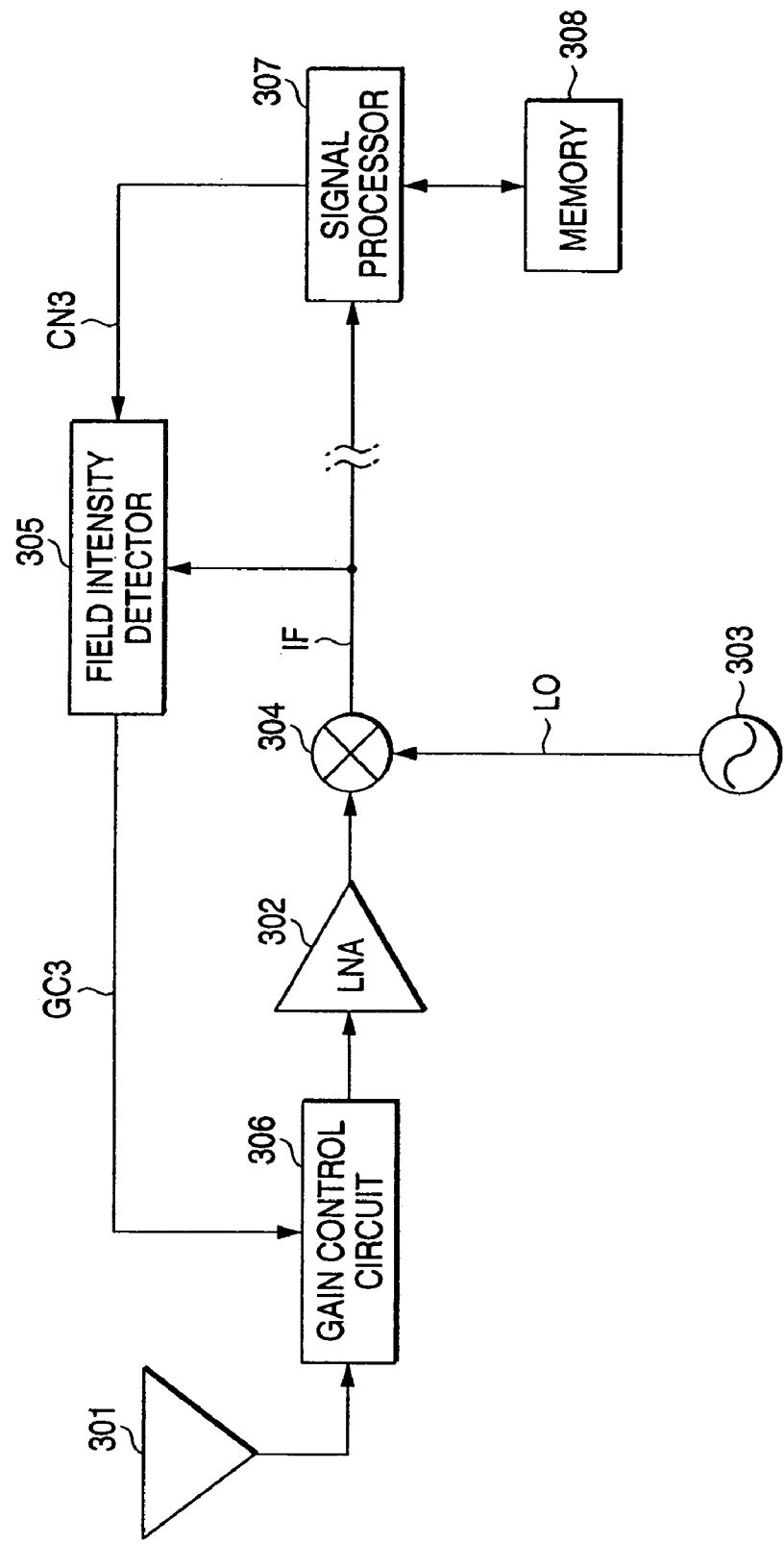
FIG. 15 is a view showing a configuration of a radio receiver according to a third embodiment of the present invention.

FIG. 15 shows a configuration of a radio receiver according to a third embodiment of the present invention.

In FIG. 15, the radio receiver according to the third embodiment is constructed to include an antenna 301, a low-noise signal amplifier (LNA) 302, a local oscillator circuit (Local) 303, a frequency converter circuit (Mix) 304, a field intensity detector 305, a gain control circuit 306, a signal processor portion 307, and a memory 308.

The antenna 301 receives the signal transmitted from the base station (not shown). The low-noise signal amplifier 302 amplifies the signal received via the antenna 301. The frequency converter circuit 304 executes the frequency conversion by multiplying the signal amplified by the low-noise signal amplifier 302 by the signal from the local oscillator circuit 303.

When the electric field intensity of the signal reaches the AGC threshold based on the control parameter (signal CN3), the field intensity detector 305 changes a voltage of an output signal GC3 in response to an intensity of the received signal whose frequency is converted into the intermediate frequency (IF) by the frequency converter circuit 304. The gain control circuit 306 changes the gain control amount in answer to the output signal GC3 from the field intensity detector 305. In the memory 308, the AGC threshold to be set in respective signal conditions, etc. are stored.

The signal processor portion 307 corresponds to the threshold setting means. This signal processor portion 307 demodulates the received signal, and then sets/changes the AGC threshold of the AGC circuit by outputting the control signal CN3 to the field intensity detector 305 based on the transmitting conditions such as the transmission data speed of the transmission signal interpreted in compliance with the signal format.

Figure 16:
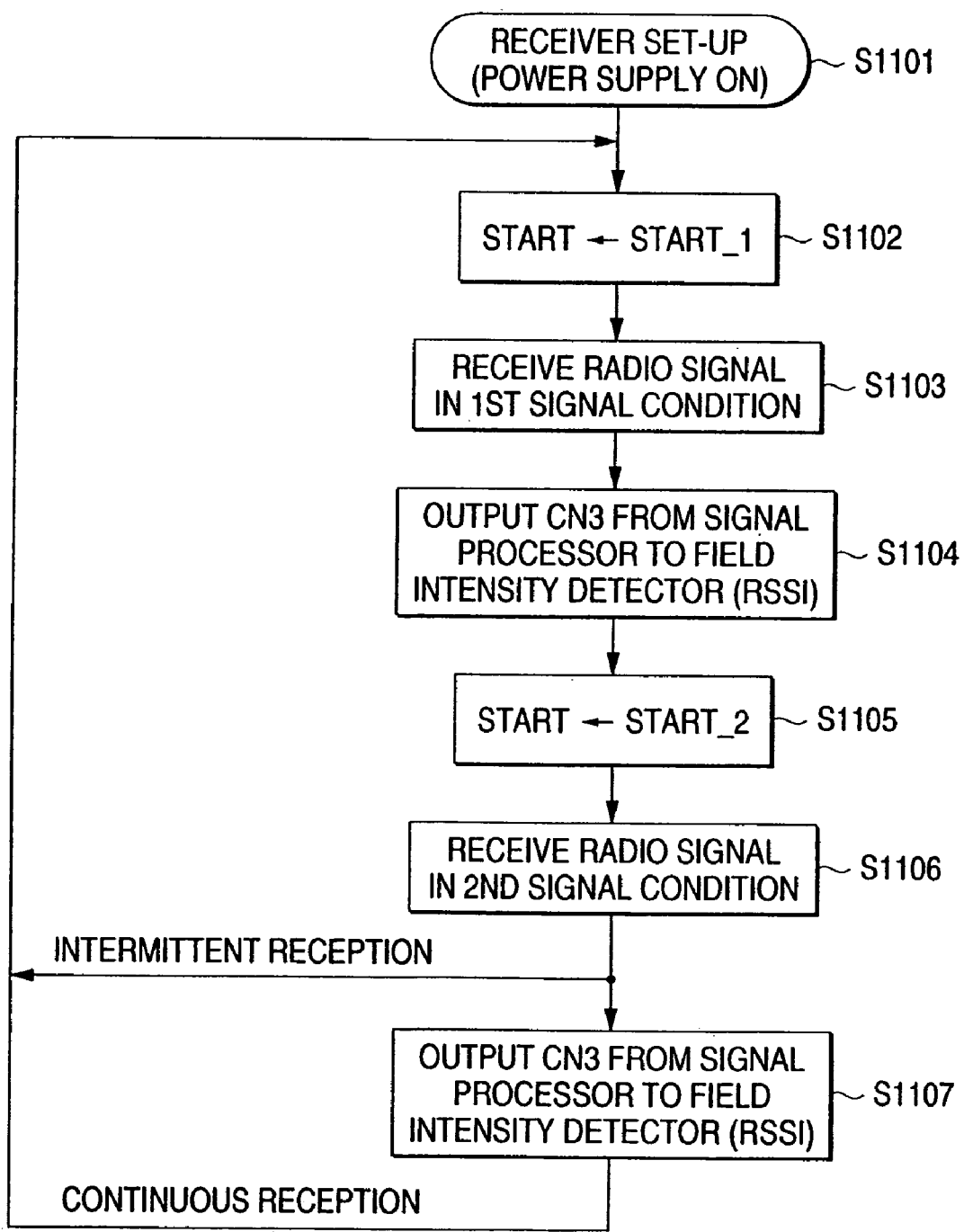
FIG. 16 is a flowchart showing a method of setting AGC thresholds separately based on signal transmission states, in the radio receiver according to the third embodiment.

Next, a particular example of the radio receiving method in the radio receiver according to the third embodiment having the above configuration will be explained in detail with reference to FIG. 16 hereunder. FIG. 16 is a flowchart showing a method of setting the AGC thresholds separately based on signal transmission states, in the radio receiver that receives the signal having the signal format transmitted while changing the transmitting conditions such as the transmission data speed into two types or more.

According to the radio receiving method of the third embodiment, when the signal having the signal format that can be transmitted while changing the transmitting conditions into two types or more is transmitted, the AGC threshold which the gain control operation in response to the transmission conditions of the signal is set by the signal processor portion 307, and then starts the gain control operation when the electric field intensity detected by the field intensity detector 305 reaches the AGC threshold. Since the timing at which the signal conditions such as the transmission data speed of the transmitted signal, etc. is switched is always identical, the setting of the field intensity detector 305 can be changed and also the AGC threshold of the AGC circuit can be changed by outputting the control signal CN3 to the field intensity detector 305 to synchronize with the switching timing of the signal conditions if the signal received by the signal processor portion 307 can be interpreted.

Here, under the assumption that the signal format can be transmitted while changing the transmitting condition of the transmission data speed into two type conditions, the explanation will be made in the following. In this case, the first signal condition is a signal condition before the transmission conditions such as the transmission data speed, etc. are changed in the transmitted signal of the signal format which is transmitted while changing transmission conditions such as the transmission data speed, etc. into two type conditions. The second signal condition is a signal condition after the transmission conditions such as the transmission data speed, etc. are changed. In addition, as the particular example, in the signal format of the FLEX system pager, the signal in the first synchronizing portion in which the signal is transmitted at 1600 [bps], i.e., the signal of "BS1", "A", "B", "inv A", and "FI" is set as the first signal condition and the signal after the second synchronizing portion in which the signal is transmitted at 6400 [bps], 3200 [bps], or 1600 [bps] is set as the second signal condition.

Then, the variables used in FIG. 16 (parameters stored in the memory 308) will be explained. START#1 and START#2 are the set values of the AGC threshold that are set to meet the first signal condition and the second signal condition respectively.

First, when the initial set-up is carried out by turning ON the power supply of the radio receiver in step S1101, the AGC threshold is set to the set value START#1 in the first signal condition in step S1102. Then, the radio signal in the first signal condition is received in step S1103.

Then, in step S1104, the control output CN3 to switch the AGC threshold is output from the signal processor portion 307 to the field intensity detector 305 based on the signal format at a timing when the signal condition is switched from the first signal condition to the second signal condition. Then, in step S1105, the AGC threshold is switched to the set value START#2 in the second signal condition based on the control signal CN3 and then set to it. Then, in step S1106, the radio signal in the second signal condition is received.

In the case that the radio receiver corresponds to a radio receiver that executes an intermittent receiving operation, the receiving operation is completed in step S1106. If the receiving operation is performed once again, the processes from steps S1102 to S1106 are repeated. In contrast, in the case that the radio receiver corresponds to a radio receiver that executes a continuous receiving operation, the process goes to step S1107 wherein the control signal CN3 to switch the AGC threshold is output from the signal processor portion 307 to the field intensity detector 305 based on the signal format at a timing when the signal condition is switched from the second signal condition to the first signal condition. Then, the process returns to step S1102. The receiving operation is continued by repeating the processes in steps S1102 to S1106.

As described above, the radio receiving method of the third embodiment, when the signal having the signal format that is transmitted while changing the transmitting conditions such as the transmission data speed into two types or more is received, the control signal CN3 is output from the signal processor portion 307 to the field intensity detector 305 at a signal condition switching timing to change the setting of the field intensity detector 305, and thus the AGC threshold of the AGC circuit is changed. Therefore, the optimum gain control of the gain controlling means can be achieved to meet the transmission conditions of the signal, and as a result the communication quality in the mobile radio communication can be considerably improved.

Fourth Embodiment

Figure 17:
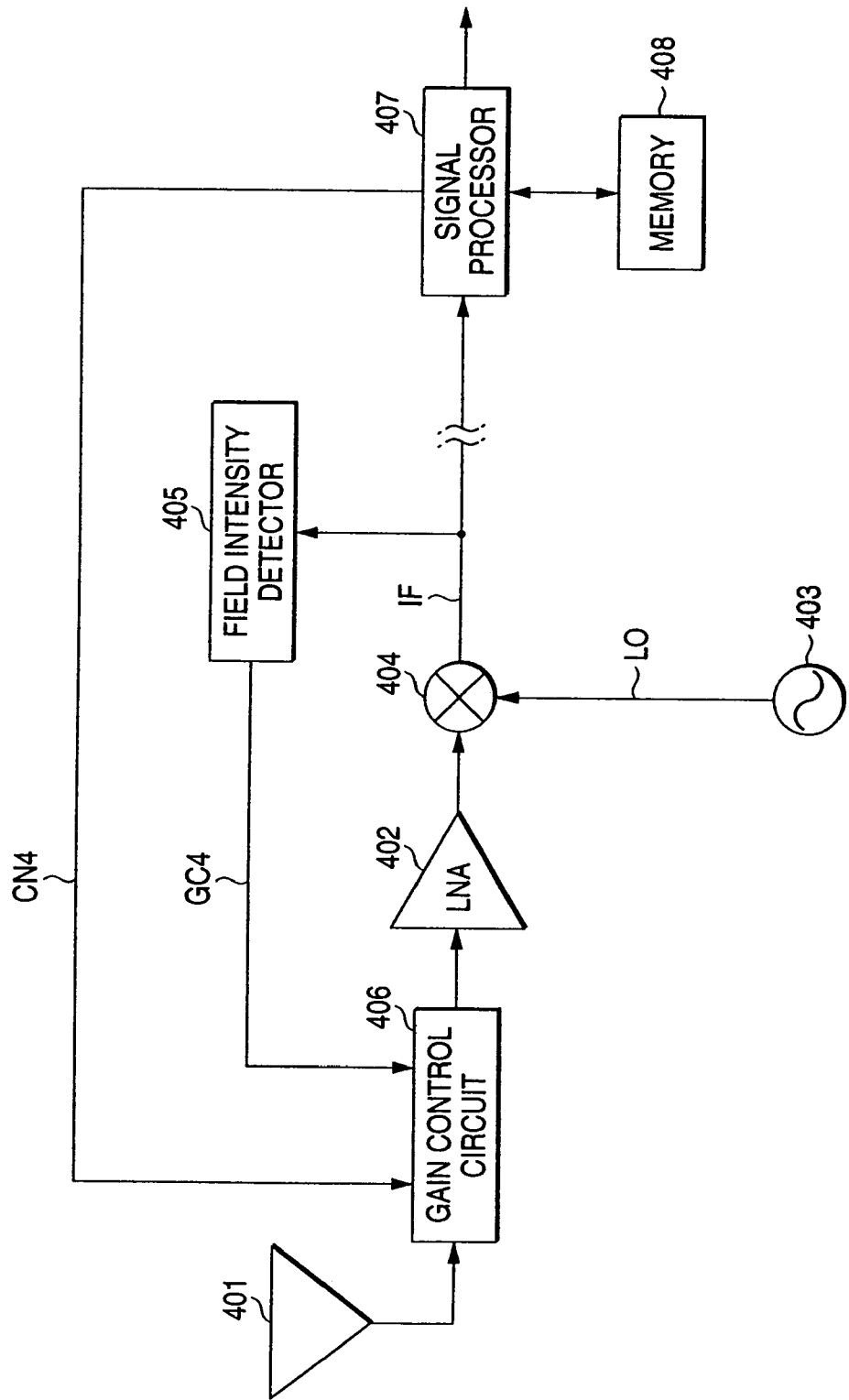
FIG. 17 is a view showing a configuration of a radio receiver according to a fourth embodiment of the present invention.

FIG. 17 shows a configuration of a radio receiver according to a fourth embodiment of the present invention.

In FIG. 17, the radio receiver according to the fourth embodiment is constructed to include an antenna 401, a low-noise signal amplifier (LNA) 402, a local oscillator circuit (Local) 403, a frequency converter circuit (Mix) 404, a field intensity detector 405, a gain control circuit 406, a signal processor portion 407, and a memory 408.

The antenna 401 receives the signal transmitted from the base station (not shown). The low-noise signal amplifier 402 amplifies the signal received via the antenna 401. The frequency converter circuit 404 executes the frequency conversion by multiplying the signal amplified by the low-noise signal amplifier 402 by the signal from the local oscillator circuit 403.

The field intensity detector 405 changes a voltage of an output signal GC4 in response to an intensity of the received signal whose frequency is converted into the intermediate frequency (IF) by the frequency converter circuit 404. The gain control circuit 406 changes the gain control amount in answer to the output signal GC4 from the field intensity detector 405 and a control parameter (signal CN4) from the signal processor portion 407. In the memory 408, the AGC threshold to be set in respective signal conditions, etc. are stored.

The signal processor portion 407 corresponds to a gain control amount setting means and a second controlling means. This signal processor portion 407 demodulates the received signal, and then sets/changes the gain control amount of the AGC circuit by outputting the control signal CN4 to the gain control circuit 406 based on the transmitting conditions such as the transmission data speed of the transmission signal interpreted in compliance with the signal format.

Figure 18:
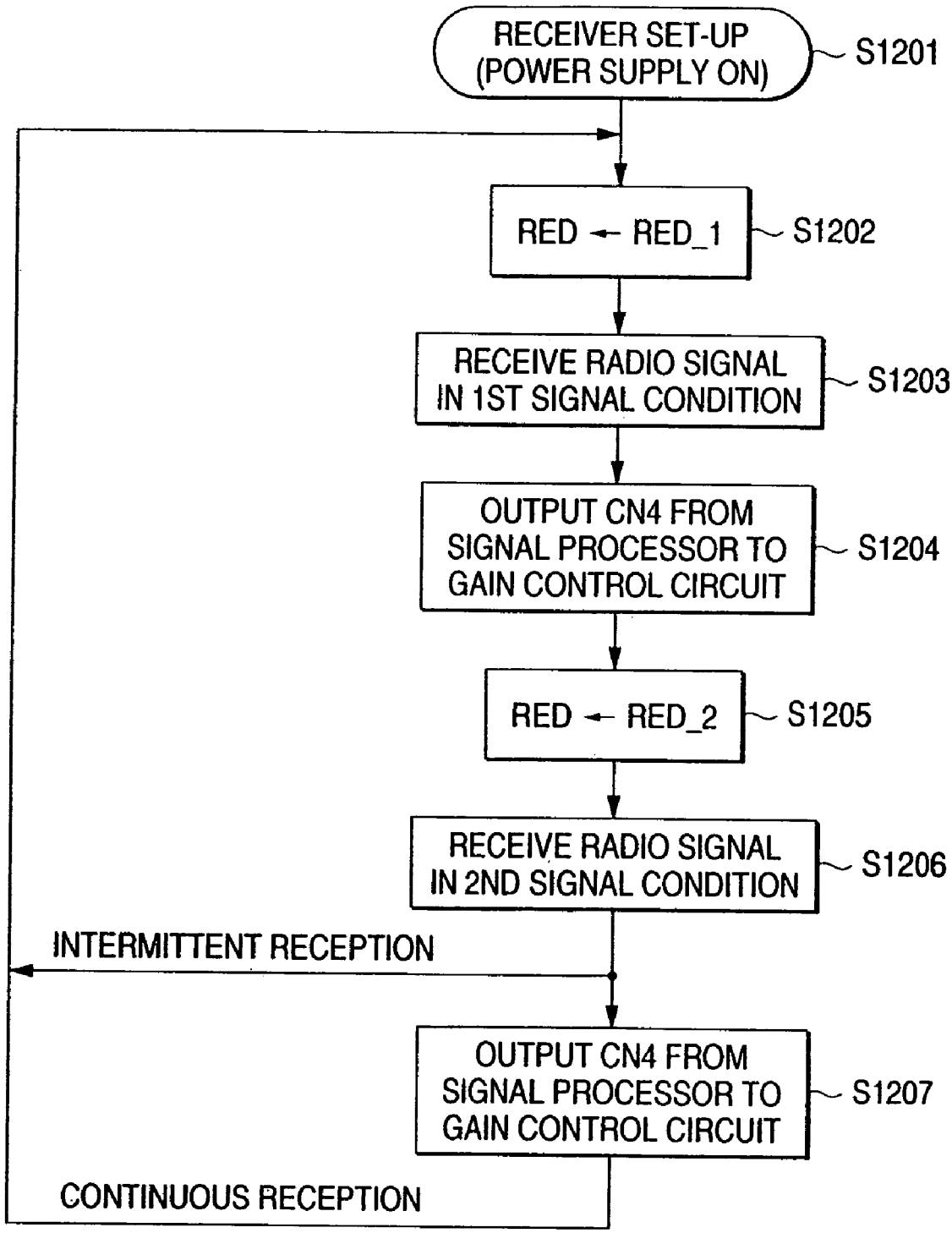
FIG. 18 is a flowchart showing a method of setting AGC gain control amounts separately based on signal transmission states, in the radio receiver according to the fourth embodiment.
Figure 19:
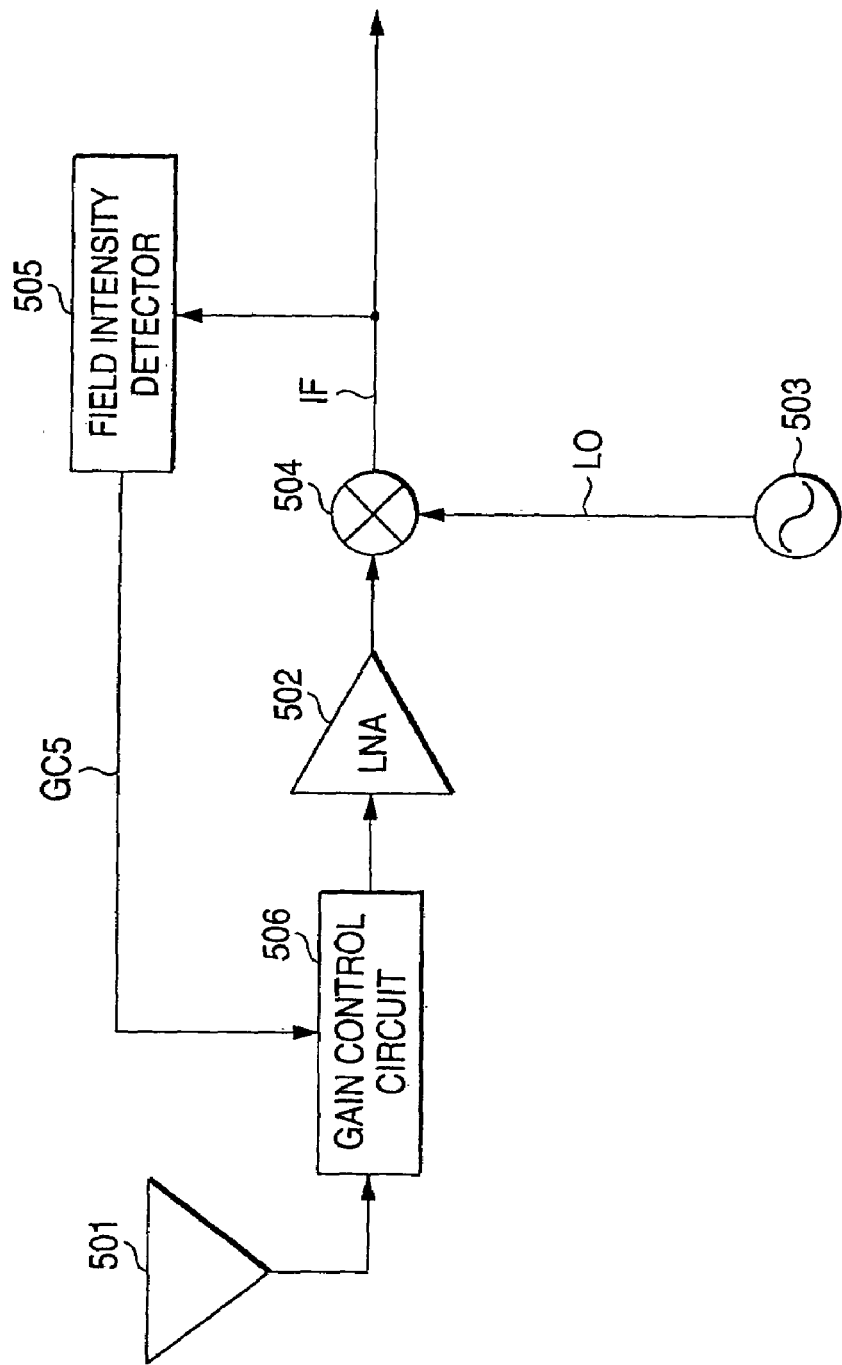
FIG. 19 is a view showing a configuration of a radio receiver having a continuous gain control type automatic gain control circuit (first comparative example) in the prior art.
Figure 20:
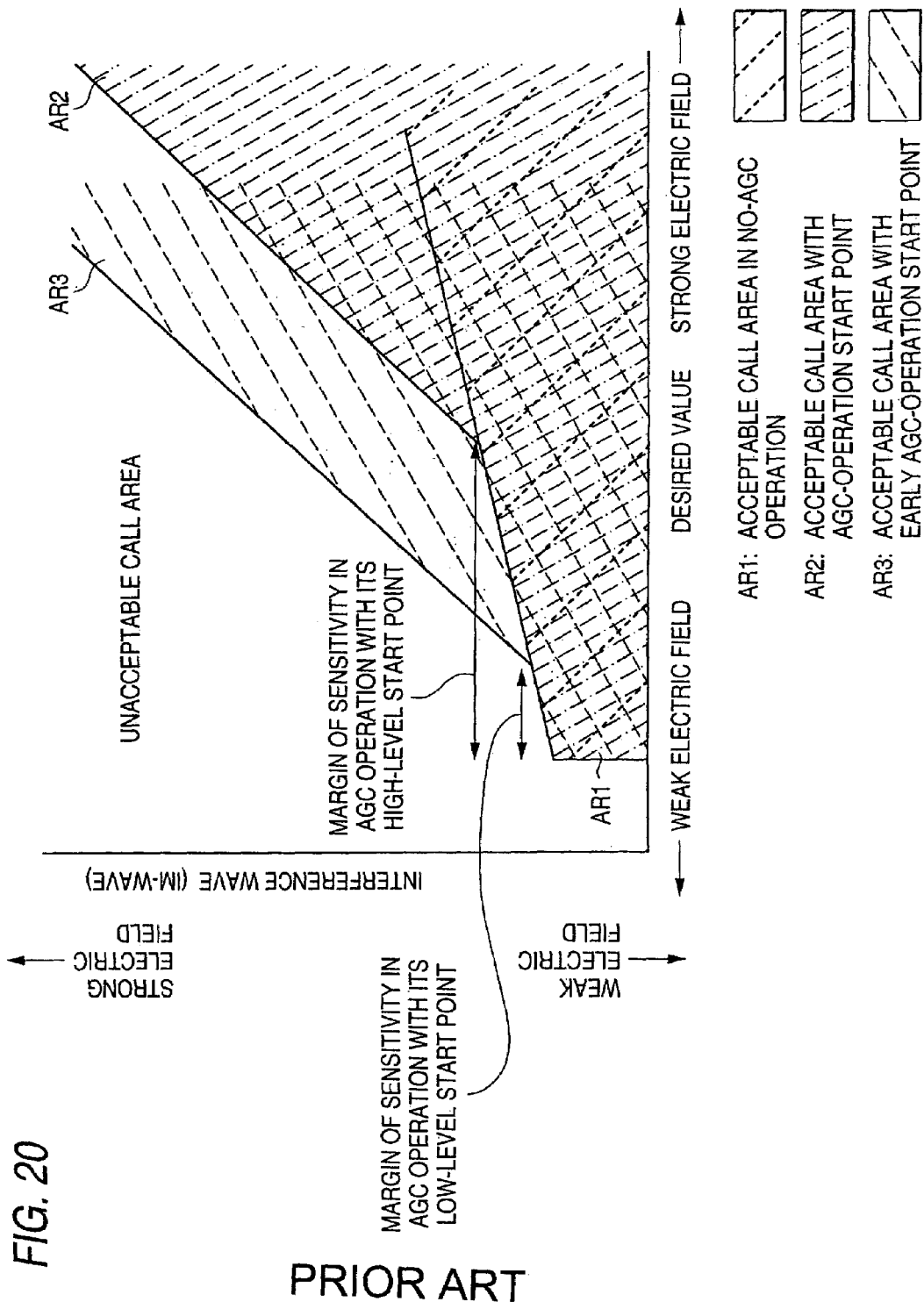
FIG. 20 is a chart showing relationships among AGC thresholds, IM characteristics, and margins of sensitivity in the AGC operation in the continuous gain control type automatic gain control circuit.
Figure 21:
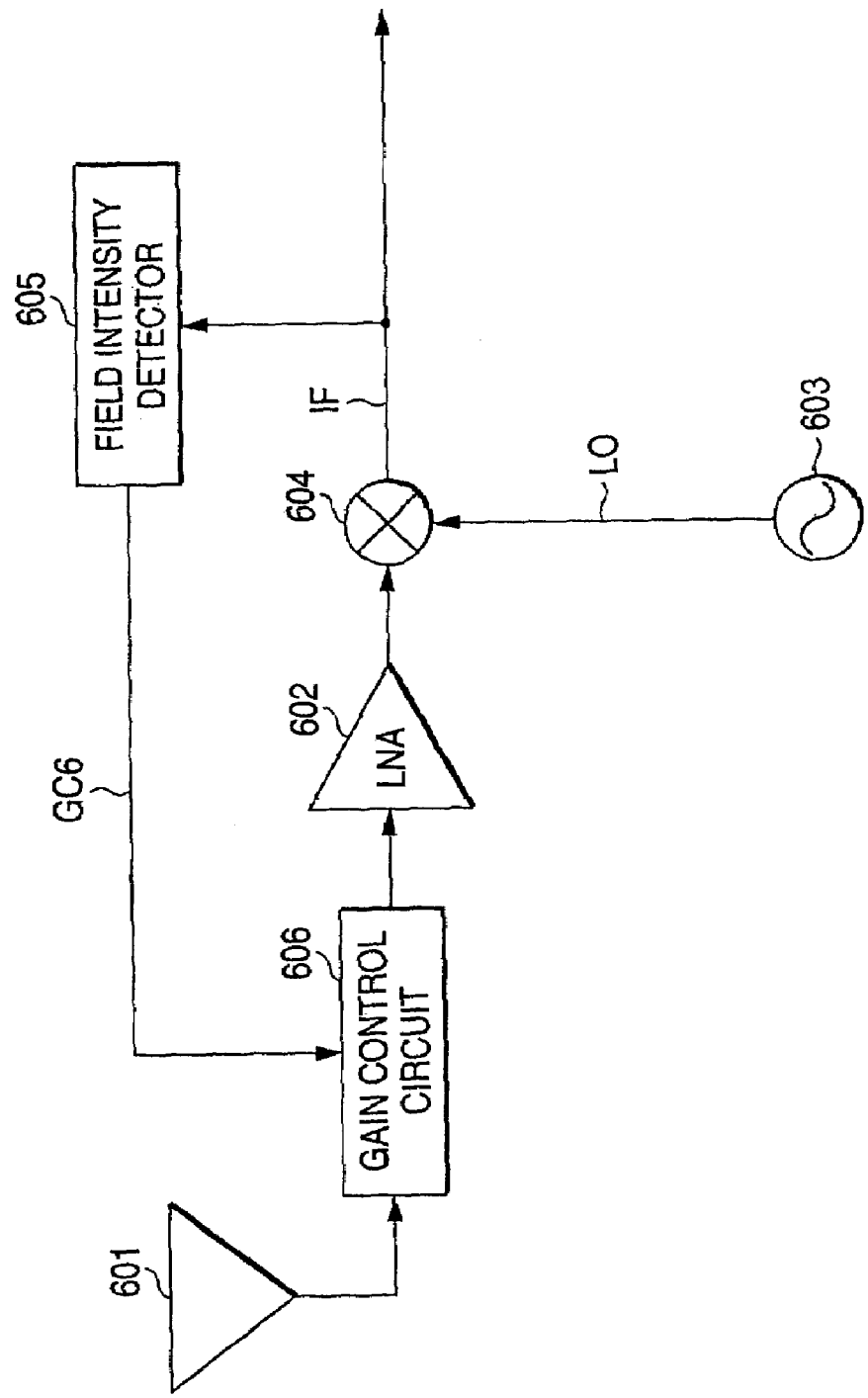
FIG. 21 is a view showing a configuration of a radio receiver having a step-wise gain control type automatic gain control circuit (second comparative example) in the prior art.
Figure 22:
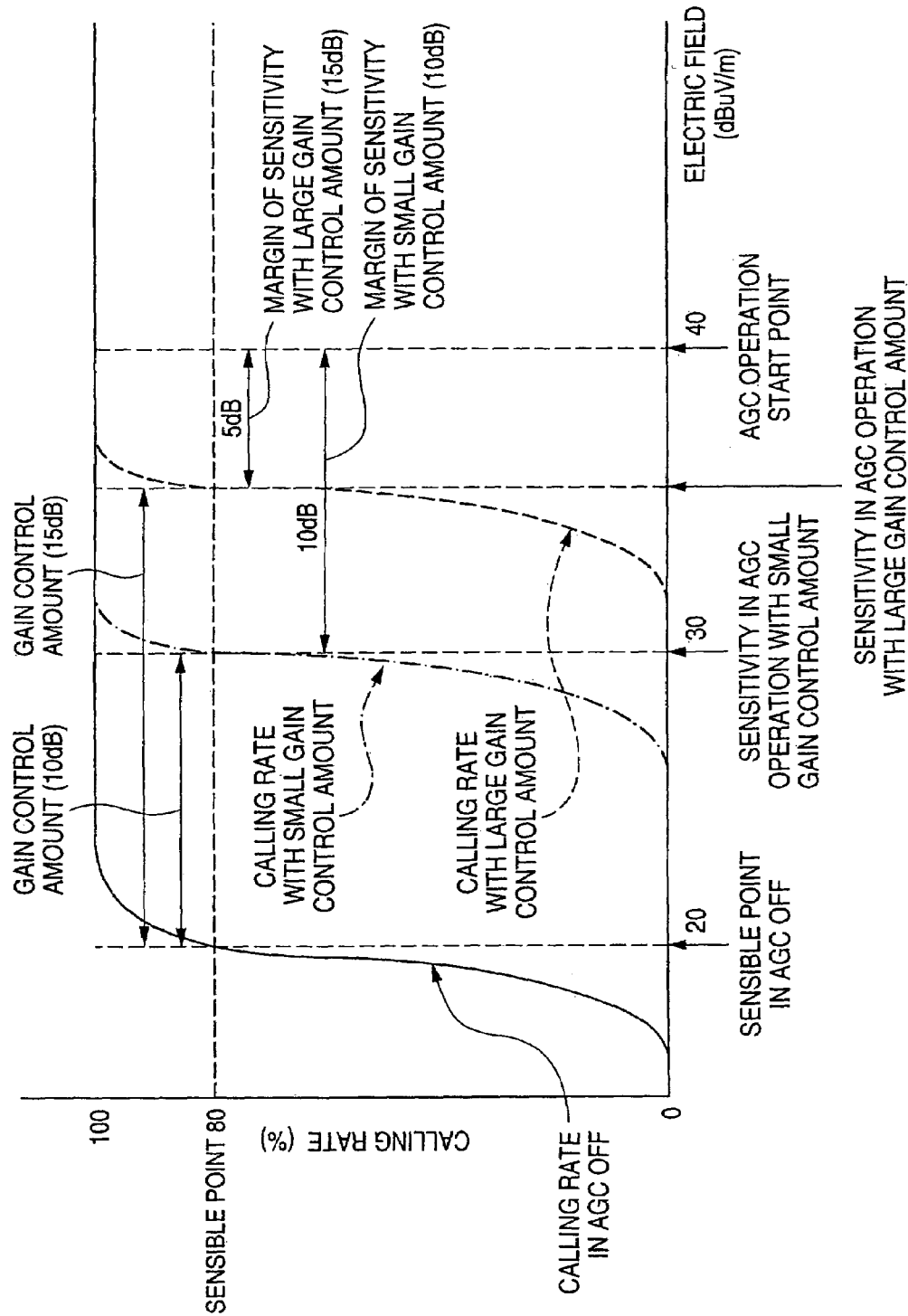
FIG. 22 is a chart showing relationships among AGC thresholds, gain control amounts, and calling rates in the step-wise gain control type automatic gain control circuit.
Figure 23:
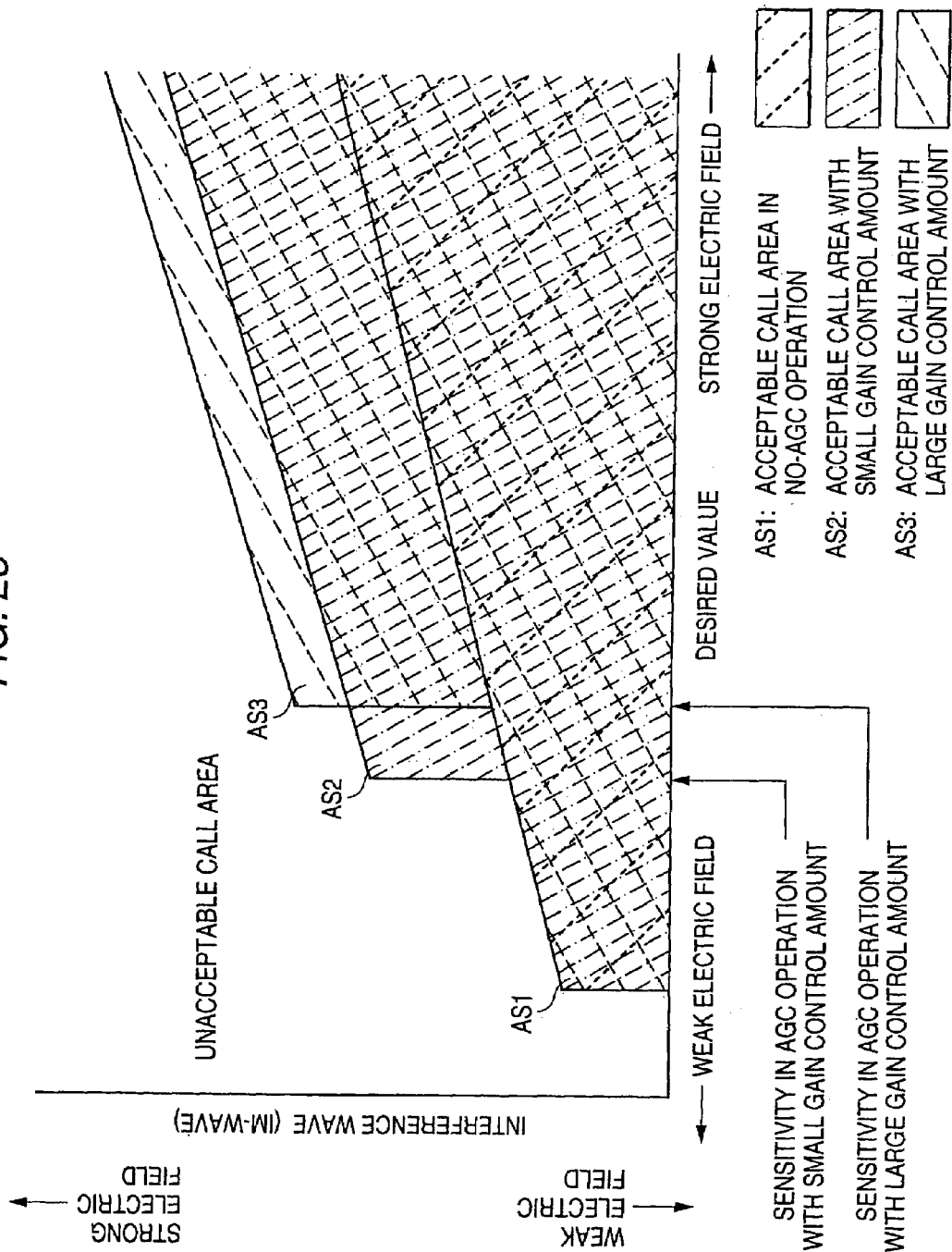
FIG. 23 is a chart showing relationships among AGC thresholds, gain control amounts, and call acceptable areas in the IM characteristics in the step-wise gain control type automatic gain control circuit.

Next, a particular example of the radio receiving method in the radio receiver according to the fourth embodiment having the above configuration will be explained in detail with reference to FIG. 18 hereunder. FIG. 18 is a flowchart showing a method of setting the AGC gain control amounts separately based on signal transmission states, in the radio receiver that receives the signal having the signal format transmitted while changing the transmitting conditions such as the transmission data speed into two types or more.

According to the radio receiving method of the fourth embodiment, when the signal having the signal format that can be transmitted while changing the transmitting conditions into two types or more is transmitted, the gain control amount which start the gain control operation in response to the transmission conditions of the signal is set by the signal processor portion 407. Since the timing at which the signal conditions such as the transmission data speed of the transmitted signal, etc. is switched is always identical, the setting of the field intensity detector 305 can be changed and also the AGC threshold of the AGC circuit can be changed by outputting the control signal CN4 to the gain control circuit 406 to synchronize with the signal condition switching timing if the signal received by the signal processor portion 407 can be interpreted.

Here, under the assumption that the signal format can be transmitted while changing the transmitting condition of the transmission data speed into two type conditions, the explanation will be made in the following. In this case, the first signal condition and the second signal condition are similar to those in the third embodiment. Then, the variables used in FIG. 18 (parameters stored in the memory 408) will be explained. RED#1 and RED#2 are the set values of the AGC gain control amount that are set to meet the first signal condition and the second signal condition respectively.

First, when the initial set-up is carried out by turning ON the power supply of the radio receiver in step S1201, the gain control amount is set to the set value RED#1 in the first signal condition in step S1202. Then, the radio signal in the first signal condition is received in step S1103.

Then, in step S1204, the control output CN4 to switch the AGC gain control amount is output from the signal processor portion 407 to the gain control circuit 406 based on the signal format at a timing when the signal condition is switched from the first signal condition to the second signal condition. Then, in step S1205, the AGC gain control amount is switched to the set value RED#2 in the second signal condition based on the control signal CN4 and then set to it. Then, in step S1206, the radio signal in the second signal condition is received.

In the case that the radio receiver corresponds to a radio receiver that executes an intermittent receiving operation, the receiving operation is completed in step S1106. If the receiving operation is performed once again, the processes from steps S1202 to S1206 are repeated. In contrast, in the case that the radio receiver corresponds to a radio receiver that executes a continuous receiving operation, the process goes to step S1207 wherein the control signal CN4 to switch the AGC gain control amount is output from the signal processor portion 407 to the gain control circuit 406 based on the signal format at a timing when the signal condition is switched from the second signal condition to the first signal condition. Then, the process returns to step S1202. The receiving operation is continued by repeating the processes in steps S1202 to S1206.

As described above, the radio receiving method of the fourth embodiment, when the signal having the signal format that is transmitted while changing the transmitting conditions such as the transmission data speed into two types or more is received, the control signal CN4 is output from the signal processor portion 407 to the gain control circuit 406 at a signal condition switching timing to change the setting of the gain control circuit 406, and thus the gain control amount of the AGC circuit is changed. Therefore the optimum gain control of the gain controlling means can be achieved to meet the transmission conditions of the signal, and as a result the communication quality in the mobile radio communication can be considerably improved.

With the above, the first, second, third, and fourth embodiments are explained. The first and third embodiments can be applied to the step-wise gain control type AGC circuit which changes the gain by a predetermined amount when the signal level of the received signal exceeds a predetermined level after the electric field intensity reaches the AGC threshold, and to the continuous gain control type AGC circuit which changes the gain in response to a signal level of the received signal after the electric field intensity reaches the AGC threshold. The second and fourth embodiments can be applied to only the step-wise gain control type AGC circuit. In addition, as a variation of the embodiment which is applicable to the step-wise gain control type AGC circuit, a combinational variation of the first and second embodiments and a combinational variation of the third and fourth embodiments may be applied.

In the first, second, third, and fourth embodiments explained above, the description is made under the assumption that the receiving system is the heterodyne system. Also, the embodiments can be implemented by using other receiving system such as the direct conversion system, etc. and thus the receiving system should not be limited particularly.

As described above, according to the radio receiver, the radio receiving method, and the recording medium of the present invention, the AGC threshold to start the gain control operation of the gain controlling means in response to a measured result of the error rate measuring means is set by the threshold setting means (threshold setting step), and the gain controlling means is caused by the first controlling means (first controlling step) to start the gain control operation when the electric field intensity detected by the electric field intensity detecting means reaches the AGC threshold. Therefore, since the AGC threshold is set according to the measured result of the error rate of the received signal, the optimum AGC threshold can be set to meet the radio wave situation in which the radio receiver is located, i.e., the receiving situation of the received signal, and also the gain control of the gain controlling means can be achieved to optimize the signal quality of the received signal in the situation of either the IM characteristic or the electric field variation characteristic, e.g., under the environment of the strong electric field IM or the environment in which the electric field is changed strongly. As a result, the communication quality in the mobile radio communication can be considerably improved.

Also, according to the present invention, the gain control amount of the gain controlling means is set by the gain control amount setting means (gain control amount setting step) in response to the measured result of the error rate measuring means, and the gain controlling means is caused by the second controlling means (second controlling step) to change the gain in response to the gain control amount. Therefore, since the AGC gain control amount is set according to the measured result of the error rate of the received signal, the optimum AGC gain control amount can be set to meet the radio wave situation in which the radio receiver, i.e., the receiving situation of the received signal and also the gain control of the gain controlling means can be achieved to optimize the signal quality of the received signal in the situation of either the IM characteristic or the electric field variation characteristic, e.g., under the environment of the strong electric field IM or the environment in which the electric field is changed strongly. As a result, the communication quality in the mobile radio communication can be considerably improved.

Also, according to the present invention, when the signal having the signal format that is transmitted while changing the transmitting conditions such as the transmission data speed into two types or more is received, the AGC threshold is set by the threshold setting means (threshold setting step) to start the gain control operation of the gain controlling means in response to the transmission condition of the signal, and the gain controlling means is caused by the first controlling means (first controlling step) to start the gain control operation when the electric field intensity detected by the electric field intensity detecting means reaches the AGC threshold. Therefore, since the AGC threshold is set to meet the transmission condition of the signal, the optimum gain control of the gain controlling means can be achieved to meet the transmission conditions of the signal, and as a result the communication quality in the mobile radio communication can be considerably improved.

Also, according to the present invention, when the signal having the signal format that is transmitted while changing the transmitting conditions such as the transmission data speed into two types or more is received, the gain control amount of the gain controlling means is set by the gain control setting means (gain control amount setting step) in response to the transmission condition of the signal, and the gain of the gain controlling means is changed by the second controlling means (second controlling step) in response to the gain control amount. Therefore, since the gain control amount is set to meet the transmission condition of the signal, the optimum gain control of the gain controlling means can be achieved to meet the transmission conditions of the signal, and as a result the communication quality in the mobile radio communication can be considerably improved.

What is claimed is:

1. A radio receiver comprising:
   a gain controlling means for controlling a gain of the radio receiver;
   an electric field intensity detecting means for detecting an electric field intensity of a received signal;
   an error rate measuring means for measuring an error rate of the received signal;
   a threshold setting means for setting a threshold of an electric field intensity level based on the measured error rate of the received signal, wherein said threshold setting is varied depending on a transmission condition; and
   a first controlling means for causing the gain controlling means to start the gain control operation when the electric field intensity detected by the electric field intensity detecting means reaches the threshold of the electric field intensity level.

2. A radio receiver according to claim 1, wherein the gain controlling means is a step-wise gain control type which changes the gain by a predetermined amount when a signal level of the received signal exceeds a predetermined level.

3. A radio receiver according to claim 1, wherein the gain controlling means is a continuous gain control type which changes the gain in response to a signal level of the received signal.

4. A radio receiver according to claim 1, wherein the threshold setting means decides a change direction and/or a change amount of the threshold of the electric intensity level in a succeeding reception based on a measured result by the error rate measuring means in a present reception and a measured result by the error rate measuring means in a preceding reception.

5. A radio receiver according to claim 1, wherein the threshold setting means decides a change direction and/or a change amount of the threshold of the electric field intensity level in a succeeding reception based on a measured result by the error rate measuring means in a present reception, a measured result by the error rate measuring means in a preceding reception, the threshold of electric field intensity level set in a present reception, and a set value of the threshold of electric intensity level in the preceding reception.

6. A radio receiver according to any one of claims 1, 4 or 5, further comprising:
a threshold range setting means for setting an available set range of the threshold of electric intensity level, which is defined by a maximum value and a minimum value.

7. A radio receiver according to any one of claims 1, 4 or 5, wherein the threshold setting means does not change a setting of the threshold of electric intensity level when the threshold of electric intensity level is more than the maximum value or is less than the minimum value of the available set range and a measured result by the error rate measuring means is less than a predetermined value.

8. A radio receiver according to any one of claims 4 or 5, further comprising:
a storing means for updating/holding the measured result by the error rate measuring means in the present reception as a measured result by the error rate measuring means in the preceding reception, updating/holding the threshold of electric intensity level set in the present reception as the set value of the threshold of electric intensity level in the preceding reception, and updating/holding the threshold of electric intensity level set by the threshold setting means in the present reception as the threshold of electric intensity level set in a succeeding reception.

9. A radio receiver for receiving a signal having a signal format that is transmitted while changing transmission conditions into two types or more, comprising:
a gain controlling means for controlling a gain of the radio receiver;
an electric field intensity detecting means for detecting an electric field intensity of a received signal;
a gain control threshold setting means for automatically setting a threshold of an electric field intensity level used as a gain control threshold based on a transmission data speed of the received signal, wherein said threshold setting is varied depending on said transmission data speed; and
a first controlling means for causing the gain controlling means to start the gain control operation when the electric field intensity detected by the electric field intensity detecting means reaches the threshold of the electric field intensity level set by the gain threshold setting means.

10. A radio receiver comprising:
a gain controlling means for controlling a gain of the radio receiver;
an error rate measuring means for measuring an error rate of the received signal;
a gain control amount setting means for setting a gain control amount of the gain controlling means in response to the error rate; and
a second controlling means for causing the gain controlling means to change the gain in response to the gain control amount, wherein
the gain control amount setting means decides a change direction and/or a change amount of the gain control amount in a succeeding reception based on a measured result by the error rate measuring means in a present reception and a measured result by the error rate measuring means in a preceding reception.

11. A radio receiver comprising:
a gain controlling means for controlling a gain of the radio receiver;
an error rate measuring means for measuring an error rate of the received signal;
a gain control amount setting means for setting a gain control amount of the gain controlling means in response to the error rate; and
a second controlling means for causing the gain controlling means to change the gain in response to the gain control amount, wherein
the gain control amount setting means decides a change direction and/or a change amount of the gain control amount in a succeeding reception based on a measured result by the error rate measuring means in a present reception, a measured result by the error rate measuring means in a preceding reception, the gain control amount set in a present reception, and a set value of the gain control amount in the preceding reception.

12. A radio receiver according to any one of claims 10 or 11, further comprising:
a gain control amount range setting means for setting an available set range of the gain control amount, which is defined by a maximum value and a minimum value.

13. A radio receiver according to any one of claims 10 or 11, wherein the gain control amount setting means does not change a setting of the gain control amount when the gain control amount is more than a maximum value or is less than a minimum value of the available set range and a measured result by the error rate measuring means is less than a predetermined value.

14. A radio receiver according to any one of claims 10 or 11, further comprising:
a storing means for updating/holding the measured result by the error rate measuring means in the present reception as a measured result by the error rate measuring means in the preceding reception, updating/holding the gain control amount set in the present reception as the set value of the gain control amount in the preceding reception, and updating/holding the gain control amount set by the gain control amount setting means in the present reception as the gain control amount set in a succeeding reception.

15. A radio receiving method used for a radio receiver including a gain controlling means for controlling a gain of the radio receiver, an electric field intensity detecting means for detecting an electric field intensity of a received signal, and an error rate measuring means for measuring an error rate of the received signal, comprising:
an error rate measuring step of measuring the error rate in the receiving step by the error rate measuring means;
a threshold setting step of setting a threshold of electric intensity level based on the measured error rate of the received signal, wherein said threshold setting is varied depending on a transmission condition; and
a first controlling step of causing the gain controlling means to start the gain control operation when the electric field intensity detected by the electric field intensity detecting means reaches the threshold of electric intensity level.

16. A radio receiving method according to claim 15, further comprising:
a receiving step of performing a reception at the set threshold of the electric intensity level;
wherein the threshold setting step decides a change direction and/or a change amount of the threshold of electric intensity level in a succeeding reception based on a measured result by the error rate measuring means in a present reception and a measured result by the error rate measuring means in a preceding reception.

17. A radio receiving method according to claim 15, further comprising:

a receiving step of performing a reception at the set threshold of electric intensity level;

wherein the threshold setting step decides a change direction and/or a change amount of the threshold of electric intensity level in a succeeding reception based on a measured result by the error rate measuring means in a present reception, a measured result by the error rate measuring means in a preceding reception, the threshold of electric intensity level set in a present reception, and a set value of the threshold of electric intensity level in the preceding reception.

18. A radio receiving method according to any one of claims 15, 16 or 17, further comprising:

a threshold range setting step of setting an available set range of the threshold of electric intensity level, which is defined by a maximum value and a minimum value.

19. A radio receiving method according to any one of claims 15, 16 or 17, wherein the threshold setting step does not change a setting of the threshold of electric intensity level when the threshold of electric intensity level is more than a maximum value or is less than a minimum value of the available set range and a measured result by the error rate measuring means is less than a predetermined value.

20. A radio receiving method according to any one of claims 16 or 17, further comprising:

a storing step of updating/holding the measured result by the error rate measuring means in the present reception as a measured result by the error rate measuring means in the preceding reception, updating/holding the threshold of electric intensity level set in the present reception as the set value of the threshold of electric intensity level in the preceding reception, and updating/holding the threshold of electric intensity level set by the threshold setting means in the present reception as the threshold of electric intensity level set in a succeeding reception.

21. A radio receiving method used for a radio receiver including a gain controlling means for controlling a gain of the radio receiver, and an error rate measuring means for measuring an error rate of the received signal, comprising:

a gain control amount setting step of setting a gain control amount of the gain controlling means in response to a measured result of the error rate measuring means;

a second controlling step of causing the gain controlling means to change a gain in response to the gain control amount;

a receiving step of performing a reception at the set gain control amount; and an error rate measuring step of measuring the error rate in the receiving step by the error rate measuring means; and wherein the gain control amount setting step decides a change direction and/or a change amount of the gain control amount in a succeeding reception based on a measured result by the error rate measuring means in a present reception and a measured result by the error rate measuring means in a preceding reception.

22. A radio receiving method used for a radio receiver including a gain controlling means for controlling a gain of the radio receiver, and an error rate measuring means for measuring an error rate of the received signal, comprising:

a gain control amount setting step of setting a gain control amount of the gain controlling means in response to a measured result of the error rate measuring means;

a second controlling step of causing the gain controlling means to change a gain in response to the gain control amount;

a receiving step of performing a reception at the set gain control amount; and an error rate measuring step of measuring the error rate in the receiving step by the error rate measuring means; and wherein the gain control amount setting step decides a change direction and/or a change amount of the gain control amount in a succeeding reception based on a measured result by the error rate measuring means in a present reception, a measured result by the error rate measuring means in a preceding reception, the gain control amount set in a present reception, and a set value of the gain control amount in the preceding reception.

23. A radio receiving method according to any one of claims 21 or 22, further comprising:

a gain control amount range setting step of setting an available set range of the gain control amount, which is defined by a maximum value and a minimum value.

24. A radio receiving method according to any one of claims 21 or 22, wherein the gain control amount setting step does not change a setting of the gain control amount when the gain control amount is more than the maximum value or is less than the minimum value of the available set range and a measured result by the error rate measuring means is less than a predetermined value.

25. A radio receiving method according to any one of claims 21 or 22, further comprising:

a storing step of updating/holding the measured result by the error rate measuring means in the present reception as a measured result by the error rate measuring means in the preceding reception, updating/holding the gain control amount set in the present reception as the set value of the gain control amount in the preceding reception, and updating/holding the gain control amount set by the gain control amount setting means in the present reception as the gain control amount set in a succeeding reception.

26. A radio receiving method used for a radio receiver which includes a gain controlling means for controlling a gain of the radio receiver and an electric field intensity detecting means for detecting an electric field intensity of a received signal and also receives a signal having a signal format that is transmitted while changing transmission conditions into two types or more, comprising:

a gain control threshold setting step of automatically setting a threshold of an electric intensity level to start a gain control operation of the gain controlling means in response to a transmission data speed of the received signal; and a first controlling step of causing the gain controlling means to start the gain control operation when the electric field intensity detected by the electric field intensity detecting means reaches the threshold of the electric intensity level.

27. A computer-readable recording medium for storing a program which causes a computer to execute a radio receiving method set forth in any one of claims 15, 16, 17, 21, 22, or 26.

* * * * *